United States Patent
Okulov

(10) Patent No.: US 10,663,357 B2
(45) Date of Patent: May 26, 2020

(54) MICRO ELECTRO-MECHANICAL STRAIN DISPLACEMENT SENSOR AND USAGE MONITORING SYSTEM

(71) Applicant: Paul D Okulov, Moscow (RU)

(72) Inventor: Paul D Okulov, Moscow (RU)

( * ) Notice: Subject to any disclaimer, the term of this patent is extended or adjusted under 35 U.S.C. 154(b) by 7 days.

(21) Appl. No.: 15/534,310

(22) PCT Filed: Dec. 9, 2015

(86) PCT No.: PCT/IB2015/059451
§ 371 (c)(1),
(2) Date: Jun. 8, 2017

(87) PCT Pub. No.: WO2016/092475
PCT Pub. Date: Jun. 16, 2016

(65) Prior Publication Data
US 2017/0363486 A1 Dec. 21, 2017

Related U.S. Application Data

(60) Provisional application No. 62/090,001, filed on Dec. 10, 2014.

(51) Int. Cl.
*G01L 1/04* (2006.01)
*G01L 1/00* (2006.01)
*G01M 5/00* (2006.01)

(52) U.S. Cl.
CPC .............. *G01L 1/005* (2013.01); *G01L 1/04* (2013.01); *G01L 1/044* (2013.01);
(Continued)

(58) Field of Classification Search
CPC ......... G01L 1/005; B81B 5/00; Y10S 977/00; G01P 15/003; G01P 15/005; G01P 15/135
See application file for complete search history.

(56) References Cited

U.S. PATENT DOCUMENTS

| 4,598,585 A | 7/1986 | Boxenhorn |
| 5,421,204 A | 6/1995 | Svaty, Jr. |

(Continued)

FOREIGN PATENT DOCUMENTS

| CN | 102538949 A | 7/2012 |
| CN | 103241701 A | 8/2013 |

(Continued)

OTHER PUBLICATIONS

G. Krijnen and N. Tas, "Micromechanical Actuators", *MESA+ Research Institute, Transducer Technology Laboratory, University of Twente*, Enschede, The Netherlands.

(Continued)

*Primary Examiner* — Tran M. Tran
(74) *Attorney, Agent, or Firm* — Muncy, Geissler, Olds & Lowe, P.C.

(57) ABSTRACT

A low power consumption multi-contact micro electro-mechanical strain/displacement sensor and miniature autonomous self-contained systems for recording of stress and usage history with direct output suitable for fatigue and load spectrum analysis are provided. In aerospace applications the system can assist in prediction of fatigue of a component subject to mechanical stresses as well as in harmonizing maintenance and overhauls intervals. In alternative applications, i.e. civil structures, general machinery, marine and submarine vessels, etc., the system can autonomously record strain history, strain spectrum or maximum values of the strain over a prolonged period of time using an internal power supply or a power supply combined with an energy harvesting device. The sensor is based on MEMS technology and incorporates a micro array of flexible micro or nano-size cantilevers. The system can have extremely low power consumption while maintaining precision and temperature/humidify independence.

20 Claims, 31 Drawing Sheets

(52) U.S. Cl.
CPC ........ *G01M 5/0033* (2013.01); *G01M 5/0083* (2013.01); *B81B 2201/02* (2013.01)

(56) References Cited

U.S. PATENT DOCUMENTS

| | | | |
|---|---|---|---|
| 5,739,425 A | 4/1998 | Binnig et al. | |
| 5,780,727 A | 7/1998 | Gimzewski et al. | |
| 5,910,837 A | 6/1999 | Gimzewski | |
| 5,936,411 A | 8/1999 | Jacobsen et al. | |
| 6,199,874 B1* | 3/2001 | Galvin | B81C 1/00619 |
| | | | 280/5.514 |
| 6,445,006 B1* | 9/2002 | Brandes | B82Y 10/00 |
| | | | 257/24 |
| 6,480,792 B1 | 11/2002 | Prendergast | |
| 6,487,913 B2 | 12/2002 | Debesis et al. | |
| 6,492,820 B2 | 12/2002 | Adachi et al. | |
| 6,619,123 B2* | 9/2003 | Gianchandani | B81C 99/005 |
| | | | 73/504.04 |
| 6,744,338 B2 | 6/2004 | Nikitin | |
| 6,946,851 B2* | 9/2005 | Lee | B82Y 30/00 |
| | | | 324/658 |
| 6,947,624 B2* | 9/2005 | Kubby | G02B 6/358 |
| | | | 385/16 |
| 7,093,498 B2* | 8/2006 | Herbert | G01B 7/22 |
| | | | 73/778 |
| 7,120,332 B1* | 10/2006 | Spoonhower | G02B 6/29343 |
| | | | 385/25 |
| 7,148,579 B2 | 12/2006 | Pinkerton et al. | |
| 7,256,063 B2* | 8/2007 | Pinkerton | B81B 3/0021 |
| | | | 438/53 |
| 7,287,415 B2* | 10/2007 | Borwick, III | G01N 11/16 |
| | | | 73/54.01 |
| 7,348,591 B2* | 3/2008 | Yamauchi | B82Y 10/00 |
| | | | 257/2 |
| 7,412,899 B2 | 8/2008 | Mian et al. | |
| 7,477,441 B1 | 1/2009 | Zhang et al. | |
| 7,558,103 B2* | 7/2009 | Nakamura | B82Y 10/00 |
| | | | 365/151 |
| 7,560,070 B1 | 7/2009 | Baller et al. | |
| 7,575,933 B2* | 8/2009 | Gabriel | B82Y 15/00 |
| | | | 422/82.01 |
| 7,680,630 B2 | 3/2010 | Schmidt | |
| 7,810,373 B2* | 10/2010 | Amin | G01P 15/06 |
| | | | 73/12.09 |
| 7,832,281 B2 | 11/2010 | Mian et al. | |
| 7,839,028 B2 | 11/2010 | Pinkerton | |
| 7,928,343 B2 | 4/2011 | King et al. | |
| 8,330,154 B2* | 12/2012 | Wang | H02N 2/18 |
| | | | 257/41 |
| 8,372,487 B2* | 2/2013 | Kawabata | B82Y 30/00 |
| | | | 427/402 |
| 8,385,113 B2* | 2/2013 | Pinkerton | B81B 3/0021 |
| | | | 365/157 |
| 8,415,859 B2* | 4/2013 | Lee | H02N 2/18 |
| | | | 290/1 R |
| 8,468,663 B2* | 6/2013 | Choi | H02N 2/18 |
| | | | 29/25.35 |
| 8,600,611 B2 | 12/2013 | Seize | |
| 8,618,928 B2 | 12/2013 | Weed et al. | |
| 8,780,146 B2* | 7/2014 | Huang | H01H 59/00 |
| | | | 200/181 |
| 8,810,023 B2* | 8/2014 | Koduri | G01P 15/0802 |
| | | | 257/692 |
| 9,851,271 B2* | 12/2017 | Koo | G01L 5/161 |
| 10,036,635 B2* | 7/2018 | Zhang | G01C 19/574 |
| 10,340,818 B2* | 7/2019 | Suzuki | B81B 3/0054 |
| 2004/0228258 A1 | 11/2004 | Binnig et al. | |
| 2006/0056959 A1 | 3/2006 | Sabol et al. | |
| 2006/0213275 A1 | 9/2006 | Cobianu et al. | |
| 2007/0062299 A1 | 3/2007 | Mian et al. | |
| 2007/0214890 A1 | 9/2007 | Mukherjee | |
| 2009/0188325 A1 | 7/2009 | Aebersold et al. | |
| 2009/0319102 A1 | 12/2009 | Winterhalter et al. | |
| 2009/0322365 A1 | 12/2009 | Garmire et al. | |
| 2010/0152621 A1 | 6/2010 | Janna et al. | |
| 2010/0176898 A1 | 7/2010 | Kihara | |
| 2012/0035864 A1 | 2/2012 | Frydendal | |
| 2012/0160029 A1* | 6/2012 | Yamaguchi | G01P 15/125 |
| | | | 73/514.32 |
| 2013/0278377 A1 | 10/2013 | Slupsky et al. | |
| 2014/0311247 A1 | 10/2014 | Zhang et al. | |

FOREIGN PATENT DOCUMENTS

| | | |
|---|---|---|
| EP | 1226437 A1 | 7/2002 |
| SU | 983441 A1 | 12/1982 |

OTHER PUBLICATIONS

A.S. Holmes, S. Lucyszyn, S. Pranonsatit and G. Hong, "*Rotary RF MEMS Switch based on the Wobble Motor Principle*", Optical and Semiconductor Devices Group, Department of Electronic & Electronic Engineering, Imperial College London, London, UK.

Z. Li and N. Tien, "*Low-Cost Electroplated Vertical Comb-Drive*", Berkeley Sensor and Actuator Center, Department of Electrical and Computer Engineering, University of California, Davis, CA.

D. M. Tanner, J. A. Walraven, K. Helgesen, L. W. Irwin, F. Brown, N. F. Smith, and N. Masters, "*MEMS reliability in shock environments*", Sandia National Laboratories, Albuquerque, NM, Presented at IEEE International Reliability Physics Symposium in San Jose, CA, Apr. 10-13, 2000, pp. 129-138.

Multiple Authors, "*Aging Aircraft Fleets: Structural and Other Subsystem Aspects*", North Atlantic Treaty Organization, Research and Technology Organization, Neuilly-Sur-Seine Cedex, France, presented Nov. 13-16, 2000 in Sofia, Bulgaria.

S. Willis, *Next Generation Data Acquisition Technologies for Aging Aircraft* AGRA Control, Dublin, Ireland, 7th DSTO International Conference on Health & Usage Monitoring.

A.C. J. Glover, "*Non-Destructive Testing Techniques for Aerospace Applications*", Inspection and Maintenance Systems Division, Olympus Australia Pty Ltd, Victoria, Australia.

T.L. Haglage, "*Flight Test Evaluation of a Scratch Strain Gage*", Air Force Flight Dynamics Laboratory (FDTR), Wright-Patterson Air Force Base, Ohio.

D. M. Vidrine, "*A Sequential Strain Monitor and Recorder for Use in Aircraft Fatigue Life Prediction*", Naval Postgraduate School, Monterey, California.

K.L. Singh and D.V. Venkatasubramanyam,"Techniques to Generate and 45 Optimize the Load Spectra for an Aircraft", Structural Technologies Division, National Aerospace Laboratories, Bengaluru, India, 3rd International Conference on Integrity, Reliability and Failure, Porto/Portugal, Jul. 20-24, 2009.

L.Molent and B. Aktepe, "*Review of fatigue monitoring of agile military aircraft*", Aeronautical and Maritime Research Laboratory, Defence Science and Technology Organisation, Victoria, Australia.

S. Ariduru, *Fatigue Life Calculation by Rainflow Cycle Counting Method*, The Graduate School of Natural and Applied Sciences of Middle East Technical University.

C. Martin, *A Review of Australian and New Zealand Investigations on Aeronautical Fatigue During the Period Between Apr. 1995 to Mar. 1997*, Airframes and Engines Division, Aeronautical and Maritime Research Laboratory, Defence Science andTechnology Organisation, Victoria, Australia.

L. Molent, "*Proposed Specifications for an Unified Strain and Flight Parameter Based Aircraft Fatigue Usage Monitoring System*", Airframes and Engines Division, Aeronautical and Maritime Research Laboratory, Defence Science and Technology Organisation, Victoria, Australia.

D.E. Gordon, S.B. Kirschner and S.D. Manning, "*Development of Fatigue and Crack Propagation Design & Analysis Methodology in a Corrosive Environemnt for Typoical Mechanically-Fastened Joints*", General Dynamics Corporation for Naval Development Center, Department of the Navy.

S. W. Arms, C. P. Townsend, D. L Churchill, S. M. Moon and N. Phan, "*Energy Harvesting Wireless Sensorsfor Helicopter Damage*

(56) References Cited

OTHER PUBLICATIONS

*Tracking*", American Helicopter Society International Inc., proceedings of AHS International Forum 62, HUMS III session, Phoenix, AZ, May 11, 2006.
K. Matsumoto, K. Saruwatari and Y. Suzuki, *Vibration-Powered Battery-less Sensor Node Using MEMS Electret Generator*, Department of Mechanical Engineering, The University of Tokyo, Tokyo, Japan, TechnoDesign Co., Ltd, Kumamoto, Japan *DSTO International Conference on Health and Usage Monitoring*, Aeronautical and Maritime Research Laboratory, Defence Science and Technology Organisation, Victoria, Australia, presented in Melbourne, Feb. 19-20, 2001.
J.H. Galbreath, C.P. Townsend, S.W. Mundell, M.J. Hamel, B. Esser, D. Huston, S.W. Arms, "*Civil Structure Strain Monitoring with Power-Efficient, High-Speed Wireless Sensor Networks*", MicroStrain, Inc., Williston, VT, University of Vermont, Dept. of Civil & Mechanical Engineering, Burlington, VT, USA, Presented at 4th Int'l Workshop on Structural Health Monitoring Stanford University, Stanford CA, Sep. 15-17, 2003.
S. W. Arms, C. P. Townsend, J. H. Galbreath, S. J. DiStasi, D. Liebschutz, and N. Phan, "*Flight Testing of Wireless Sensing Networks for Rotorcraft Structural Health and Usage Management Systems*", MicroStrain, Inc., Williston, VT, USA, Navy/NAVAi R, Structures Division, Patuxent River, MD, 7th DSTO International Conterence on Health & Usage Monitoring.
D.A. Howell and H. W. Shenton III, "*System for In-Service Strain Monitoring of Ordinary Bridges*", Journal of Bridge Engineering © ASCE, Nov.Dec. 2006.
K. A. Jason and K. Surya, *A Survey of Health and Usage Monitoring System in Contemporary Aircraff*, International Journal of Engineering and Technical Research (IJETR), ISSN: 2321-0869, vol. 1, Issue-9, Nov. 2013.
M. Neumair and W. Luber, "*Structural Health Monitoring for Military Aircraft Considering Vibration*", EADS Deutschland GmbH, Munich, Germany.
H. Murayama, D. Wada, and H. Igawa, "*Structural Health Monitoring by Using Fiber-Optic Distributed Strain Sensors With High Spatial Resolution*", School of Engineering, The University of Tokyo, Tokyo, Japan, Japan Aerospace Exploration Agency, 6-13-1 Ohsawa, Mitaka, Tokyo, 181-0015 Japan, Photonic Sensors (2013) vol. 3, No. 4: 355-376.
S. Maley J. Plets and N. D. Phan, "*US Navy Roadmap to Structural Health and Usage Monitoring—The Present and Future*", Structures Division, Naval Air Systems Command, Patuxent River, MD, American Helicopter Society International, Inc., presented at the American Helicopter Society 63rd Annual Forum, Virginia Beach, VA, May 1-3, 2007.
S. Mahlknecht, J. GlaserandT. Hemdl, "*PAWIS: TowardsaPowerAware SystemArchitecturefora SOC/SIP WirelessSensorandActorNode Implementation*", Institute of Computer Technology, Vienna University of Technology, Vienna, Austria, Infineon Technologies Austria AG, Vienna, Austria.
P. Okulov, "Analysis of join effects of loads from suspended cranes and snow on metal structures of roofs of industrial buildings", Moscow, 1985, MISI (Moscow State University of Civil Engineering formerly known as MISI).
International Search Report dated Apr. 7, 2016 in corresponding application PCT/IB2015/059451.
Partial Supplementary European Search Report dated Oct. 15, 2018 in corresponding application 15867043.0.

\* cited by examiner

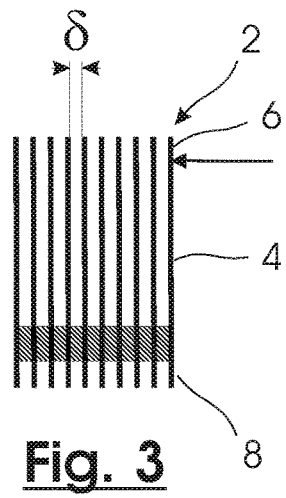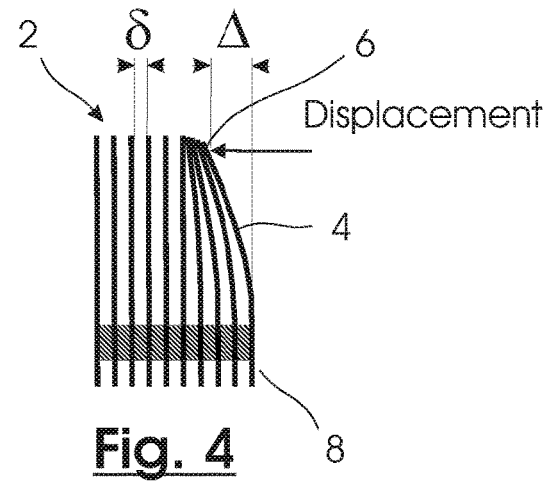
Fig. 3  Fig. 4
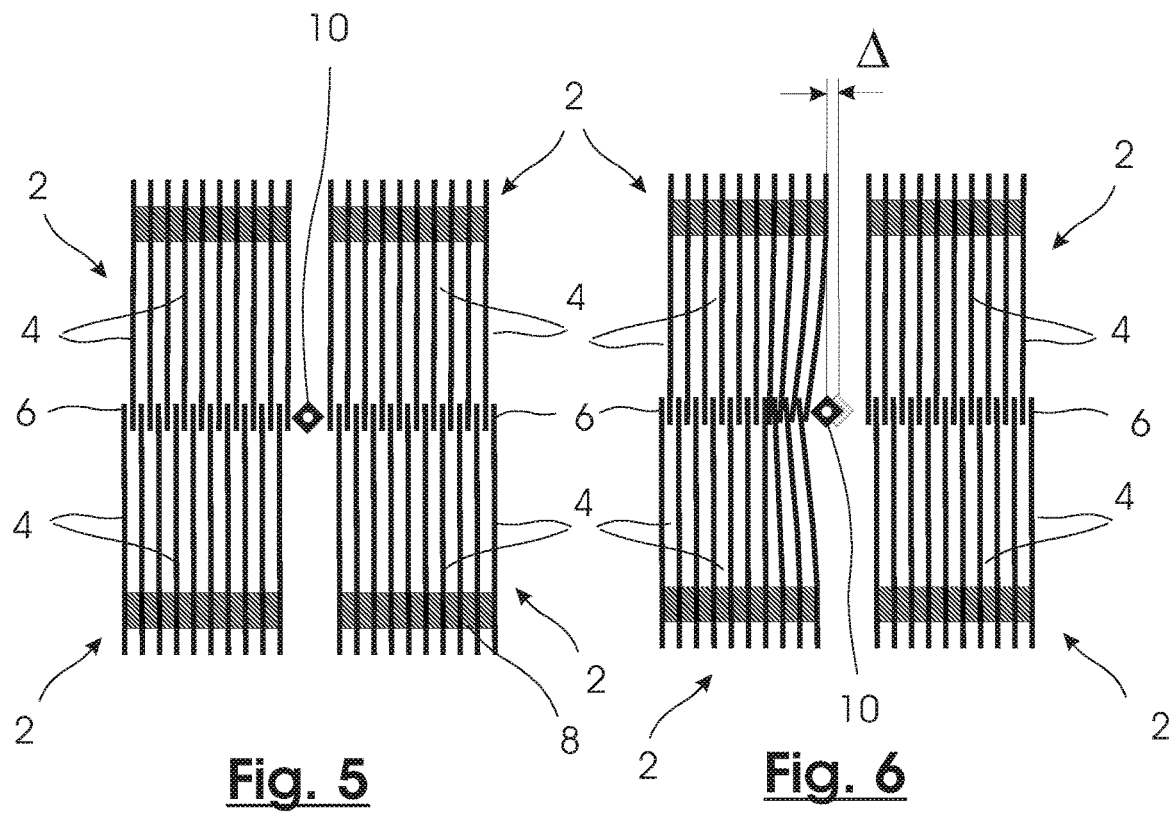
Fig. 5  Fig. 6

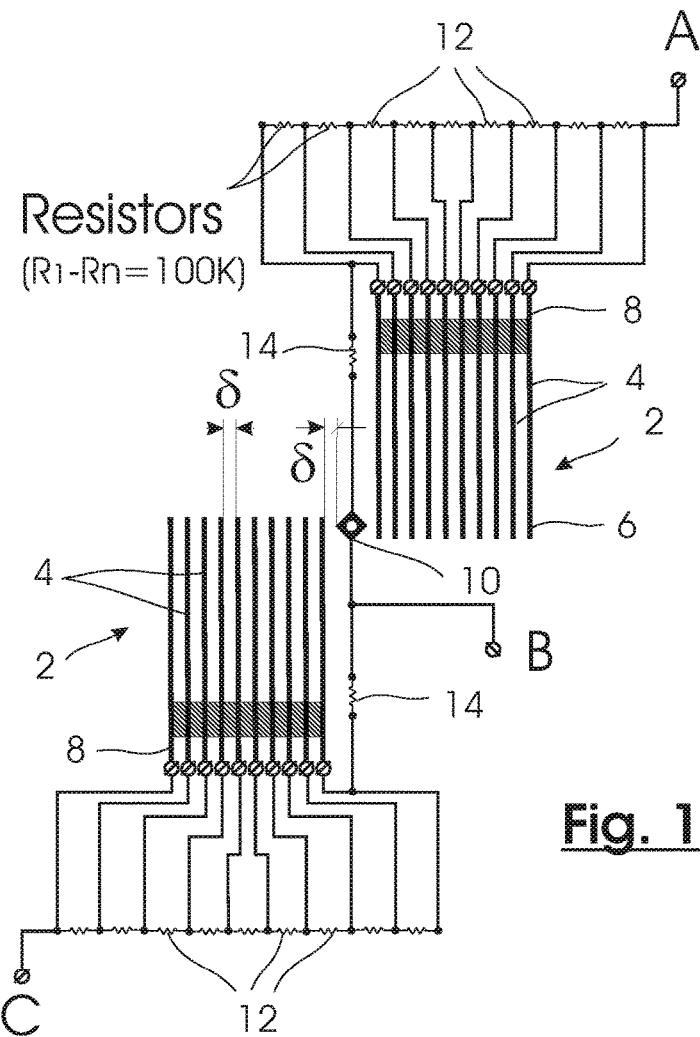
Fig. 10
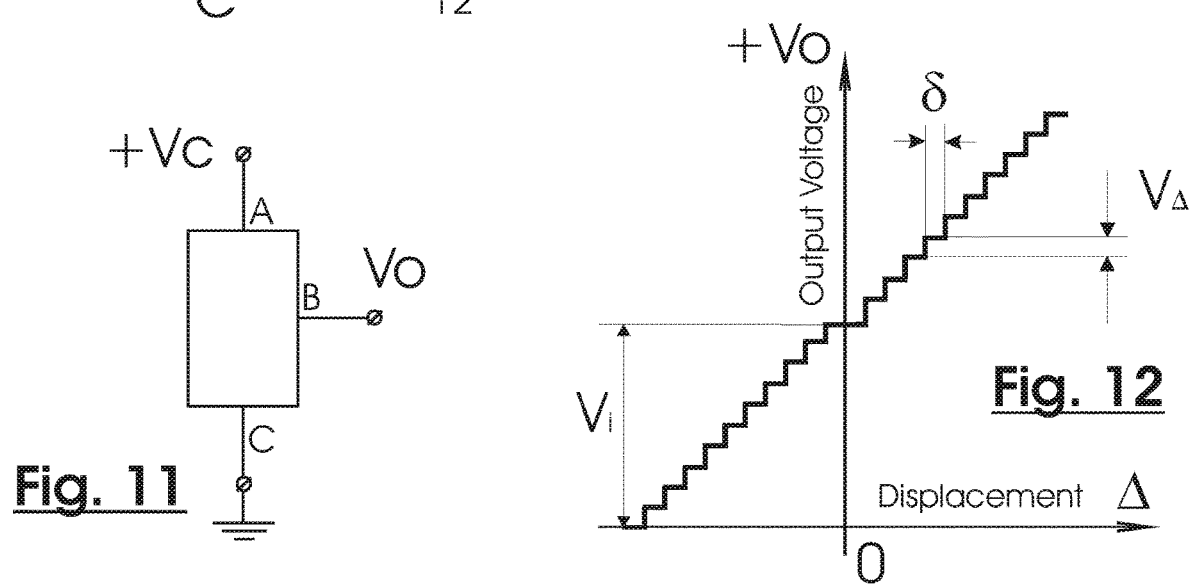
Fig. 11
Fig. 12

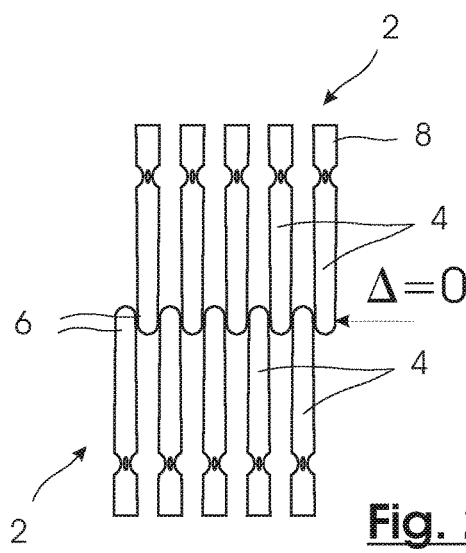
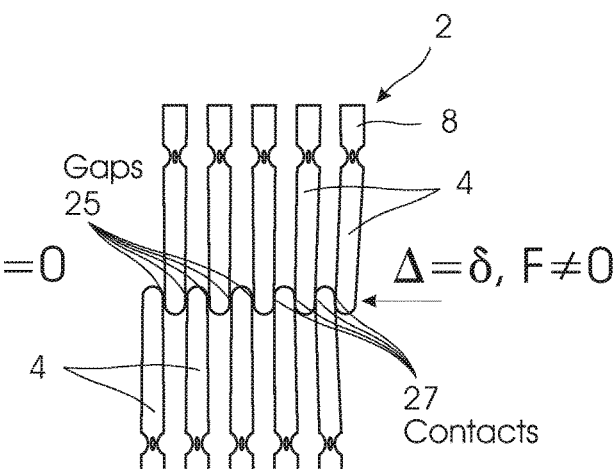
Fig. 24
Fig. 25
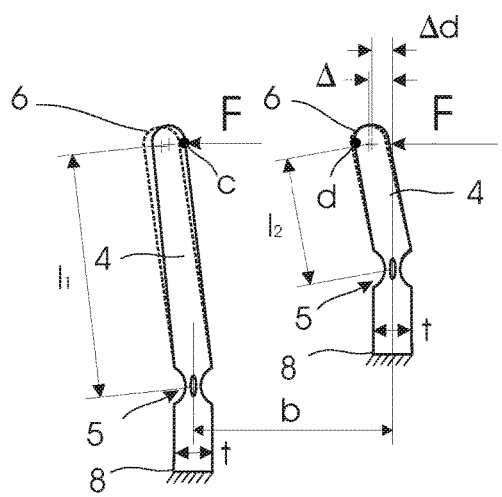
Fig. 26  Fig. 27
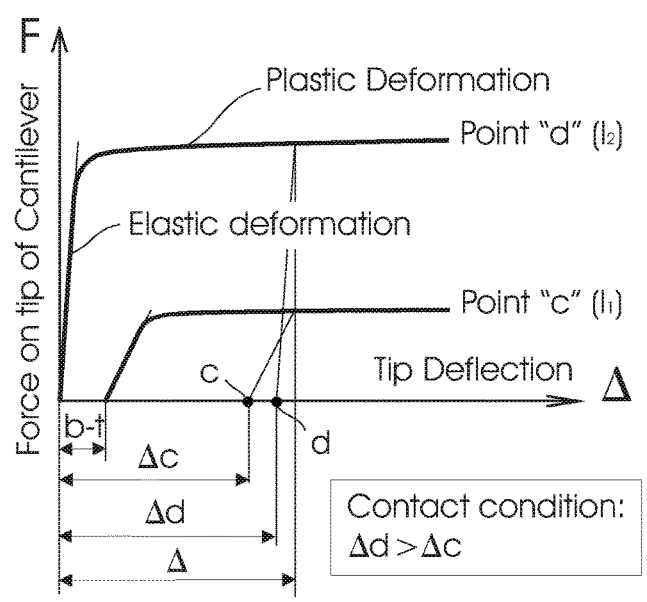
Fig. 28

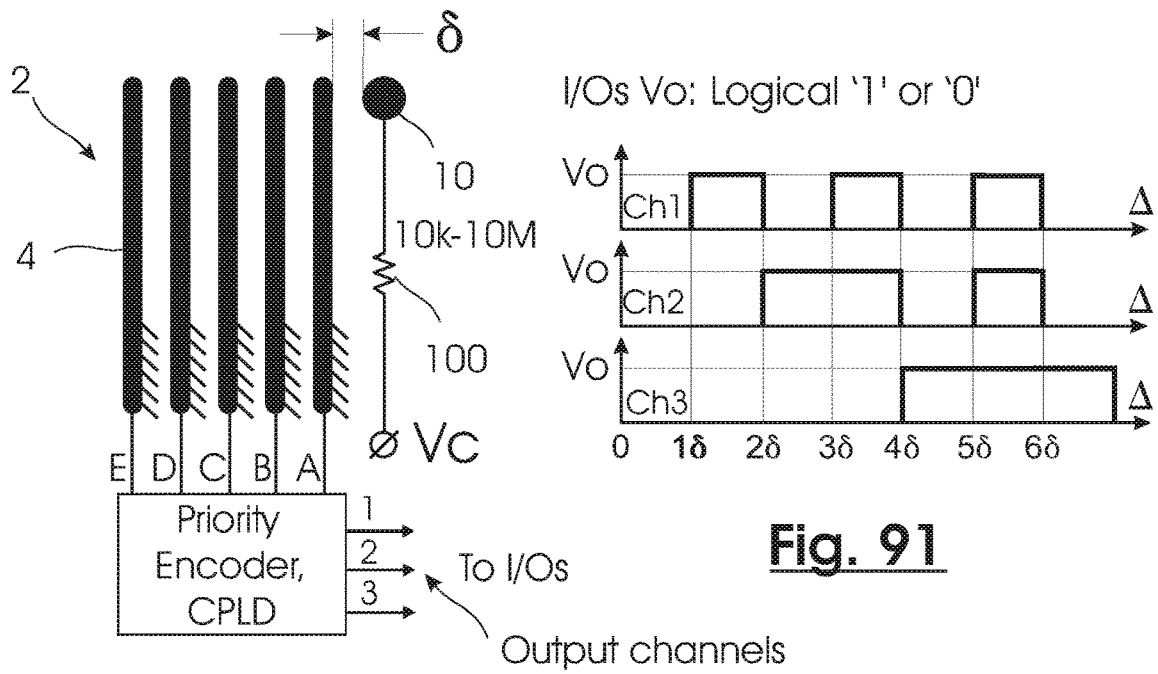
Fig. 90
Fig. 91
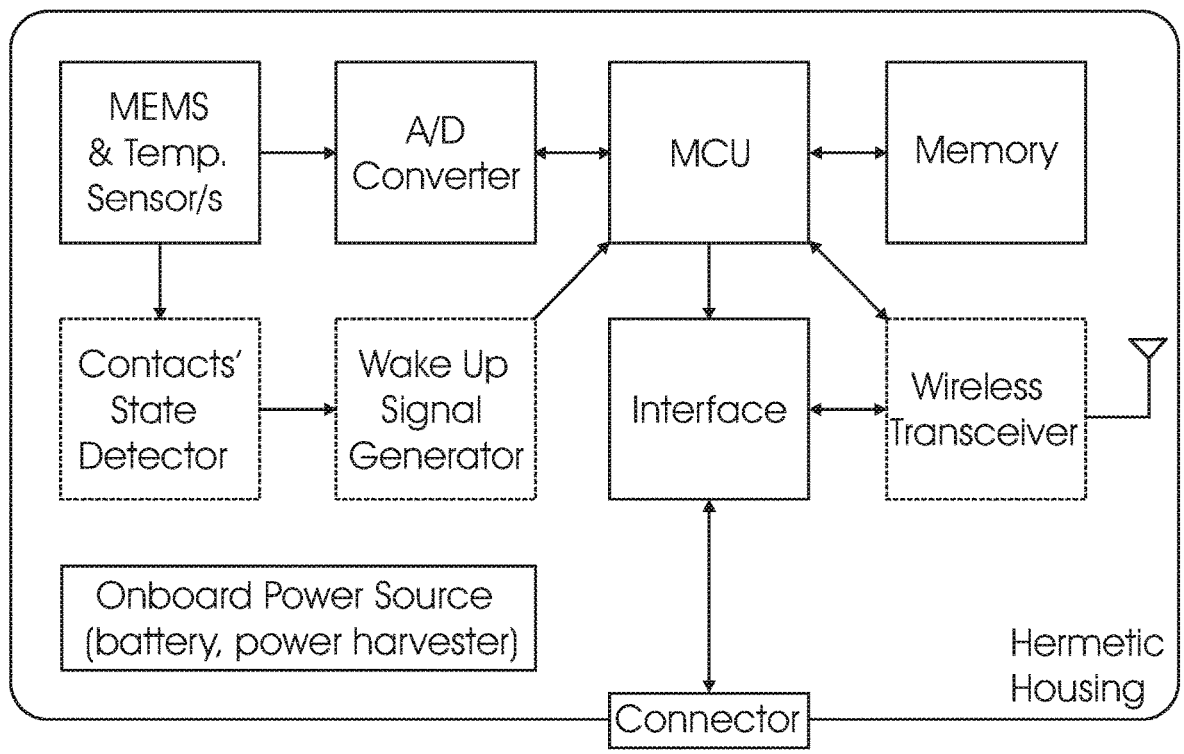
Fig. 92

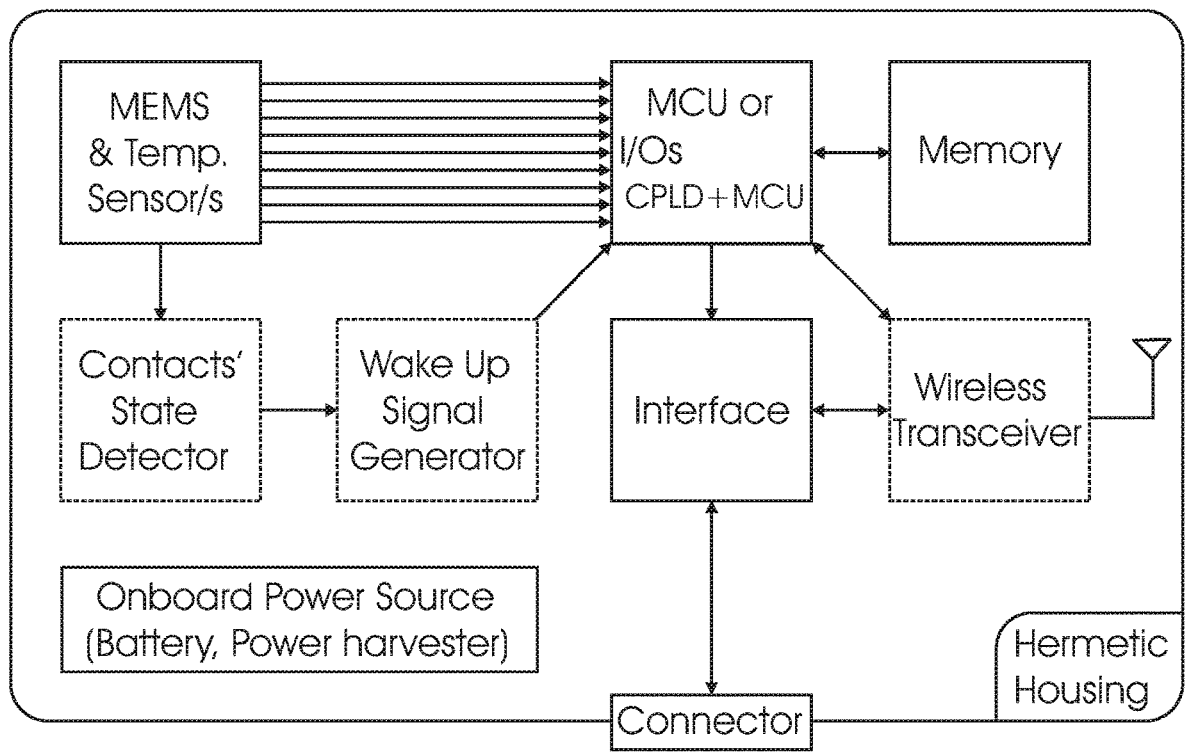
Legend: ---------- optional  Fig. 93
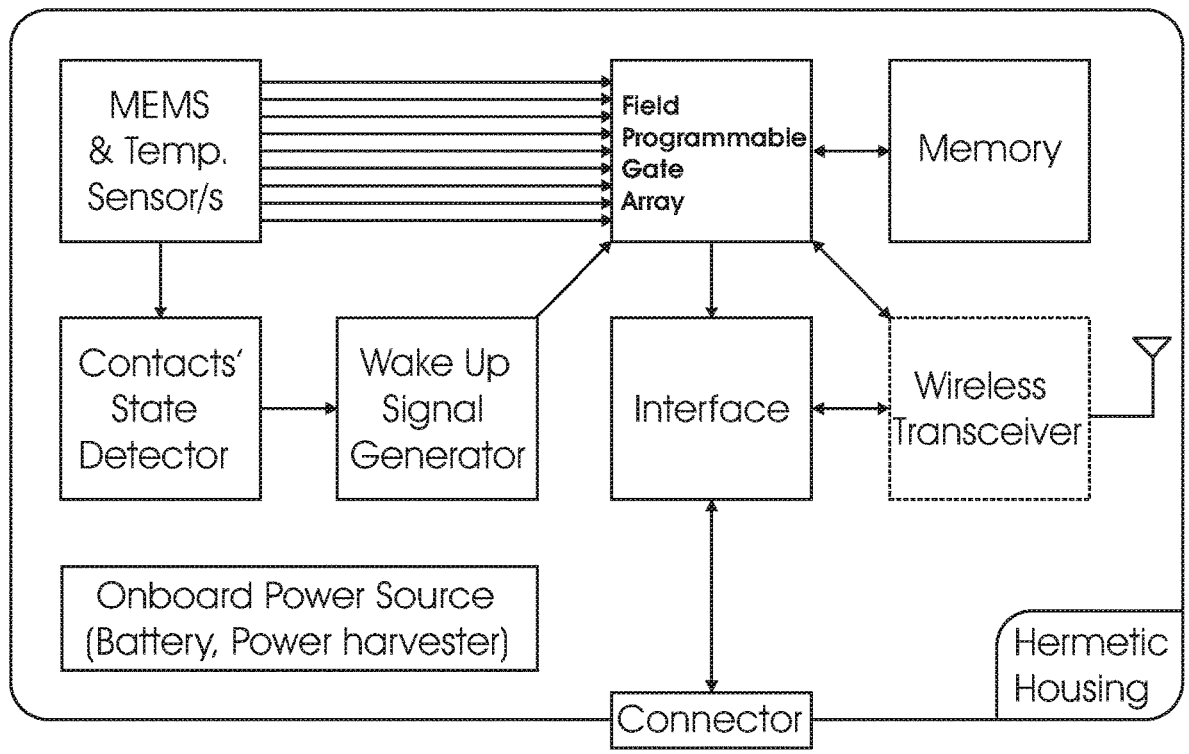
Legend: ---------- optional  Fig. 94

MICRO ELECTRO-MECHANICAL STRAIN DISPLACEMENT SENSOR AND USAGE MONITORING SYSTEM

CROSS REFERENCE TO RELATED APPLICATIONS

This application is a National Stage of International Application No. PCT/IB2015/059451, filed on Dec. 9, 2015, for which priority is claimed under 35 U.S.C. § 120; and this application claims priority of U.S. Provisional Application No. 62/090,001 filed on Dec. 10, 2014 under 35 U.S.C. § 119(e), the entire contents of all of which are hereby incorporated by reference.

TECHNICAL FIELD

The present invention relates to strain and displacement gauges. More specifically, the present invention relates to systems for the measurement and logging of strain or displacement history in a wide variety of applications, such as in mechanical components of a fixed or a rotary wing aircraft, civil structures, machines or vessels. It also can work as a stand-alone or integrated sensor or recording device for use in variety of applications where the measured parameter can cause a displacement such as accelerometers and bad cells.

BACKGROUND ART

In the aviation industry safety rules require that aircraft components are constantly monitored for fatigue as these components are subjected to a large number of significant and prolonged mechanical stresses (or loads). Accordingly, these components are subjected to overhauls on a regular and recurrent basis. A number of specific components, such as landing gears, engine pylons, etc. can conceivably benefit from a sensor configuration capable of recording maximum loads and therefore providing valuable information on effects of hard landing and other overloading conditions which are difficult to deduct from presently known flight recording apparatuses.

In civil structures such as buildings, bridges, overpasses, dams, oil reservoirs, pressure vessels and towers knowing the history of strain experienced by the structures can present valuable information for assisting in predicting the maximum stochastic loads and the remaining working life of the structure as well as assisting in assessing the integrity of the structure.

Such information could also assist civil engineers conducting investigations related to determining the necessity of structural reinforcements in order to address the effects of climatic changes (i.e.: both static and dynamic loads in the form of wind, snow, water levels, among other loads that will be readily appreciated by the skilled person), urban changes (such as increasing the magnitude of transport loads on a bridge or roadway) and technological process changes (which can lead to increased loads due to overhead cranes, conveyors, etc.) on industrial buildings and other pieces of civil infrastructure.

When structures are tested in a laboratory environment in order to monitor strain or displacement there are a number of limitations (including space limitations and/or limitations to the number of available data logging channels) that could be overcome by using simple and inexpensive self-contained recording gauges.

For an overall review of prior art solutions for microelectromechanical systems in a variety of industrial and commercial applications, the reader is directed to the following academic and patent publications:

G. Krijnen and N. Tas, "Micromechanical Actuators", MESA+ Research Institute, Transducer Technology Laboratory, University of Twente, Enschede, The Netherlands A. S. Holmes, S. Lucyszyn, S. Pranonsatit and G. Hong, "*Rotary RF MEMS Switch based on the Wobble Motor Principle*", Optical and Semiconductor Devices Group, Department of Electronic & Electronic Engineering, Imperial College London, London, UK Z. Li and N. Tien, "*Low-Cost Electroplated Vertical Comb-Drive*", Berkeley Sensor and Actuator Center, Department of Electrical and Computer Engineering, University of California, Davis, Calif.

D. M. Tanner, J. A. Walraven, K. Helgesen, L. W. Irwin, F. Brown, N. F. Smith, and N. Masters, "*MEMS reliability in shock environments*", Sandia National Laboratories, Albuquerque, N. Mex., Presented at IEEE International Reliability Physics Symposium in San Jose, Calif., Apr. 10-13, 2000, pp. 129-138

U.S. Patent Publication No. 2012/0035864 to Frydenhal—Determining an Equivalent Mechanical Load U.S. Pat. No. 8,600,611 to Seize—System and Method for Measuring Fatigue for Mechanical Components of an Aircraft and Aircraft Maintenance Method Multiple Authors, "*Aging Aircraft Fleets: Structural and Other Subsystem Aspects*", North Atlantic Treaty Organization, Research and Technology Organization, Neuilly-Sur-Seine Cedex, France, presented 13-16 Nov. 2000 in Sofia, Bulgaria U.S. Pat. No. 7,148,579 to Pinkerton et al.—Energy Conversion Systems Utilizing Parallel Array of Automatic Switches and Generators S. Willis, "*Next Generation Data Acquisition Technologies for Aging Aircraft*", ACRA CONTROL, Dublin, Ireland, 7th DSTO International Conference on Health & Usage Monitoring A. C. J. Glover, "*Non-Destructive Testing Techniques for Aerospace Applications*", Inspection and Maintenance Systems Division, Olympus Australia Pty Ltd, Victoria, Australia U.S. Pat. No. 7,928,343 to King et al—Microcantilever Heater-Thermometer with Integrated Temperature-Compensated Strain Sensor U.S. Pat. No. 7,839,028 to Pinkerton et al.—Nanoelectromechanical Systems and Methods for Making the Same U.S. Pat. No. 6,744,338 to Nikitin—Resonant Operation of MEMS Switch U.S. Pat. No. 5,910,837 to Gimzewski—Photomechanical Transducer U.S. Pat. No. 5,739,425 to Binnig et al.—Cantilever with Integrated Deflection Sensor U.S. Patent Publication No. 2010/0176898 to Kihara—MEMS Device and Method for Manufacturing the Same U.S. Patent Publication No. 2004/0228258 to Binnig et al.—Method and Apparatus for Reading and Array of Thermal European Patent No. 1,226,437 to Bailer et al.—Cantilever Sensors and Transducers T. L. Haglage, "*Flight Test Evaluation of a Scratch Strain Gage*", Air Force Flight Dynamics Laboratory (FDTR), Wright-Patterson Air Force Base, Ohio U.S. Patent Publication No. 2007/0062299 to Mian et al.—MEMS-based Monitoring U.S. Pat. No. 5,780,727 to Gimzewski—Electromechanical Transducer U.S. Pat. No. 5,936,411 to Jacobsen et al.—Apparatus and Method for Measuring Strain within a Structure U.S. Pat. No. 6,492,820 to Adachi et al.—Displacement Measuring Device U.S. Pat. No. 7,412,899 to Mian et al.—MEMS-based Monitoring U.S. Pat. No. 7,832,281 to Mian et al.—MEMS-based Monitoring U.S. Pat. No. 6,480,792 to Prenderast—Fatigue Monitoring Systems and Methods Incorporating Neural Networks D. M. Vidrine, "*A Sequential Strain Monitor and Recorder for Use in Aircraft Fatigue Life Prediction*", Naval Postgraduate School, Monterey, Calif.

K. L. Singh and D. V. Venkatasubramanyam, "Techniques to Generate and Optimize the Load Spectra for an Aircraft", Structural Technologies Division, National Aerospace Laboratories, Bengaluru, India, 3rd International Conference on Integrity, Reliability and Failure, Porto/Portugal, 20-24 Jul. 2009

L. Molent and B. Aktepe, "*Review of fatigue monitoring of agile military aircraft*", Aeronautical and Maritime Research Laboratory, Defence Science and Technology Organisation, Victoria, Australia S. Ariduru, "*Fatigue Life Calculation by Rainflow Cycle Counting Method*", The Graduate School of Natural and Applied Sciences of Middle East Technical University C. Martin, "*A Review of Australian and New Zealand Investigations on Aeronautical Fatigue During the Period Between April* 1995 *to March* 1997", Airframes and Engines Division, Aeronautical and Maritime Research Laboratory, Defence Science and Technology Organisation, Victoria, Australia L. Molent, "*Proposed Specifications for an Unified Strain and Flight Parameter Based Aircraft Fatigue Usage Monitoring System*", Airframes and Engines Division, Aeronautical and Maritime Research Laboratory, Defence Science and Technology Organisation, Victoria, Australia D. E. Gordon, S. B. Kirschner and S. D. Manning, "Development of Fatigue and Crack Propagation Design & Analysis Methodology in a Corrosive Environment for Typical Mechanically-Fastened Joints", General Dynamics Corporation for Naval Development Center, Department of the Navy U.S. Pat. No. 7,680,630 to Schmidt—Monitoring A Parameter with Low Power Consumption for Aircraft Landing Gear-Data Logger U.S. Patent Publication No. 2009/0319102 to Winterhalter et al.—Flight Recorder Having Integral Reserve Power Supply Within Form Factor of Enclosure and Method Therefor S. W. Arms, C. P. Townsend, D. L Churchill, S. M. Moon and N. Phan, "*Energy Harvesting Wireless Sensors for Helicopter Damage Tracking*", American Helicopter Society International Inc., proceedings of AHS International Forum 62, HUMS III session, Phoenix, Ariz., May 11, 2006

K. Matsumoto, K. Saruwatari and Y. Suzuki, "*Vibration-Powered Battery-less Sensor Node Using MEMS Electret Generator*", Department of Mechanical Engineering, The University of Tokyo, Tokyo, Japan, TechnoDesign Co., Ltd, Kumamoto, Japan

*DSTO International Conference on Health and Usage Monitoring*, Aeronautical and Maritime Research Laboratory, Defence Science and Technology Organisation, Victoria, Australia, presented in Melbourne, Feb. 19-20, 2001

J. H. Galbreath, C. P. Townsend, S. W. Mundell, M. J. Hamel, B. Esser, D. Huston, S. W. Arms, "*Civil Structure Strain Monitoring with Power-Efficient, High-Speed Wireless Sensor Networks*", MicroStrain, Inc., Williston, Vt., University of Vermont, Dept. Of Civil & Mechanical Engineering, Burlington, Vt., USA, Presented at 4th Int'l Workshop on Structural Health Monitoring Stanford University, Stanford Calif., Sep. 15-17, 2003

S. W. Arms, C. P. Townsend, J. H. Galbreath, S. J. DiStasi, D. Liebschutz, and N. Phan, "*Flight Testing of Wireless Sensing Networks for Rotorcraft Structural Health and Usage Management Systems*", MicroStrain, Inc., Williston, Vt., USA, Navy/NAVAIR, Structures Division, Patuxent River, Md., 7th DSTO International Conference on Health & Usage Monitoring D. A. Howell and H. W. Shenton III, "*System for In-Service Strain Monitoring of Ordinary Bridges*", JOURNAL OF BRIDGE ENGINEERING© ASCE, November/December 2006

K. A. Jason and K. Surya, "*A Survey of Health and Usage Monitoring System in Contemporary Aircraft*", International Journal of Engineering and Technical Research (IJETR), ISSN: 2321-0869, Volume-1, Issue-9, November 2013

M. Neumair and W. Luber, "*Structural Health Monitoring For Military Aircraft Considering Vibration*", EADS Deutschland GmbH, Munich, Germany H. Murayama, D. Wada, and H. Igawa, "*Structural Health Monitoring by Using Fiber-Optic Distributed Strain Sensors With High Spatial Resolution*", School of Engineering, The University of Tokyo, Tokyo, Japan, Japan Aerospace Exploration Agency, 6-13-1 Ohsawa, Mitaka, Tokyo, 181-0015 Japan, Photonic Sensors (2013) Vol. 3, No. 4: 355-376

S. Maley J. Plets and N. D. Phan, "*US Navy Roadmap to Structural Health and Usage Monitoring—The Present and Future*", Structures Division, Naval Air Systems Command, Patuxent River, Md., American Helicopter Society International, Inc., presented at the American Helicopter Society 63rd Annual Forum, Virginia Beach, Va., May 1-3, 2007

U.S. Pat. No. 5,421,204 to Svaty, Jr.—Structural Monitoring System

U.S. Pat. No. 8,618,928 to Weed et al.—System and Methods for Wireless Health Monitoring of a Locator Beacon which Aids the Detection and Location of a Vehicle and/or People U.S. Patent Publication No. U.S. 2013/0278377 to Slupsky et al.—Wireless Sensor Device S. Mahlknecht, J. Glaser and T. Herndl, "*PAWIS: Towards a Power Aware System Architecture for a SOC/SIP Wireless Sensor and Actor Node Implementation*", Institute of Computer Technology, Vienna University of Technology, Vienna, Austria, Infineon Technologies Austria AG, Vienna, Austria In aerospace applications, the components used to attach the propulsion system (i.e.: the turbo-jet engines) to the airplane as well as components such as wings, landing gears and critical parts of the fuselage are subjected to strict systematic inspections. Each overhaul requires removing the airplane from service in order to access or remove critical parts in order to carry out these tests.

To address these issues, Health and Usage Monitoring Systems (HUMS) have been developed that utilize data collection and analysis techniques to help ensure availability, reliability and safety of vehicles, specifically commercial vehicles such as aircraft and trains.

The importance and benefits of structural health monitoring are well-known and clearly evident and include significant risk reduction, particularly in instances of severe usage of an aircraft, and the potential prolongation of the life of an aircraft when the measured usage spectrum is in fact less intense than the designed usage spectrum. Particularly, HUMS can significantly reduce scheduled maintenance, aborted missions and maintenance test flights in both fixed and rotary aircraft applications (i.e.: airplanes and helicopters).

Historically, fatigue prediction methodologies were an important part of an aircraft's safety and maintenance programs. For example, U.S. Pat. No. 8,600,611 to Seize teaches that the frequency of the overhauls is determined in advance and an overhaul is carried out on expiration of each preset time period (for example every 2600 flight cycles: takeoff-flight-landing), irrespective of the real state of fatigue of the component. Seize contemplates avoiding any risk that can arise when an overhaul is undertaken too long after a fatigue state develops and an intervention, such as a repair or a replacement of the component, is required. Seize also provides that this relevant time period must be selected (either through computation or empirical analysis) based on the minimum period beyond which there is a risk that the component will fail, even if this risk remains statistically marginal.

This selected minimum period therefore corresponds to situations where the specific components are subjected to accidental, over-the-limit stresses; accordingly, many overhauls are carried out on components that could have been used without danger for longer since they have not been subjected to accidental stresses. Finally, in the absence of analysis of the real stresses to which a component has been subjected, the worst case scenario is always taken with respect to the possible damage that has occurred to the component, which can lead to overhauls that are often conducted prematurely.

Moreover, frequent overhauls can also introduce the additional possibility that an error may occur during re-assembly of the overhauled component during re-installation.

In some instances, data is collected by the inertial forces sensing unit of the airplane to determine whether the airplane has been subjected to exceptional stresses (such as a hard landing), however it can be difficult and costly to deduct an accurate and representative picture of the overloading of a variety of the components due to the sheer complexity of the overall mechanical system and the variance of the loading conditions, thereby resulting in a less accurate fatigue prediction.

Therefore, there is a need for a portable and self contained sensory means capable of recording and storing information relating to the peak stresses experienced by a particular component and the distribution of the stress levels historically occurring in the structure without adding much weight or complexity to the structure in terms of service and or reducing the reliability of data acquisition system or aircraft itself.

The aforementioned U.S. Pat. No. 8,600,611 to Seize provides a solution for employing multiple sensors that each have pre-set threshold levels for providing data collection and analysis. Disadvantages presented by this approach relate to the use of multiple sensors, which can be difficult to mount at close proximity to the point of interest thereby introducing error in stress estimation, which can be substantial. In addition, the use of separate sensors (each pre-set for a specific threshold level) complicates the device and can lead to increased power consumption.

SU983,441 to the present inventor P. Okulov teaches a multi-contact discrete displacement sensor which provides for automatic discrimination of threshold levels dividing the overall displacement into a number of levels predetermined by the gaps between contacting plates. This sensor employs a stack of electrically conductive flexible membranes as an array of contact plates.

Another known variant of a multi-contact discrete displacement sensor that uses an electro-conductive flexible cantilever plates is described in association with a system for data acquisition from the crane loads as discussed in PhD dissertation "Analysis of join effects of loads from suspended cranes and snow on metal structures of roofs of industrial buildings", Moscow, 1985, MISI (Moscow State University of Civil Engineering formerly known as MISI) by the present inventor, P. Okulov.

Therefore, in one embodiment it is contemplated that the present invention can provide a device that can be easily attachable and detachable to the underlying support structure, is operable in an autonomous mode and can store information without the need for any external device for an extended period with the possibility of easy retrieval of said data through wireless means or a simple interface.

DISCLOSURE OF INVENTION

Technical Problem

There is an acute problem of unknown history of strain/stress in a variety of structures under variable loading conditions prohibiting proper evaluation of structures' integrity and prediction of its fatigue life.

The objective of present invention is to provide a portable, autonomous and low power consumption cost effective solution for an autonomous strain/displacement data acquisition, processing on-board and data retrieval in compressed format allowing direct estimate of the history of the loading of a structure and predict its integrity and fatigue life.

Solution to Problem

Technical Solution

The proffered embodiment includes a MEMS (Micro Electro-Mechanical System) displacement sensor containing at least two arrays of micro or nano-size flexible cantilevers spaced apart in a such way so that displacement of one of the array against another causes sequential electrical or physical contact between adjacent cantilevers (utilizing Vernier effect, for instance, to avoid very small gaps between the majority of the adjacent cantilevers). The system and monitor has micro-processor for processing the data acquired, non-volatile memory for storing the processed information and an interface. The displacement is caused by strain of the tested structure can be obtained by a variety of means, preferably arranged in such a way to assure full thermal compensation of the device.

The present invention provides systems for the measurement and logging of strain history in a wide variety of applications and can work as a stand-alone or integrated sensor or recording device for use in variety of applications where the measured parameter can cause a displacement such as accelerometers and load cells.

In at least one embodiment, the present invention provides a MEMS displacement sensor having a plurality of deformable members and at least one driving member positioned in spaced relationship related to the deformable members and providing displacement wherein the displacement causes the deformable members to create a sequential contact between them wherein a predetermined spacing between the deformable members defines the MEMS displacement sensor sensitivity to the displacement and the state of the contacts assigned to a specific displacement define the output of the sensor.

In another embodiment the present invention provides a MEMS gauge such that the sensor has a deformable base with at least two spaced apart points of attachment to a test structure wherein the deformable base is connected to a substrate having at least two deformable members spaced apart with a predetermined gap and to a driver member in spaced relationship to the deformable member wherein the displacement caused by the test structure strain and deformation of the deformable base causes at least one of the deformable members to contact another deformable member thus changing the state of their contact relationship and providing an output related to the displacement.

In another embodiment the present invention provides a MEMS gauge for measuring mechanical strain or displacement in a structure having a base having a first end, a second end, the first end movable relative to the second end, the first end and the second end fixed to the structure; at least one array, each at least one array having at least one cantilever, each at least one deformable member (such as, a cantilever, for example) having a movable, distal end and a fixed, proximal end, the fixed proximal end fixed to one of the first end of the base and the second end of the base, the at least one deformable member in electrical communication with an electrical circuit, and a contact fixed to the other of the first end of the base and the second end of the base, the contact in communication with the electric circuit such that when the first end of the base moves relative to the second end of the base the contact engages the distal end of the at least one deformable member thereby completing electrical connection between the engagement member and the at least one cantilever.

In another embodiment the present invention provides an autonomous predictive system for measuring mechanical strain or displacement in a structure having a MEMS gauge adapted to provide an electronic signal in response to mechanical strain or displacement applied to the MEMS gauge, a processor in electrical communication with the MEMS gauge, the processor receiving the electronic signal and generating data output based on the electronic signal received from the MEMS gauge, an electronic database in electrical communication with the processor, the electronic database storing the data output received from the processor; and an electrical power source for providing electrical energy to at least one of: the processor, the MEMS gauge and the electronic database.

In another embodiment the present invention provides a method of manufacturing a MEMS displacement gauge or a strain gauge for measuring compressive and tensile strain in a structure, the gauge having a base having a first end, a second end, the first end movable relative to the second end, the first end and the second end fixed to the structure, at least one array, each at least one array having at least one deformable member, each at least one deformable member having a movable, distal end and a fixed, proximal end, the fixed proximal end fixed to one of the first end of the base and the second end of the base, the at least one deformable member in electrical communication with an electrical circuit, and an engagement member fixed to the other of the first end of the base and the second end of the base, the engagement member in communication with the electric circuit such that when the first end of the base moves relative to the second end of the base the engagement member engages the distal end of the at least one deformable member thereby completing electrical connection between the engagement member and the at least one deformable member.

In another embodiment the present invention provides a method of measuring compressive and tensile strain in a structure with a MEMS gauge, the method having the steps of receiving an electrical output from a MEMS gauge, processing the electrical output to result in strain data and storing the strain data in an electronic database. In at least one embodiment, it is contemplated that the electrical output is output in discrete levels.

In another embodiment the present invention provides a MEMS displacement sensor for measuring mechanical strain or displacement in a structure comprising a base having a first longitudinally extending side, a second longitudinally extending side, a first end mounted to the support structure being tested and a second end mounted to the support structure, the second end longitudinally translatable relative to the first end, a first inwardly projecting slot located in the first longitudinally extending side, a second inwardly projecting slot located in the second longitudinally extending side, the first inwardly projecting slot located across and adjacent from the second inwardly projecting slot, the first inwardly projecting slot and the second inwardly projecting slot located adjacent to one of the first end and the second end, an internal lateral slot laterally extending across the body from a first position inwardly adjacent the first longitudinally extending side to a second position inwardly adjacent the second longitudinally extending side, the internal lateral slot located adjacent to the other of the first end and the second end, a first internal longitudinally extending slot extending between the first inwardly projecting slot and the internal lateral slot, the first internal longitudinally extending slot oriented parallel to and adjacent from the first longitudinally extending side, the first internal longitudinally extending slot having a first inwardly projecting component and a second inwardly projecting component each communicating with a longitudinally extending component; a second internal longitudinally extending slot extending between the second inwardly projecting slot and the internal lateral slot, the second internal longitudinally extending slot oriented parallel to the first internal longitudinally extending slot and oriented parallel to and adjacent from the second longitudinally extending side, the second internal longitudinally extending slot having a first inwardly projecting component and a second inwardly projecting component each communicating with a longitudinally extending component, an upwardly projecting central pin mounted to an upper surface of the base, a substrate fixed to an upper surface of the base, the substrate having a central hole adapted to loosely receive the upwardly projecting central pin, said substrate having a central flexure component fixed to the substrate, the central flexure component having a central hole aligned with the central hole of the substrate and adapted to snugly receive the upwardly projecting central pin, the central flexure component having a first outer surface adjacent the central hole and a second outer surface adjacent the central hole, an array having a first plurality of deformable electro conductive micro members, each of said first plurality of deformable electro conductive nano or micro members transversely extending and oriented generally perpendicular to a longitudinal axis of said body and arranged in a longitudinally spaced out manner; each of the first plurality of deformable electro conductive micro members having a fixed first end fixed to the substrate and a movable second end, the movable second end translatable in a generally longitudinal direction; a second plurality of deformable electro conductive micro members, each of the second plurality of deformable electro conductive micro members transversely extending and oriented generally perpendicular to a longitudinal axis of the body and arranged in a longitudinally spaced out manner; each of the second plurality of deformable electro conductive micro members having a fixed first end and a movable second end, the movable second end translatable in a generally longitudinal direction such that when the body is placed under tension the pin moves relative to the substrate in a direction away from the internal lateral slot and engages the central flexure component such that a first outer surface of the central flexure component engages the movable second end of an adjacent deformable electro conductive micro plate of one of the first plurality of deformable electro conductive micro members and the second plurality of deformable electro conductive micro members such that when the body is placed under compression the pin moves relative to the substrate in a direction towards the internal lateral slot and engages the central flexure component such that a second outer surface of the central flexure component engages the movable second end of an adjacent deformable electro conductive micro plate of the other of the first plurality of deformable electro conductive micro members and the second plurality of deformable electro conductive micro members.

Advantageous Effects of Invention

Advantageous Effects

The invention provides a cost effective, autonomous and extremely low power consumption strain history monitoring system capable of recording, processing and storing compressed data on the entire history of meaningful stress/strain event over many years of operation. Its small size and simplicity of installation makes it possible to use the invention in variety of applications and industries helping to achieve better assessment of structural integrity, predict or estimate fatigue life of a structure and harmonize maintenance, repair and overhaul process thus reducing its costs and allowing for improved safety.

BRIEF DESCRIPTION OF DRAWINGS

Description of Drawings

Figure 1:
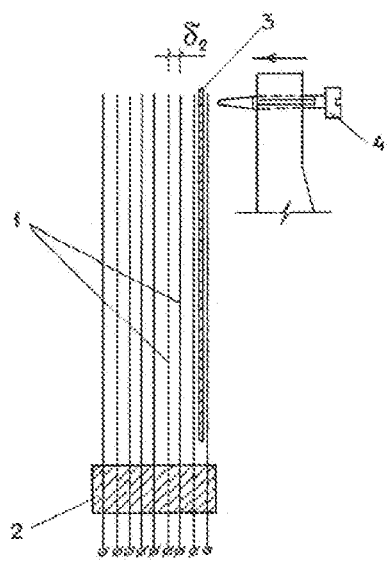
Figure 2:
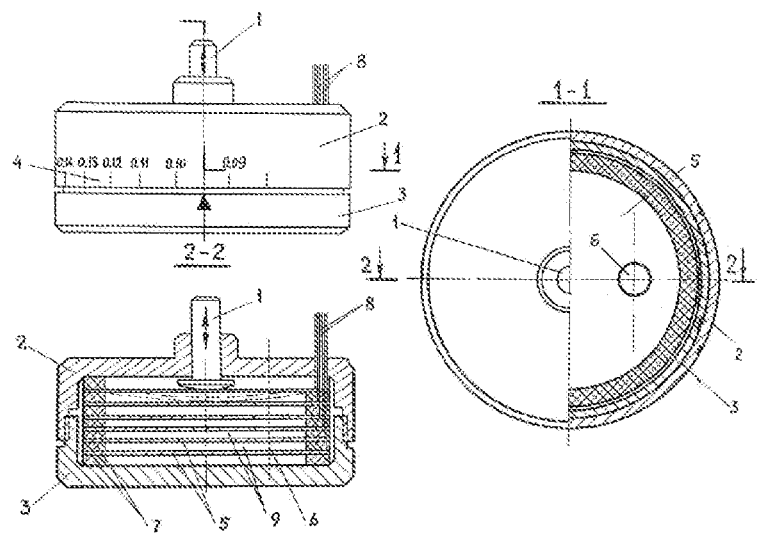
Figure 7:
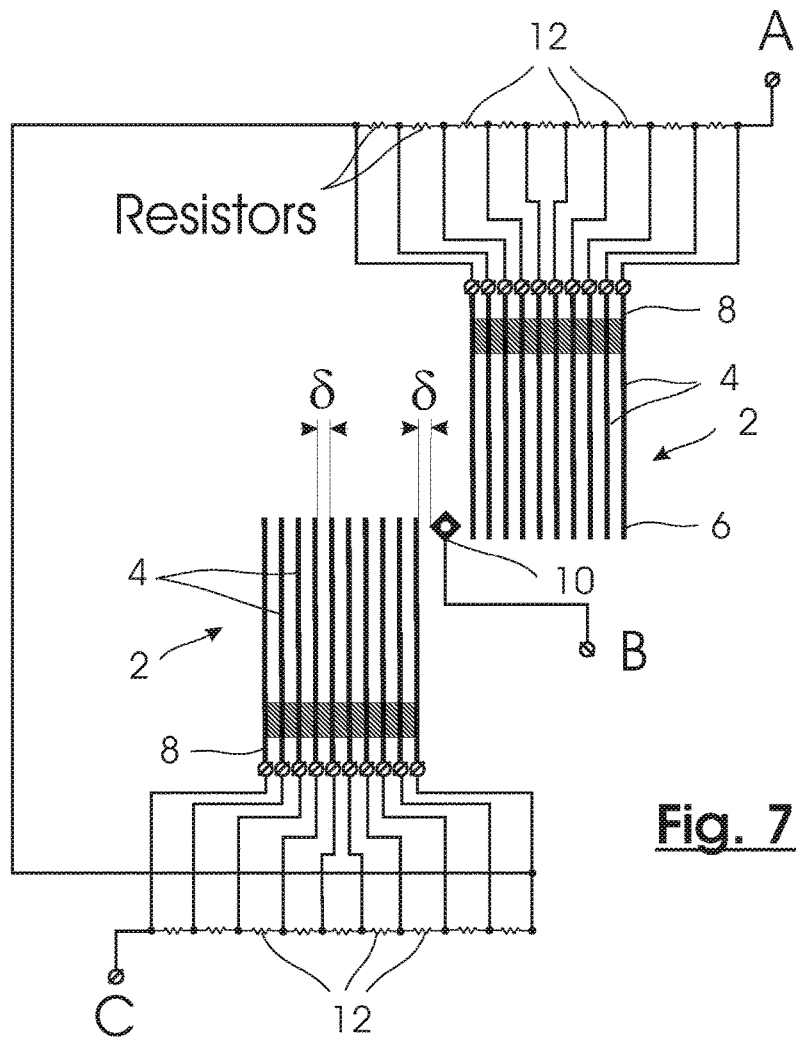
Figure 8:
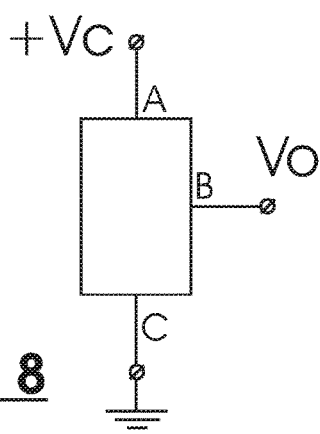
Figure 9:
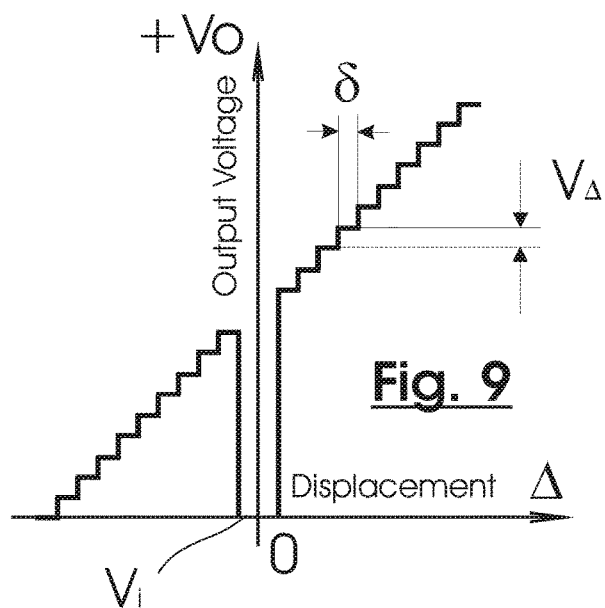
Figure 13:
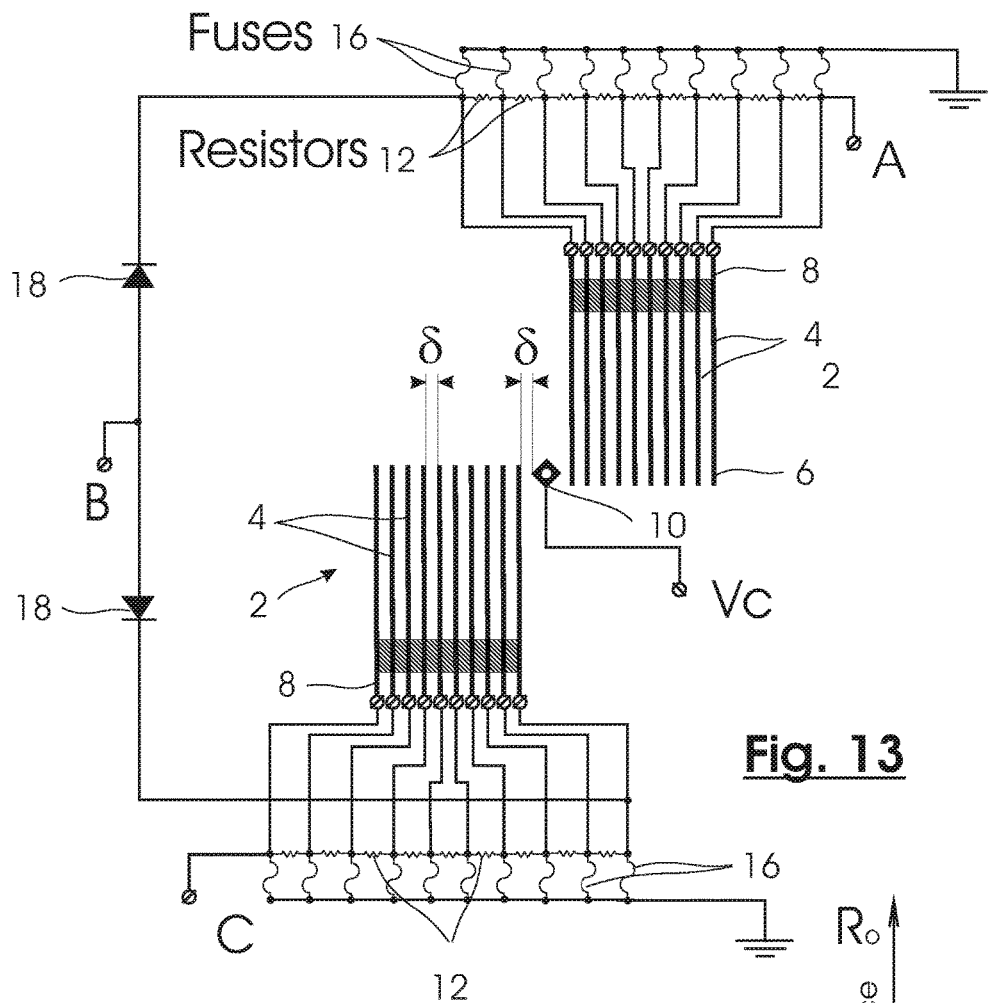
Figure 14:
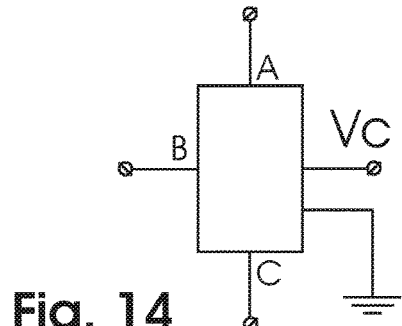
Figure 15:
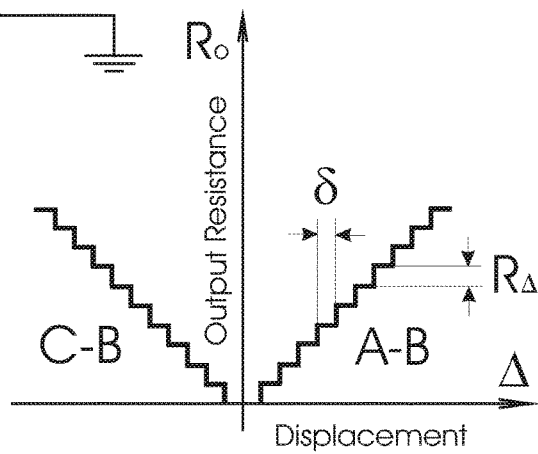
Figure 16:
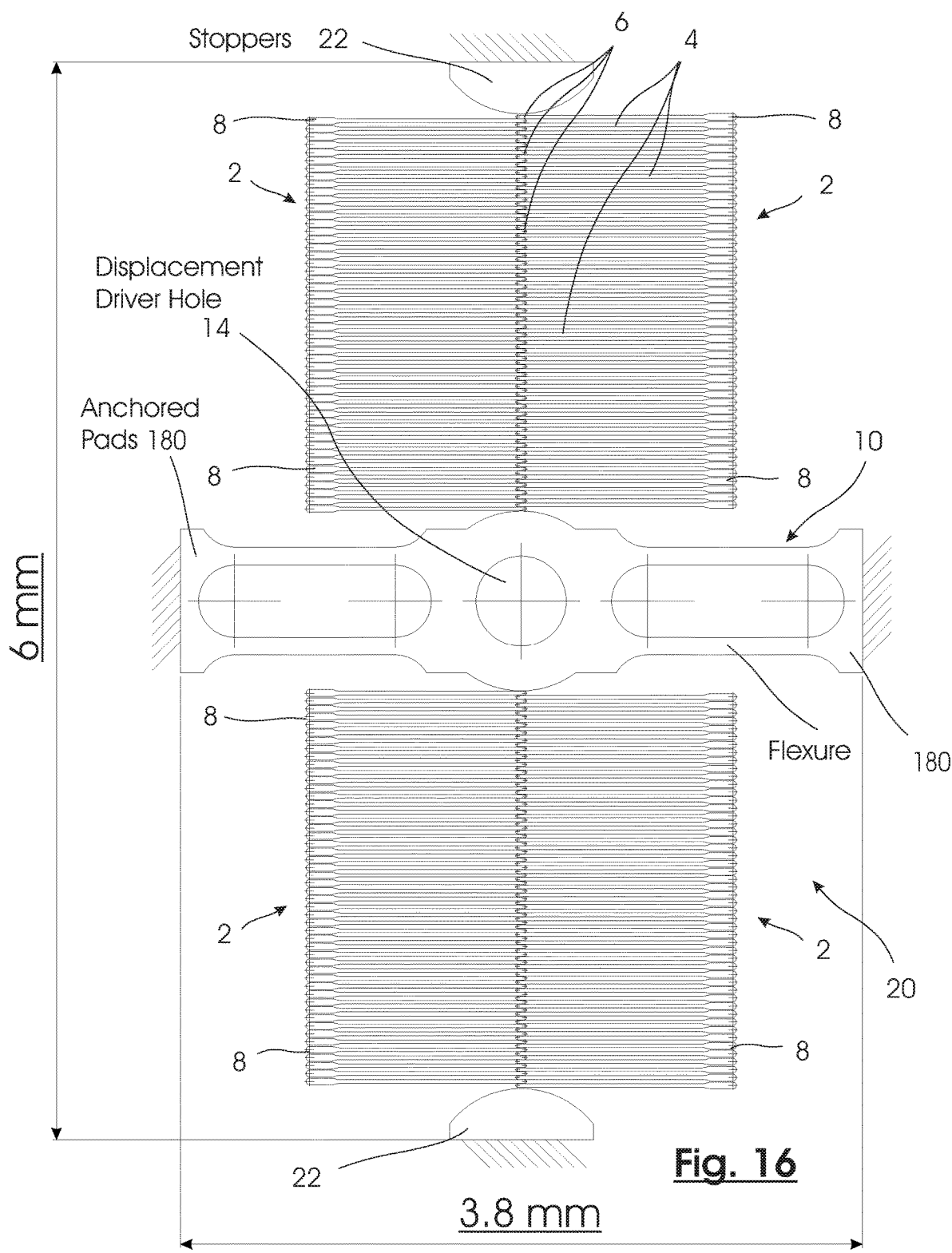
Figure 17:
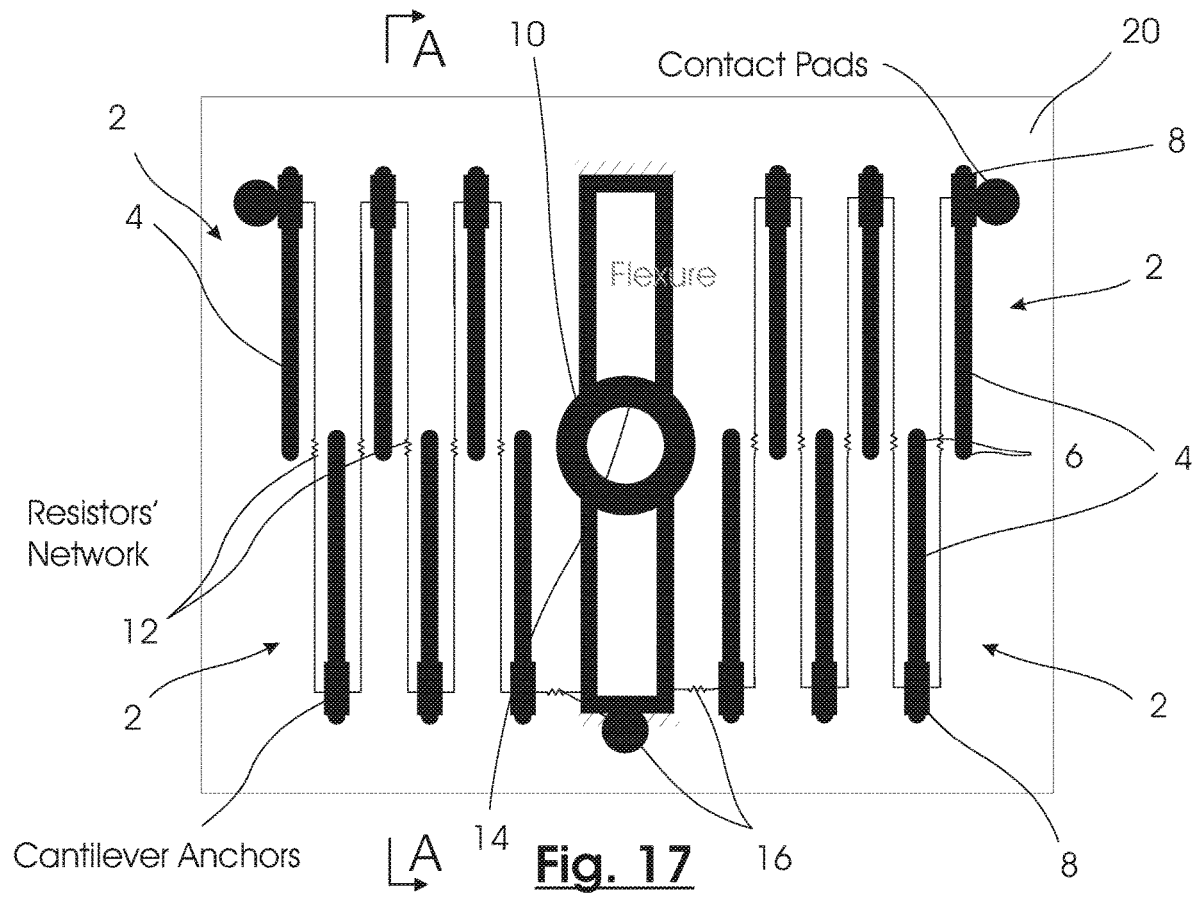
Figure 18:
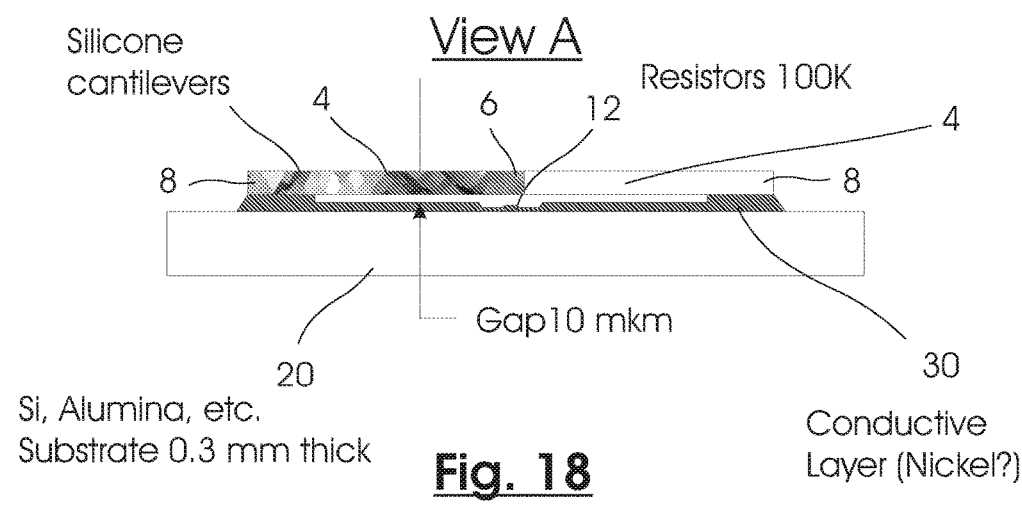
Figure 19:
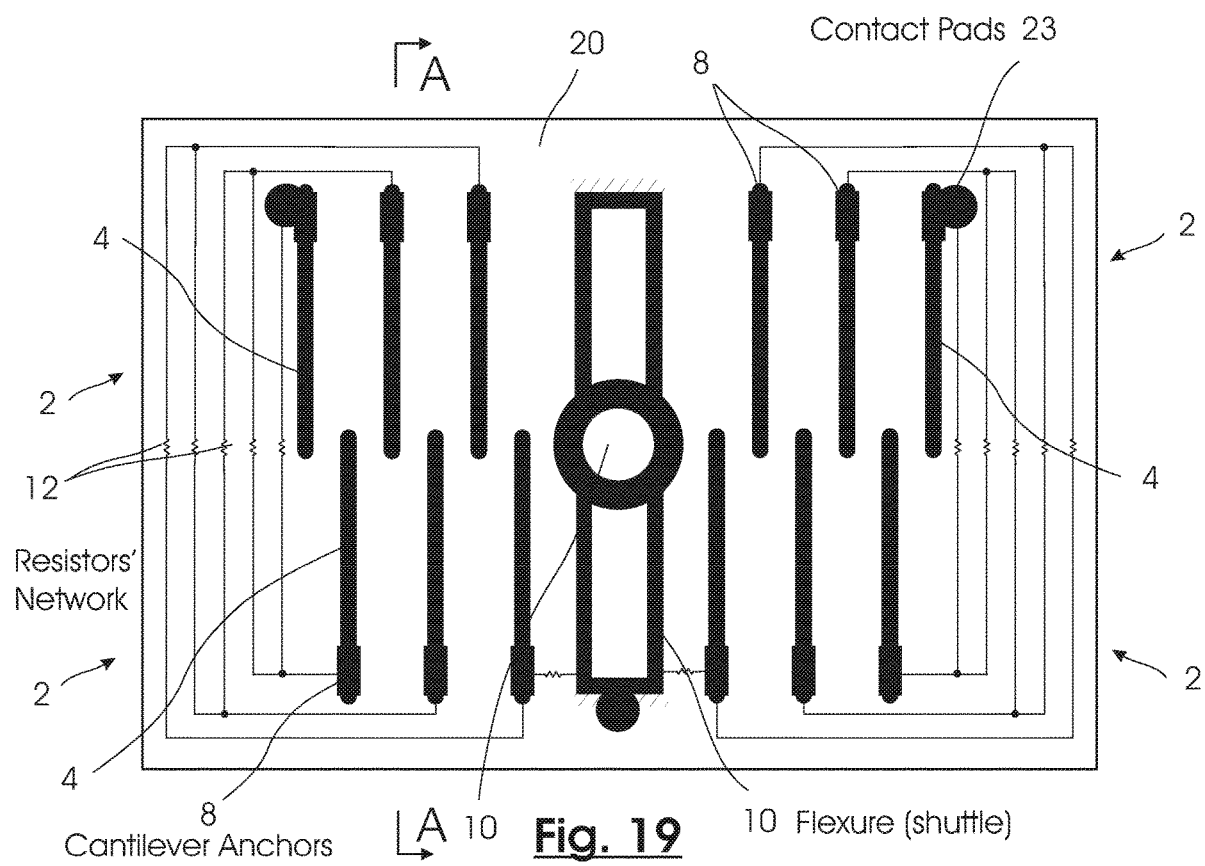
Figure 20:
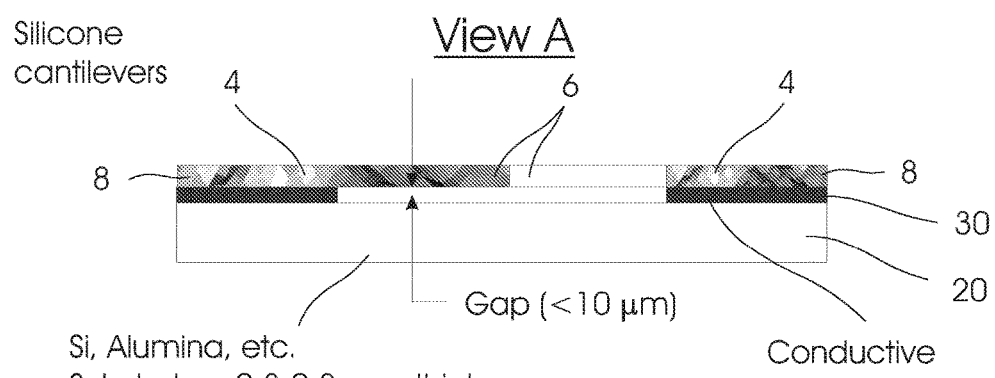
Figure 21:
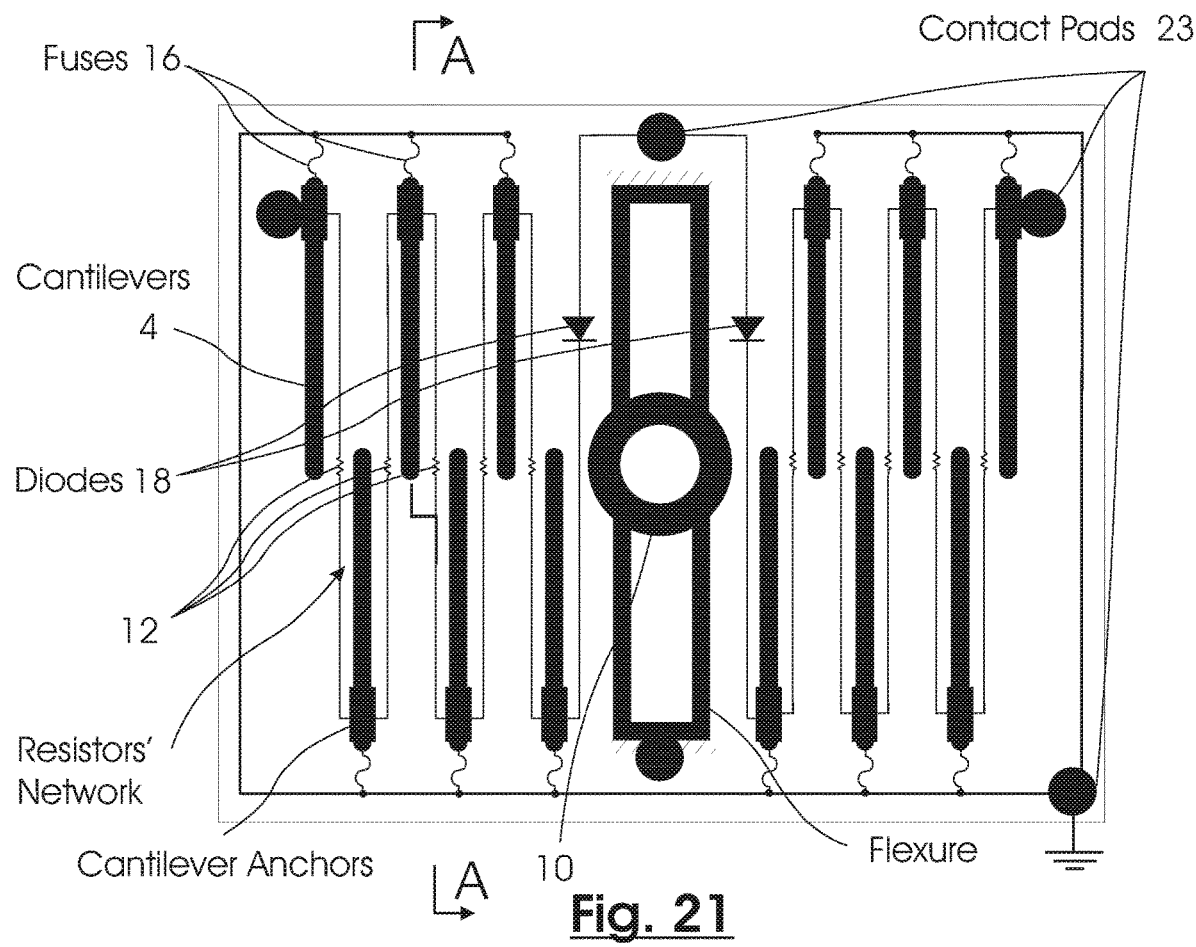
Figure 22:
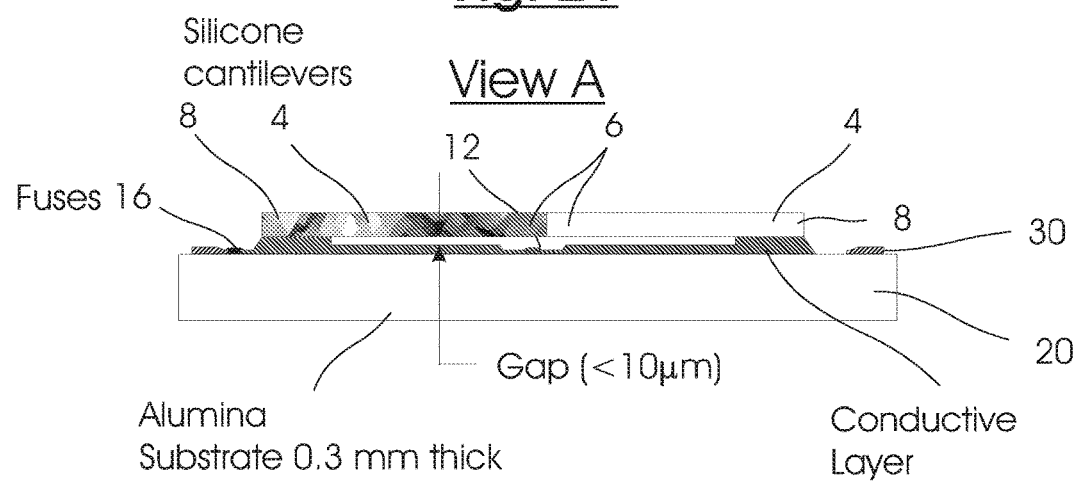
Figure 23:
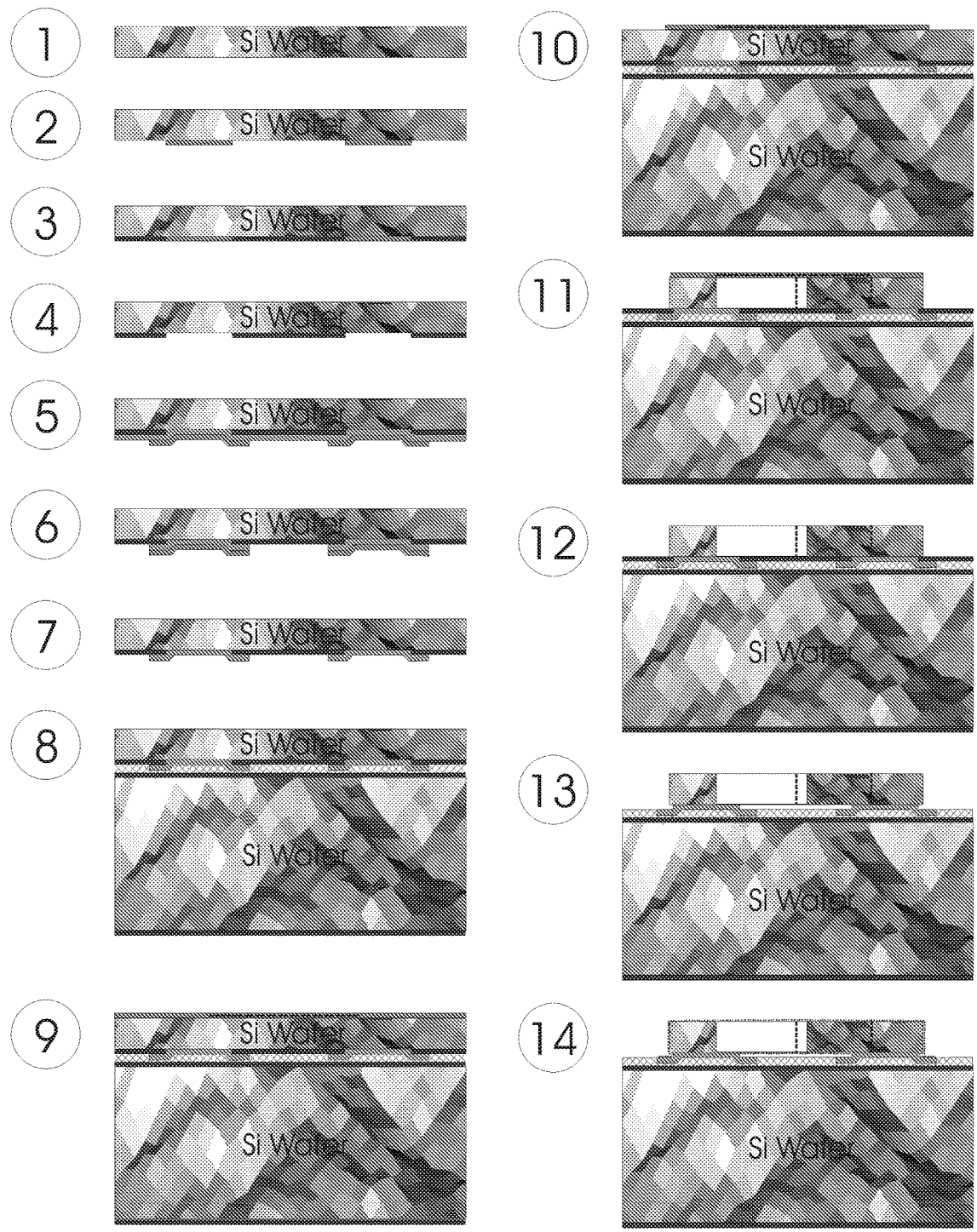
Figure 29:
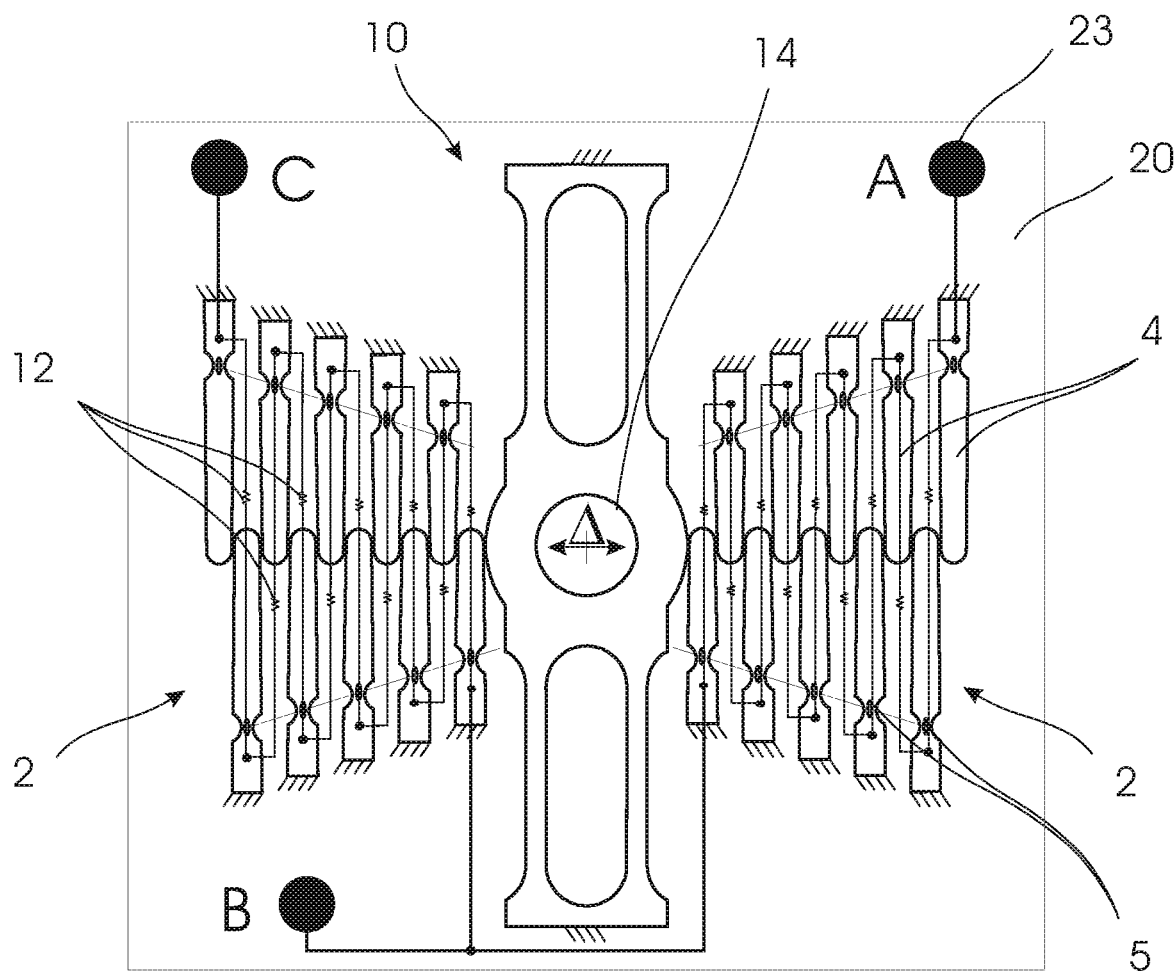
Figure 30:
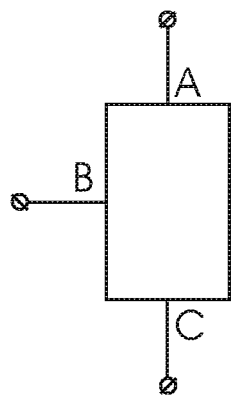
Figure 31:
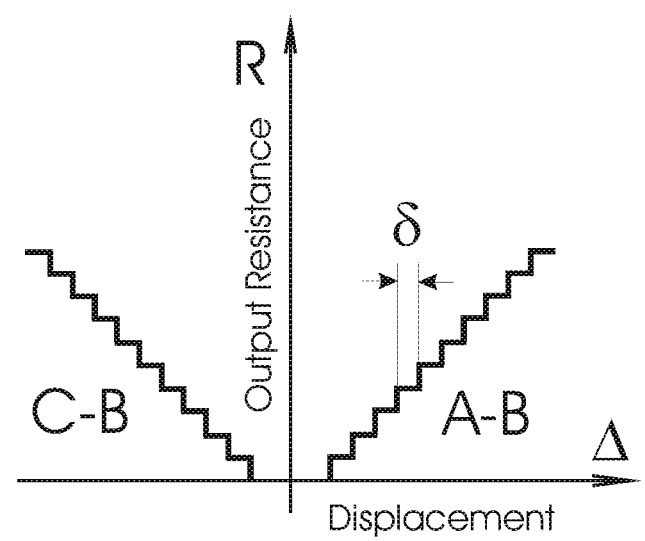
Figure 32:
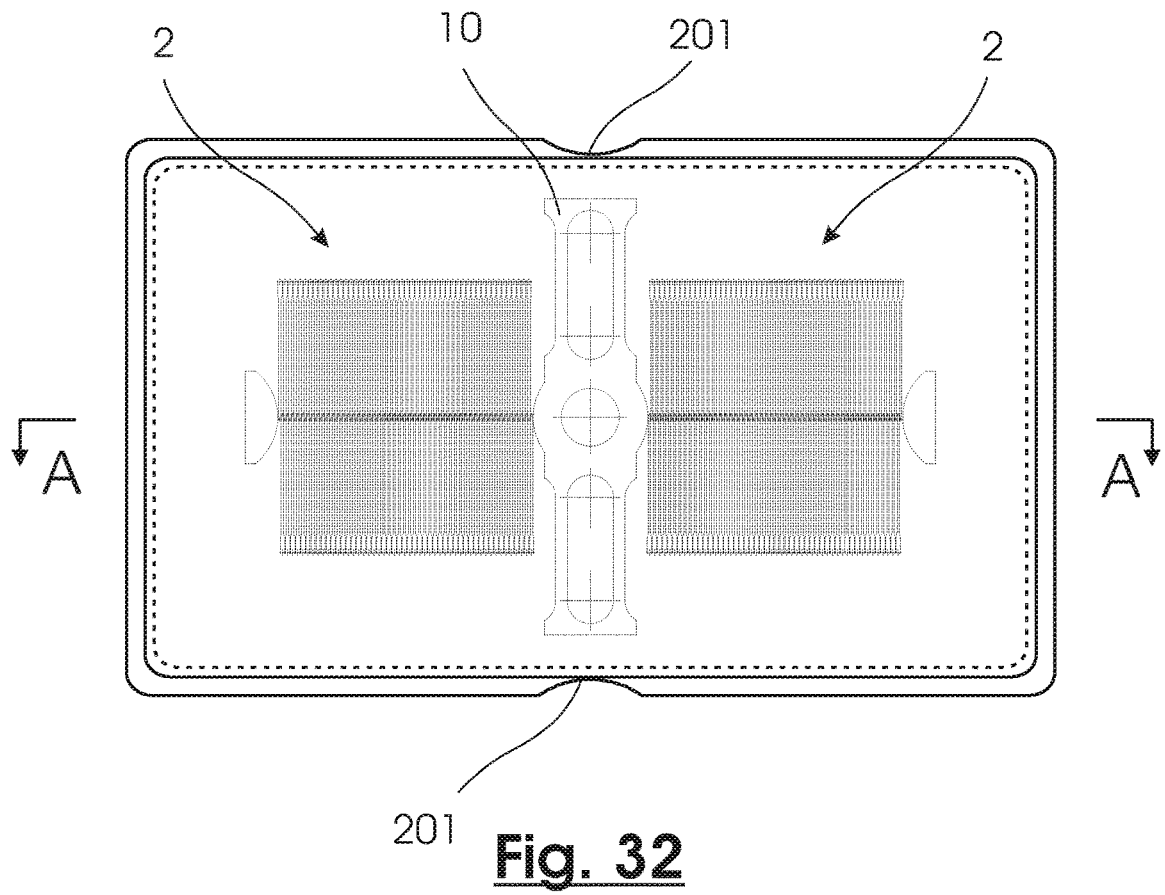
Figure 33:
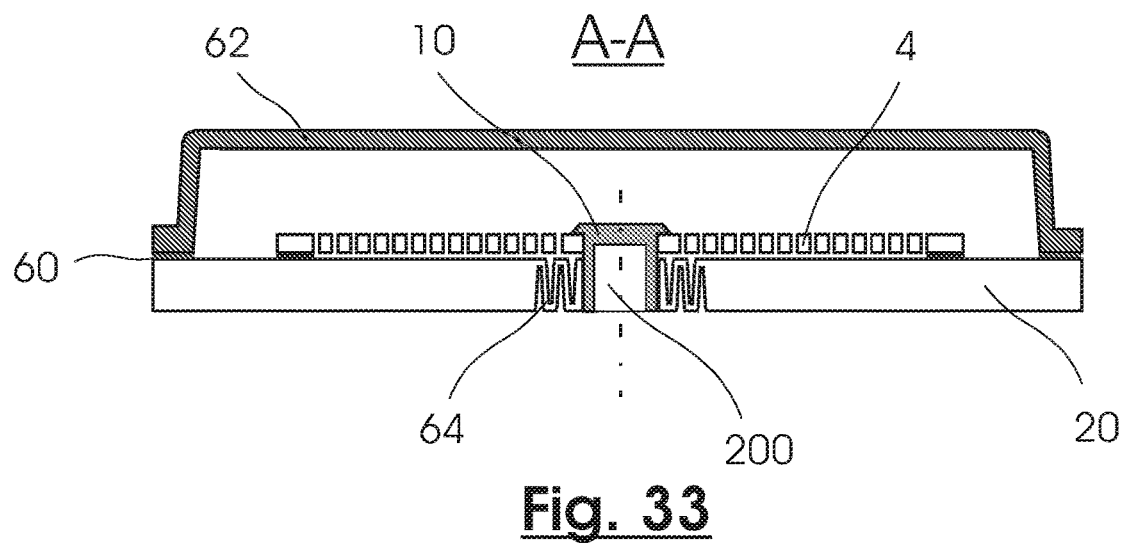
Figure 34:
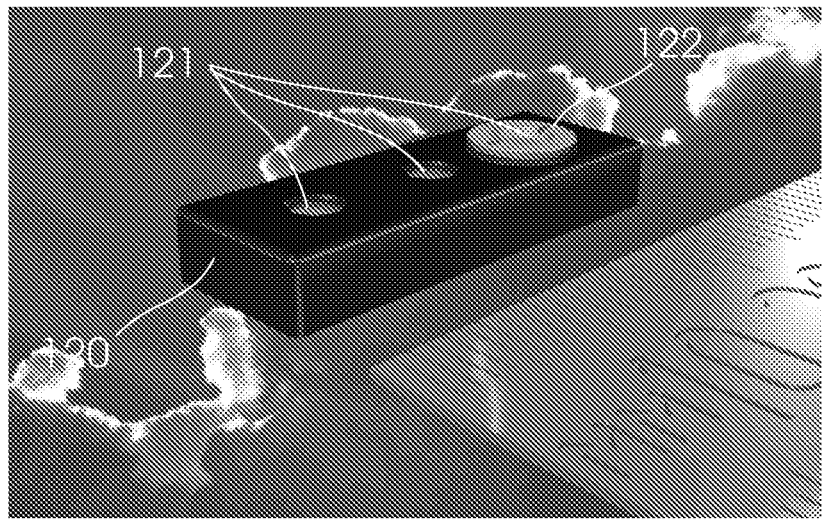
Figure 35:
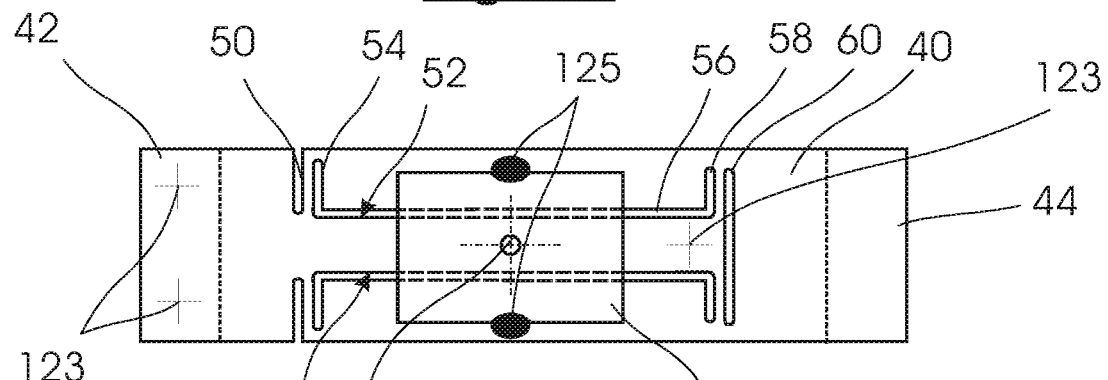
Figure 36:
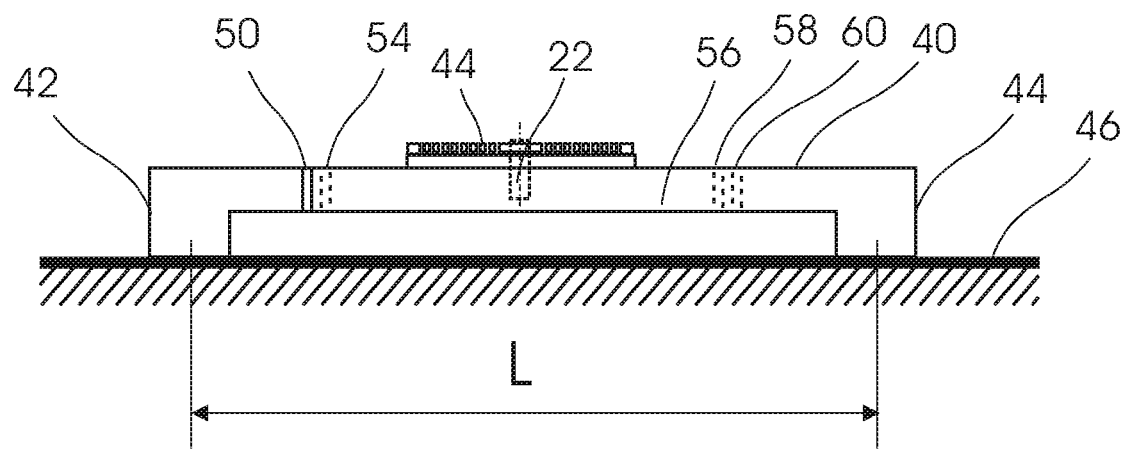
Figure 37:
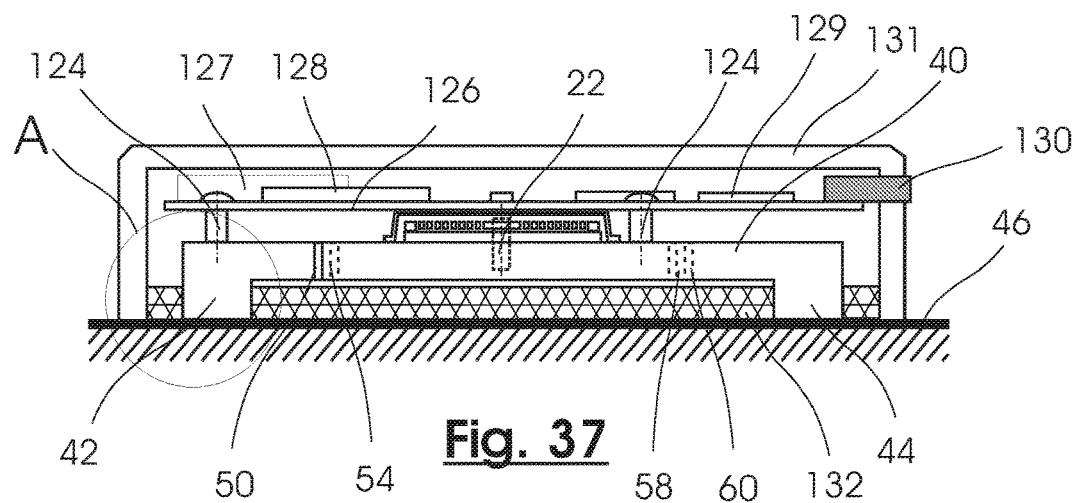
Figure 38:
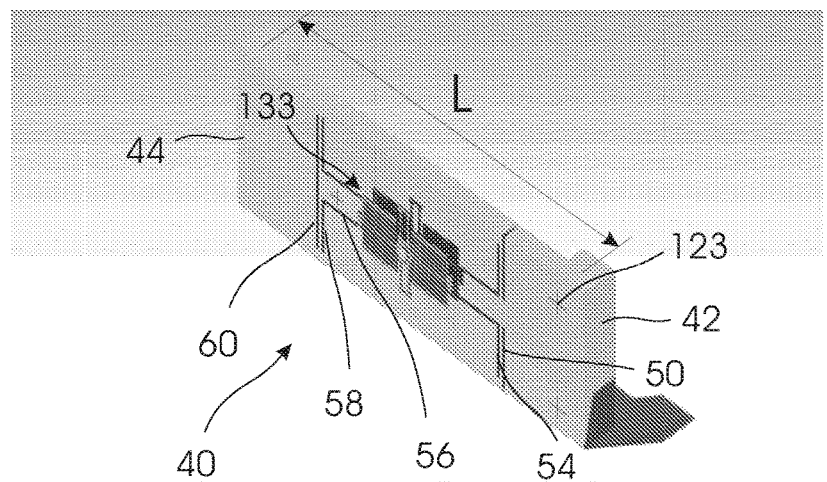
Figures 39, 40, 41:
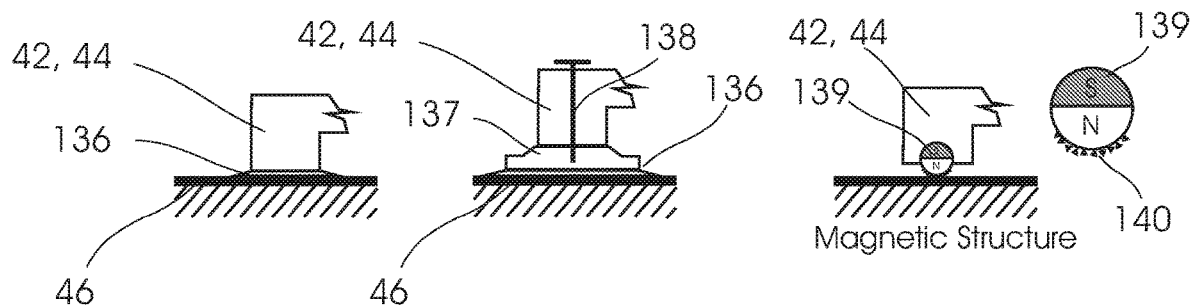
Figure 42:
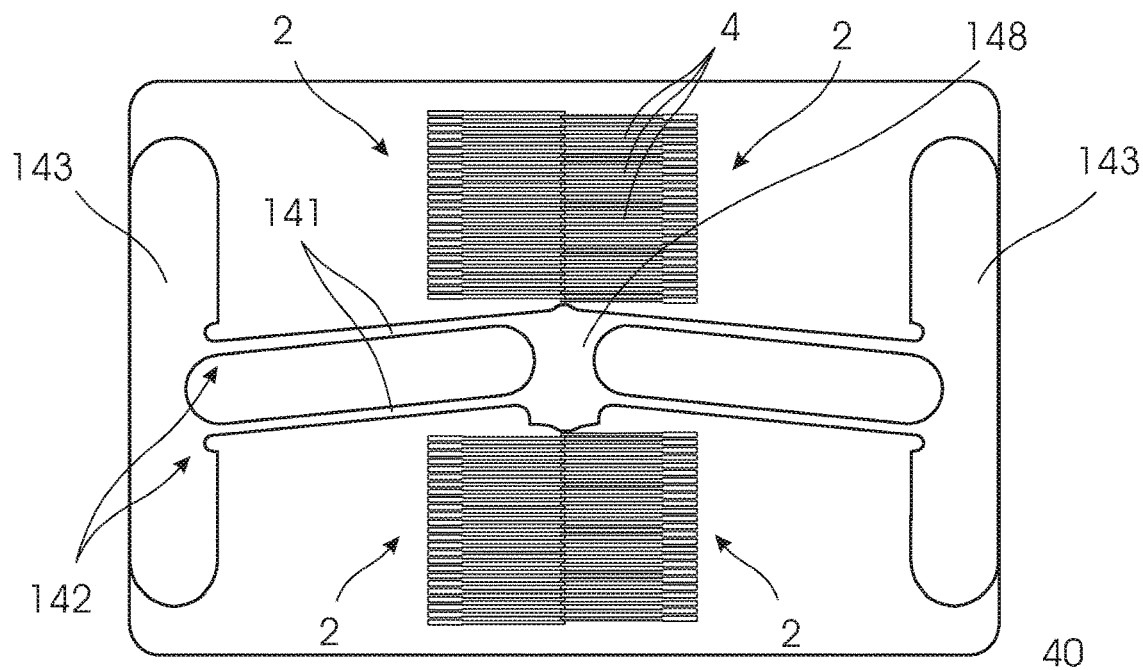
Figure 43:
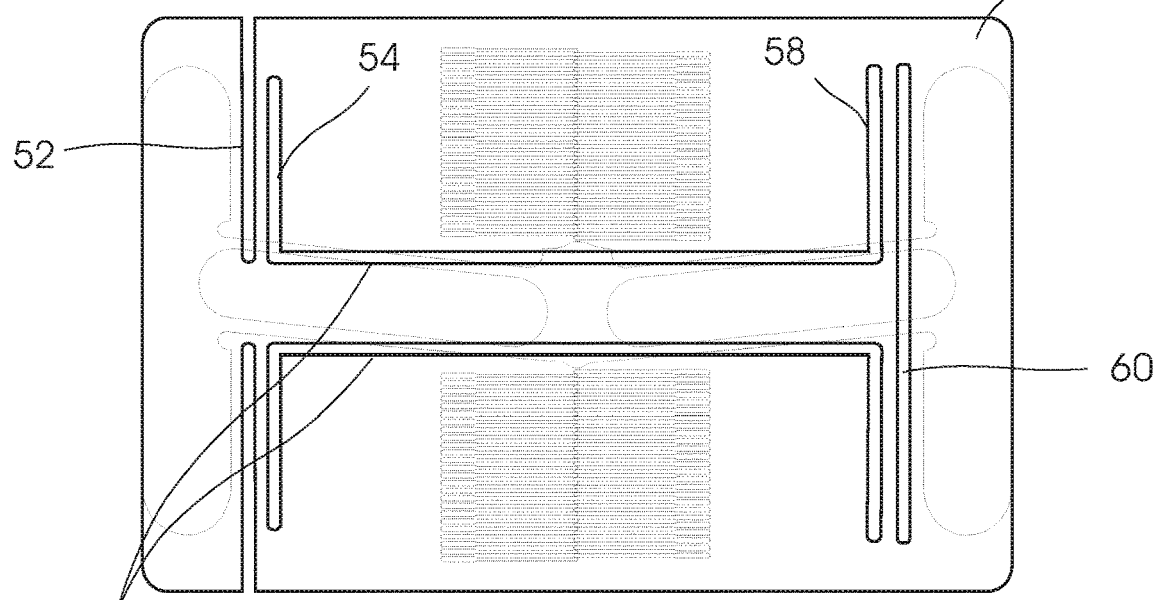
Figure 44:
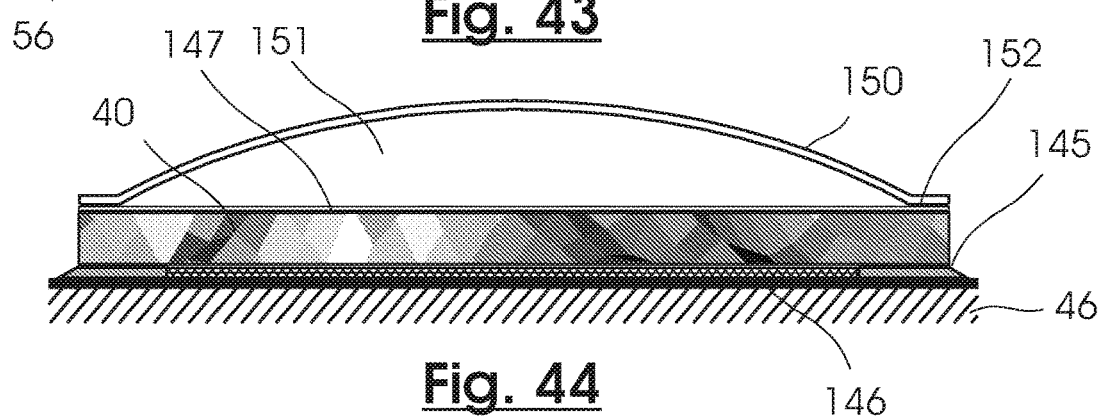
Figure 45:
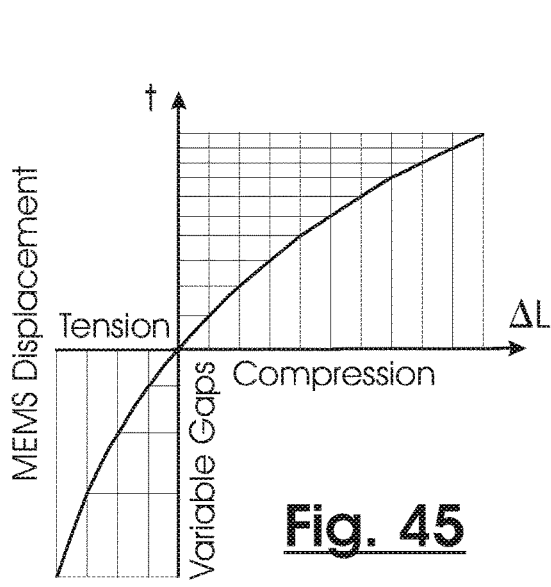
Figure 46:
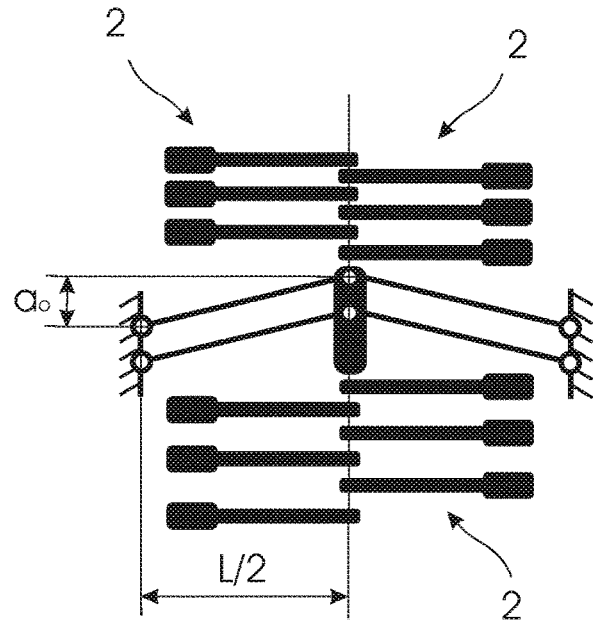
Figure 47:
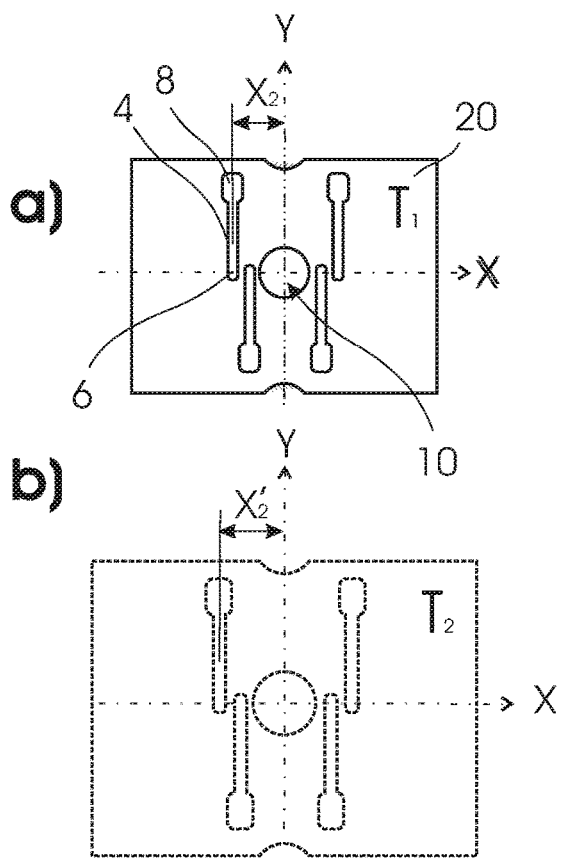
Figure 48:
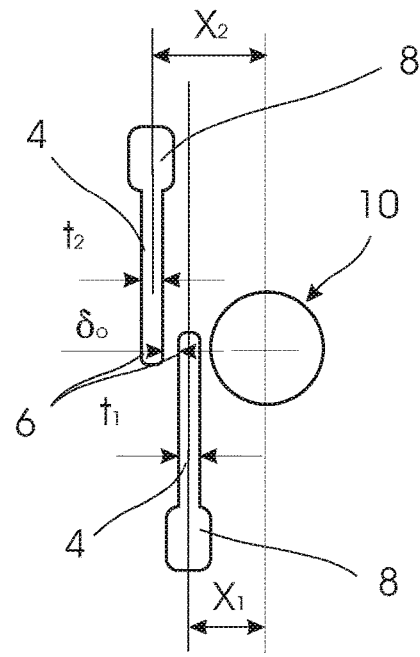
Figure 49:
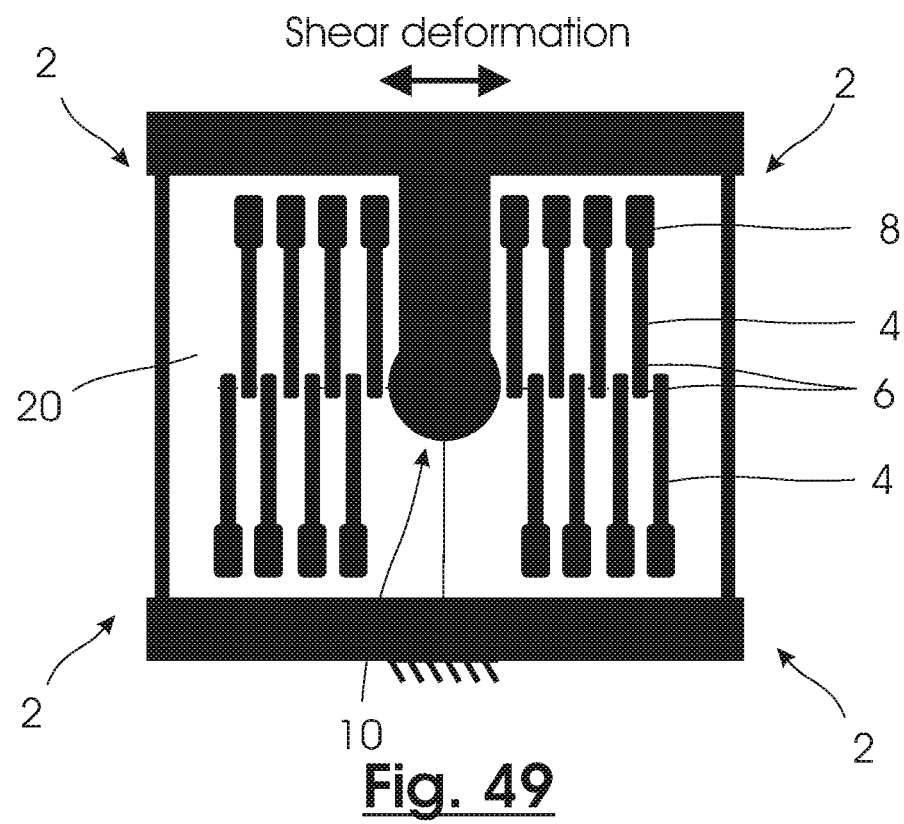
Figure 50:
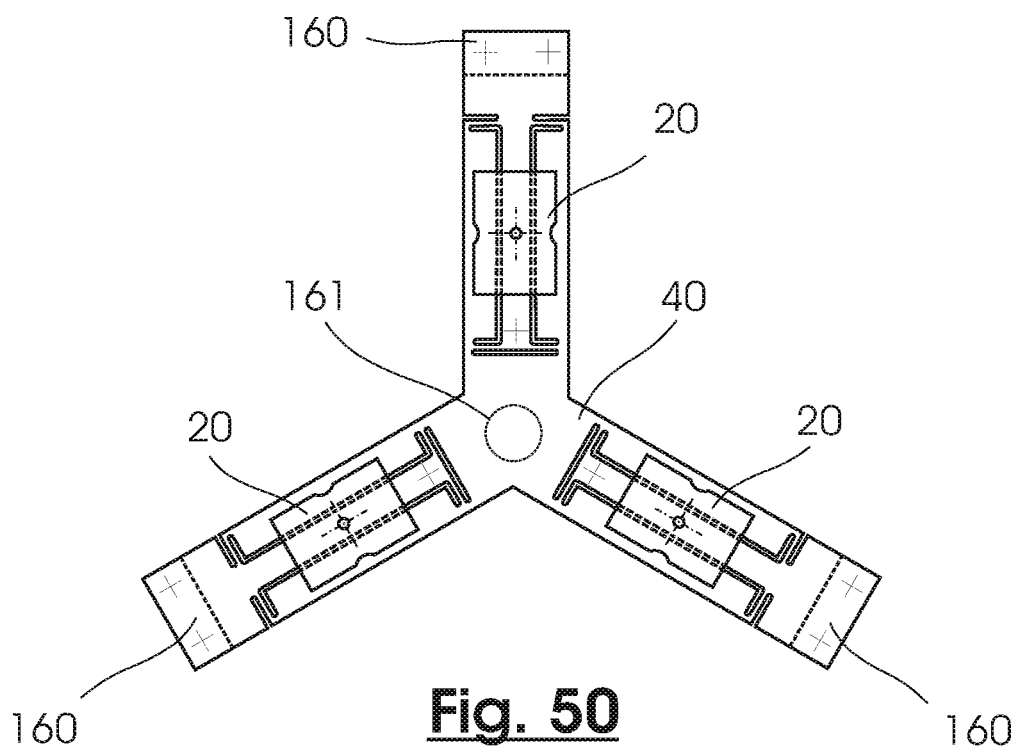
Figures 51, 52:
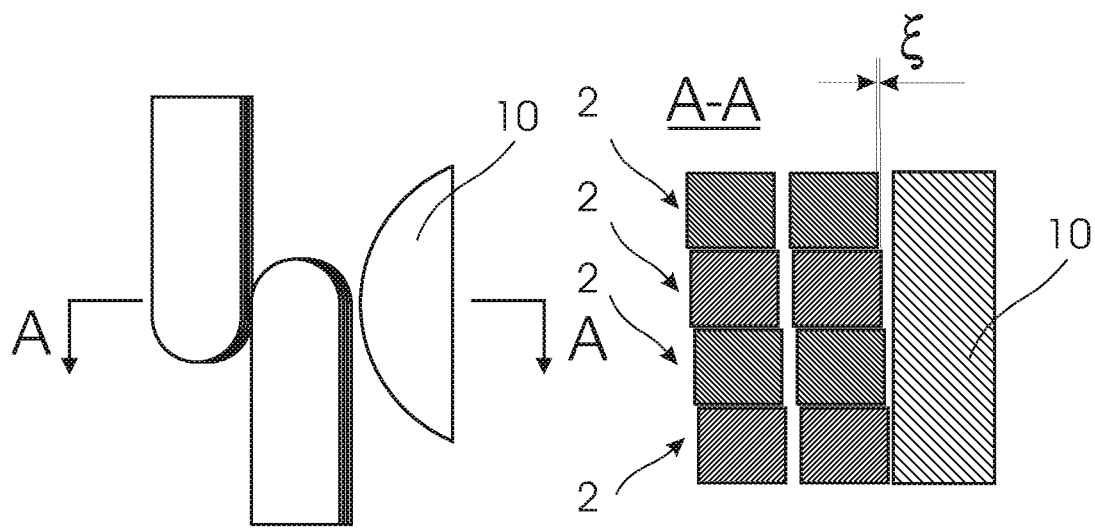
Figures 53, 54:
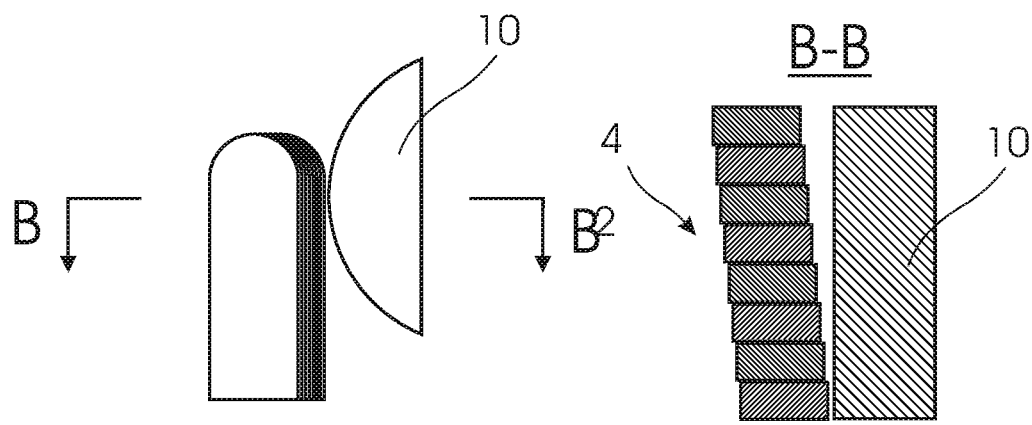
Figures 55, 56:
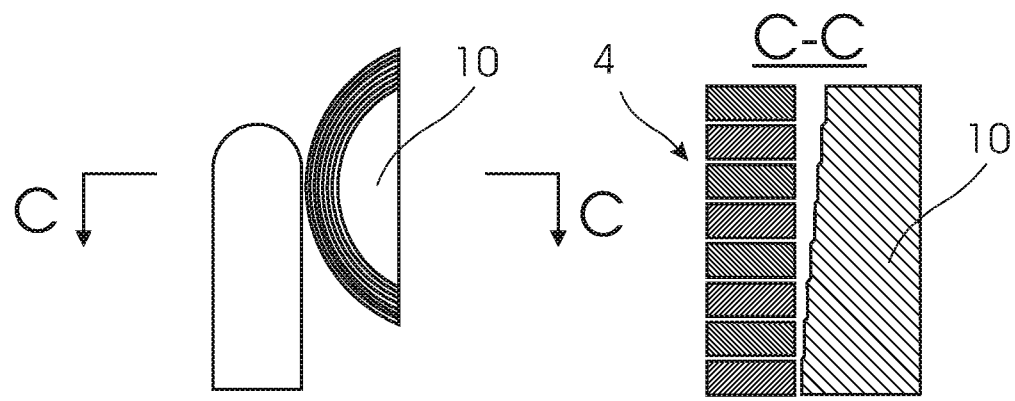
Figure 57:
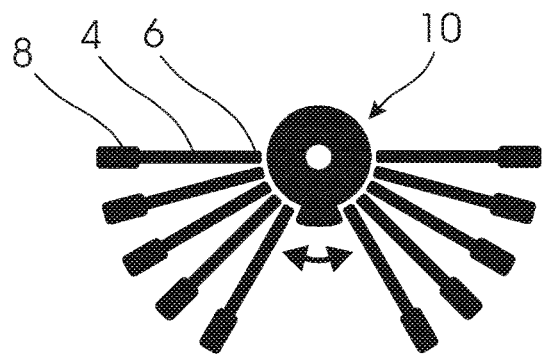
Figure 58:
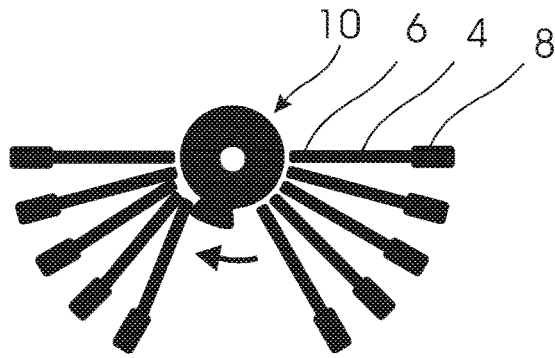
Figure 59:
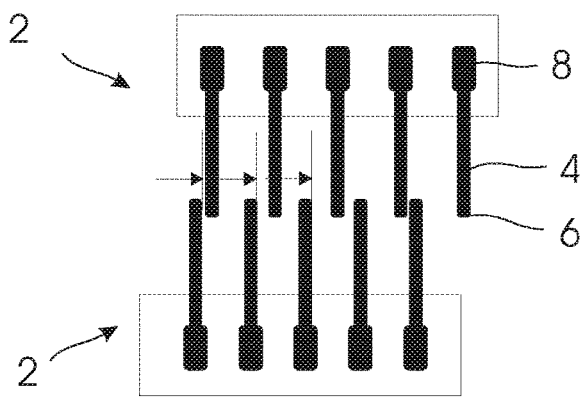
Figure 60:
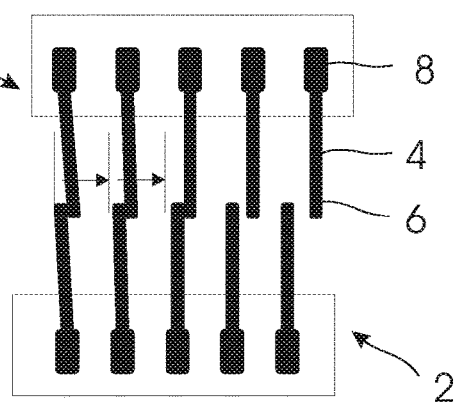
Figure 61:
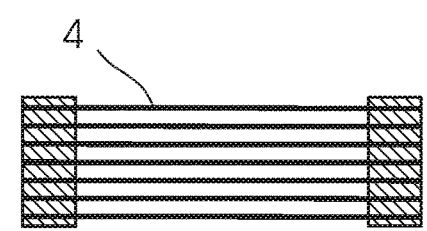
Figure 62:
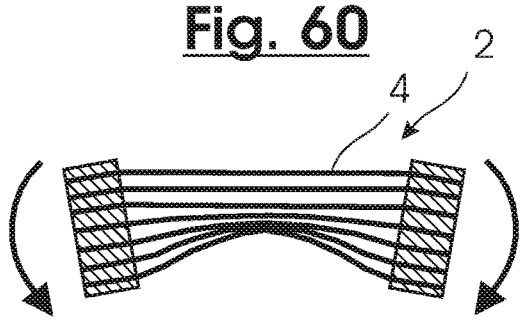
Figure 63:
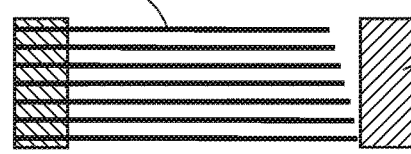
Figure 64:
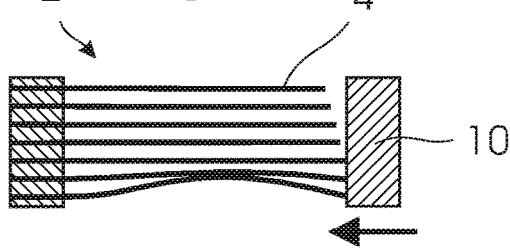
Figure 65:
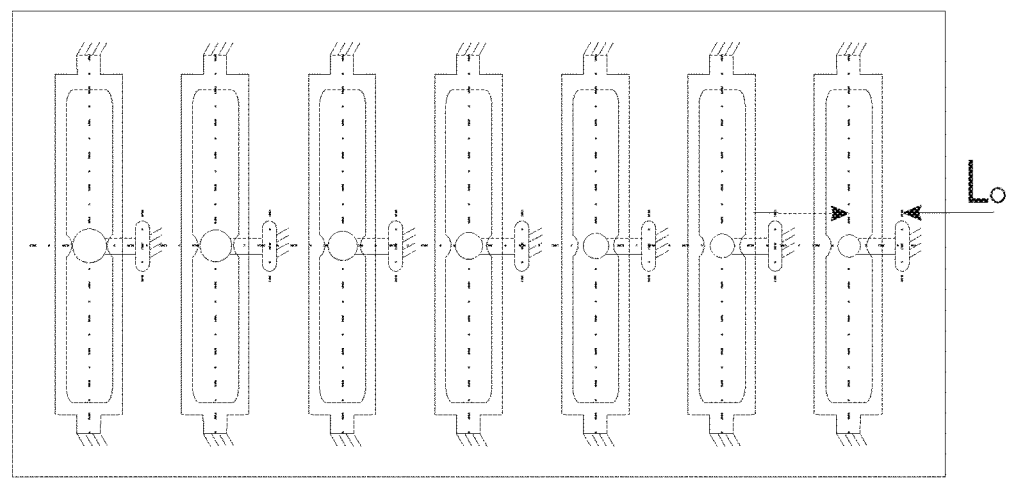
Figure 66:
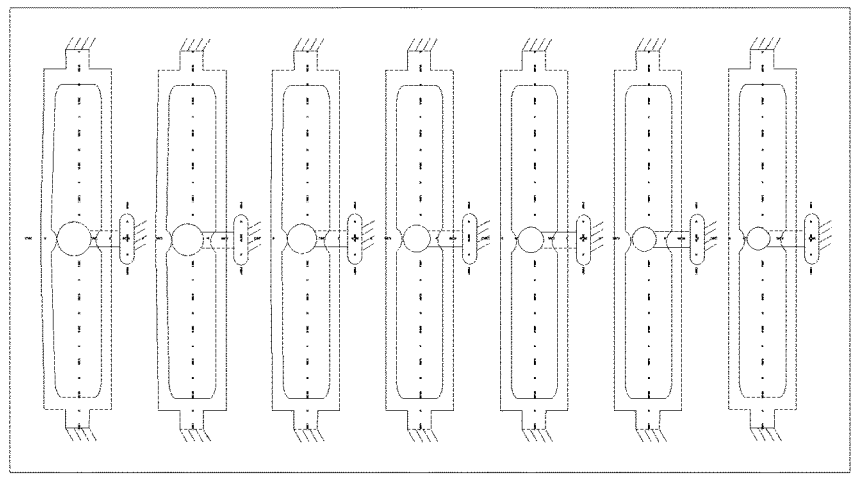
Figure 67:
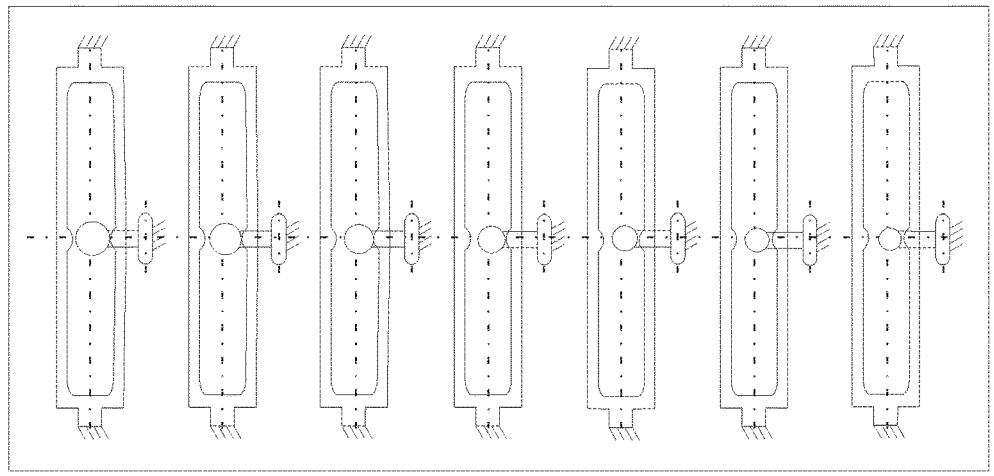
Figure 68:
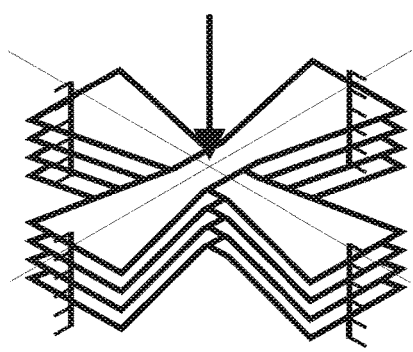
Figure 69:
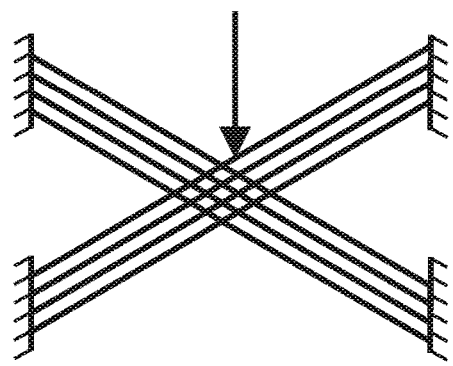
Figure 70:
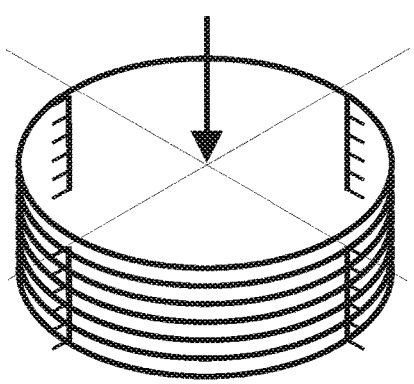
Figure 71:
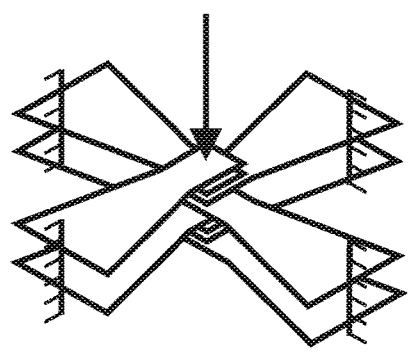
Figure 72:
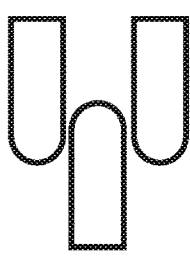
Figure 73:
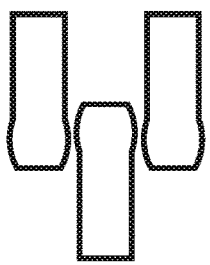
Figure 74:
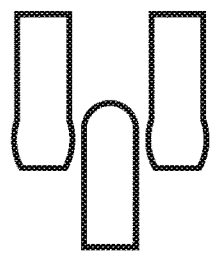
Figure 75:
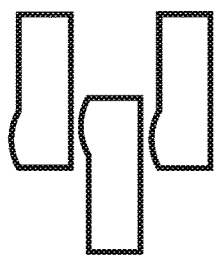
Figures 76, 77, 78:
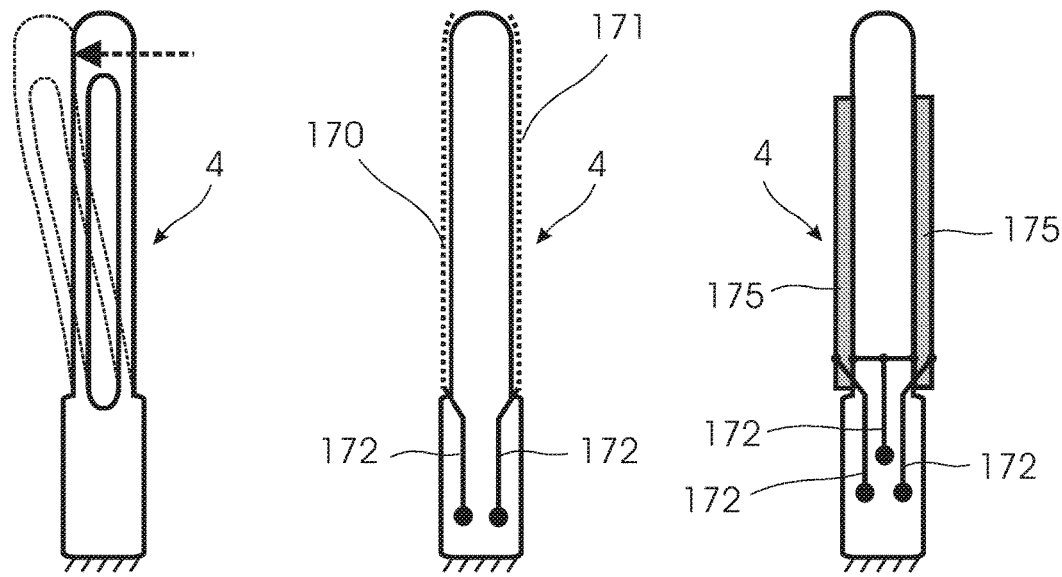
Figures 79, 80, 81:
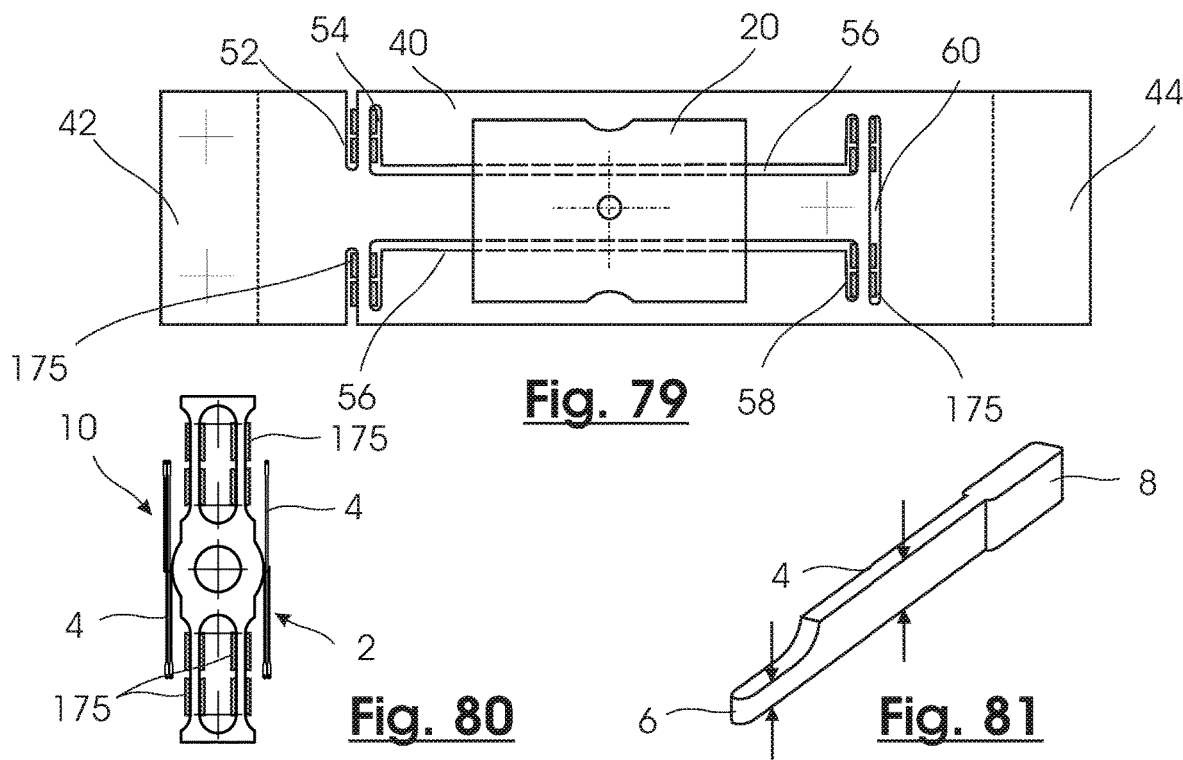
Figure 82:
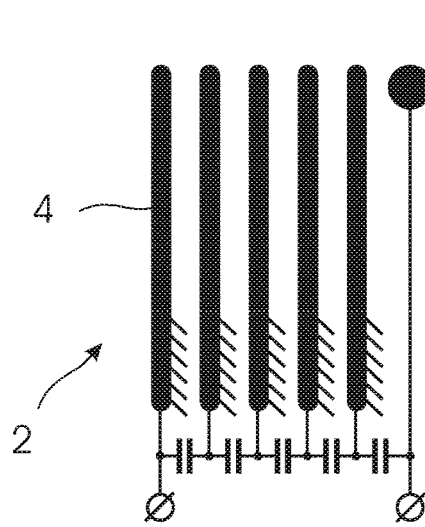
Figure 84:
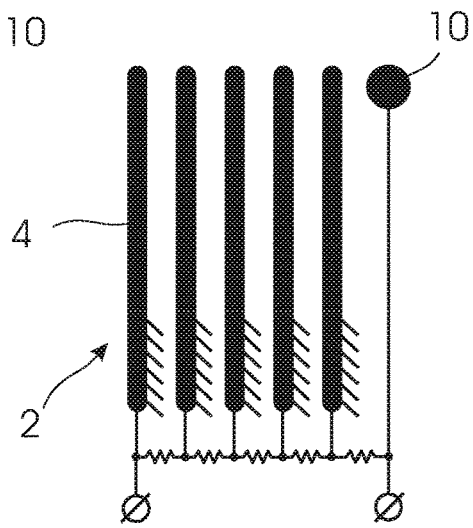
Figure 83:
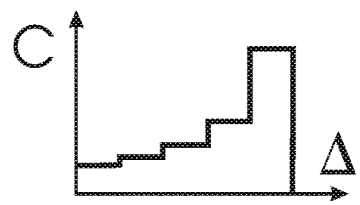
Figure 85:
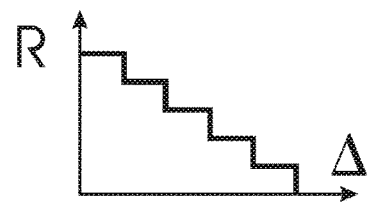
Figure 86:
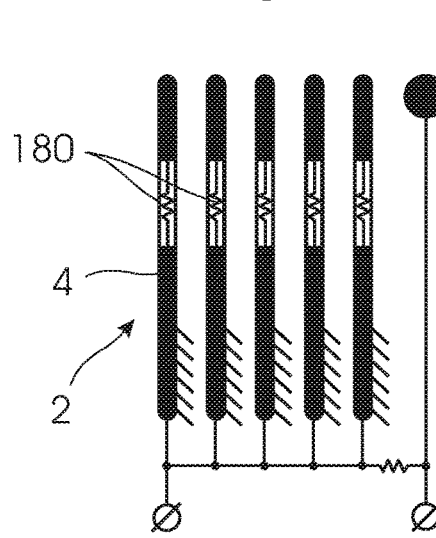
Figure 88:
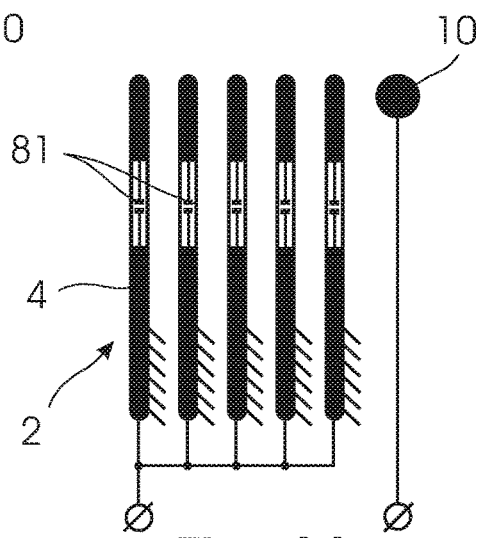
Figure 87:
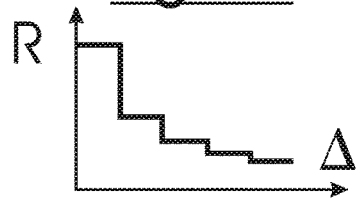
Figure 89:
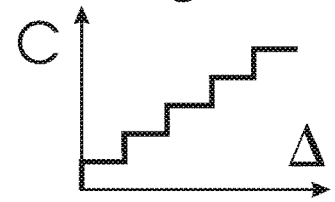
Figure 95:
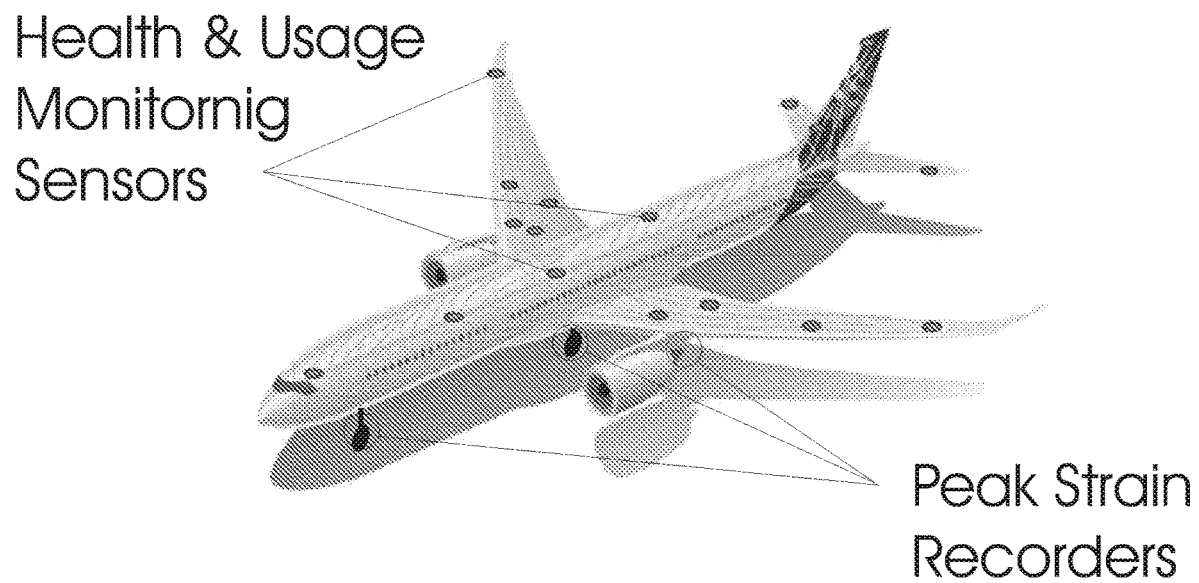
Figure 96:
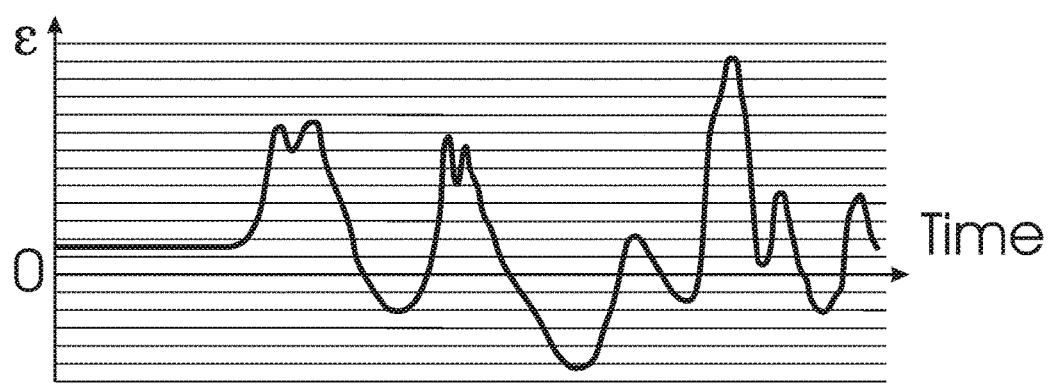
Figure 97:
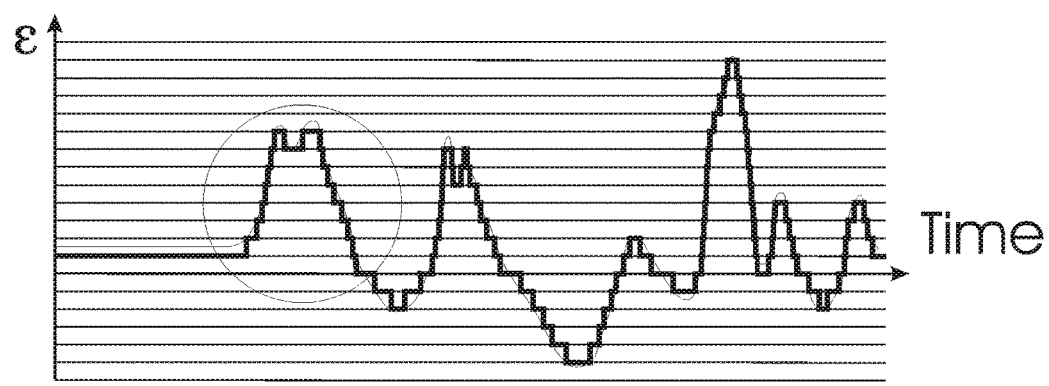
Figure 98:
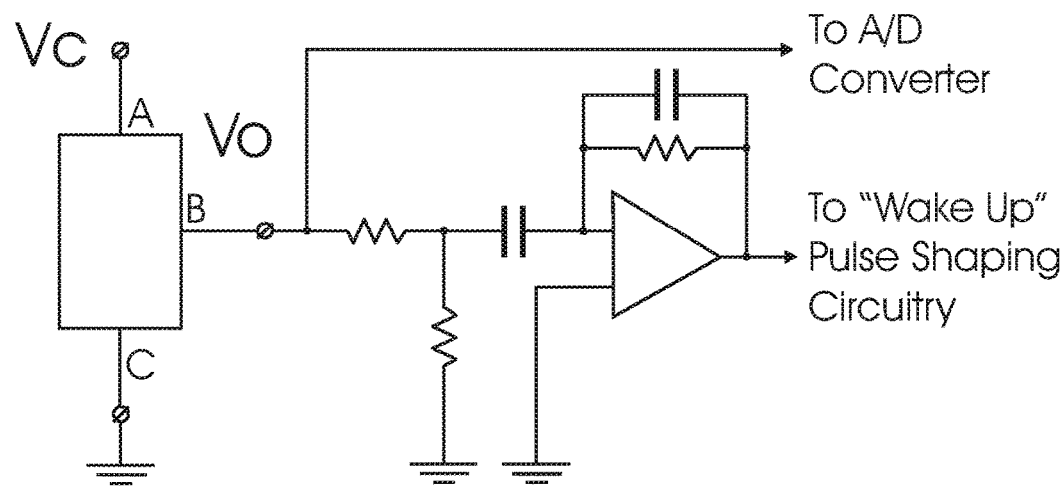
Figure 99:
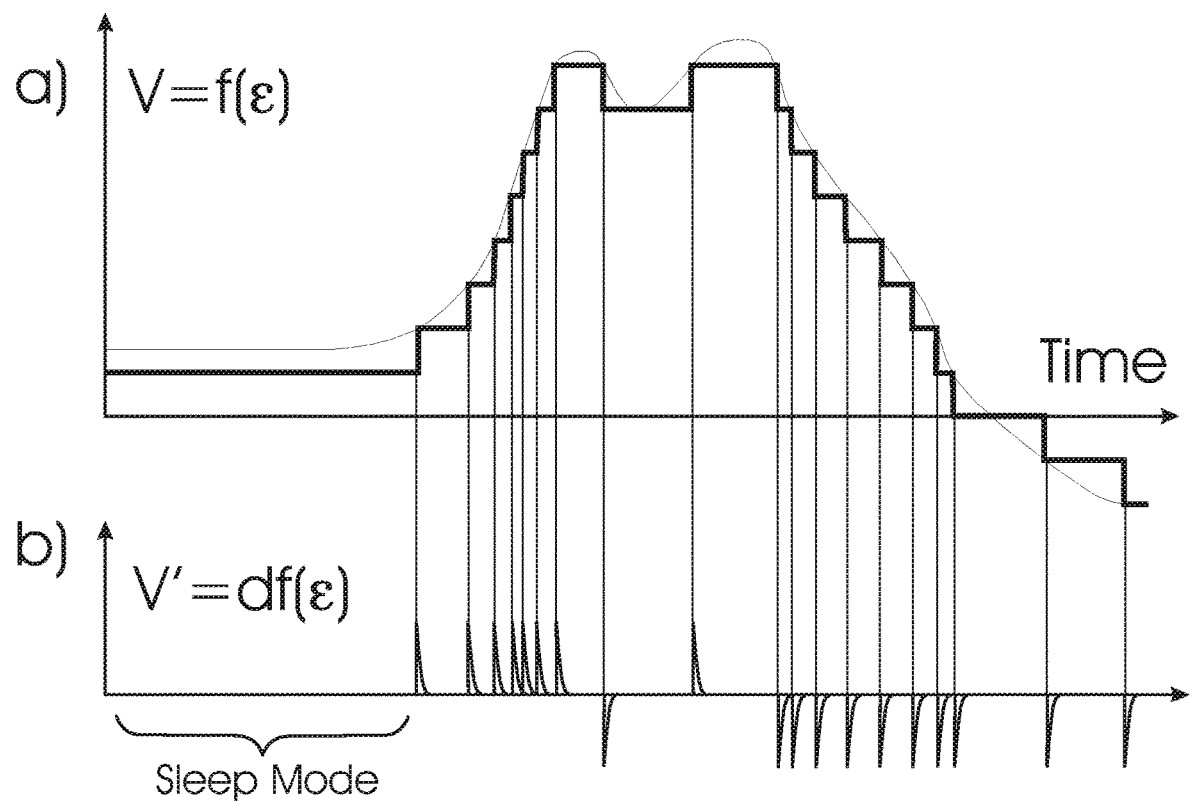
Figure 100:
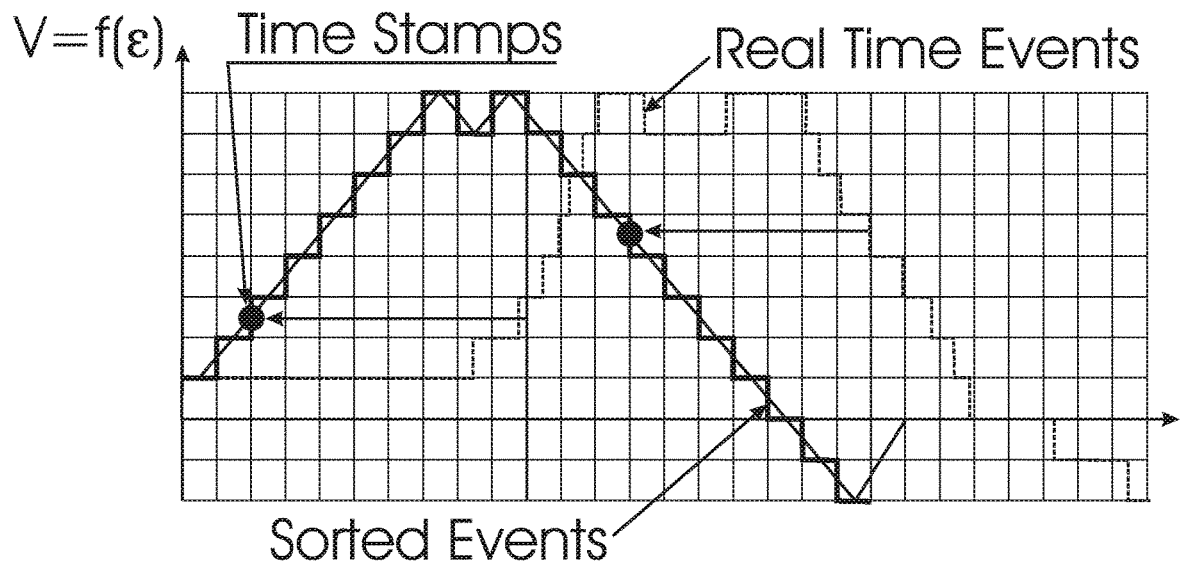
Figure 102:
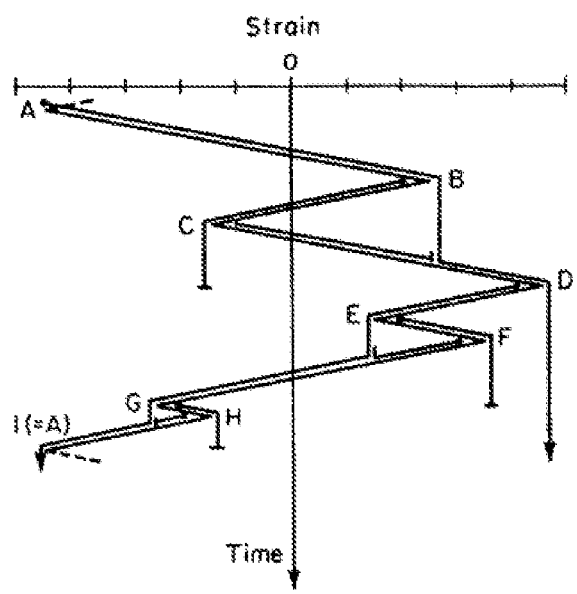
Figure 103:
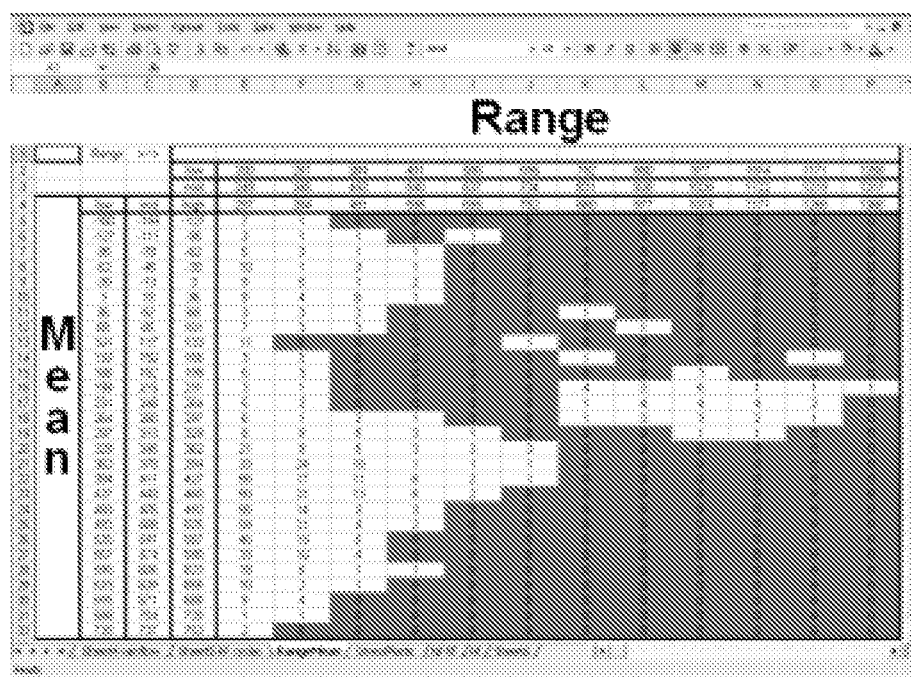
Figure 104:
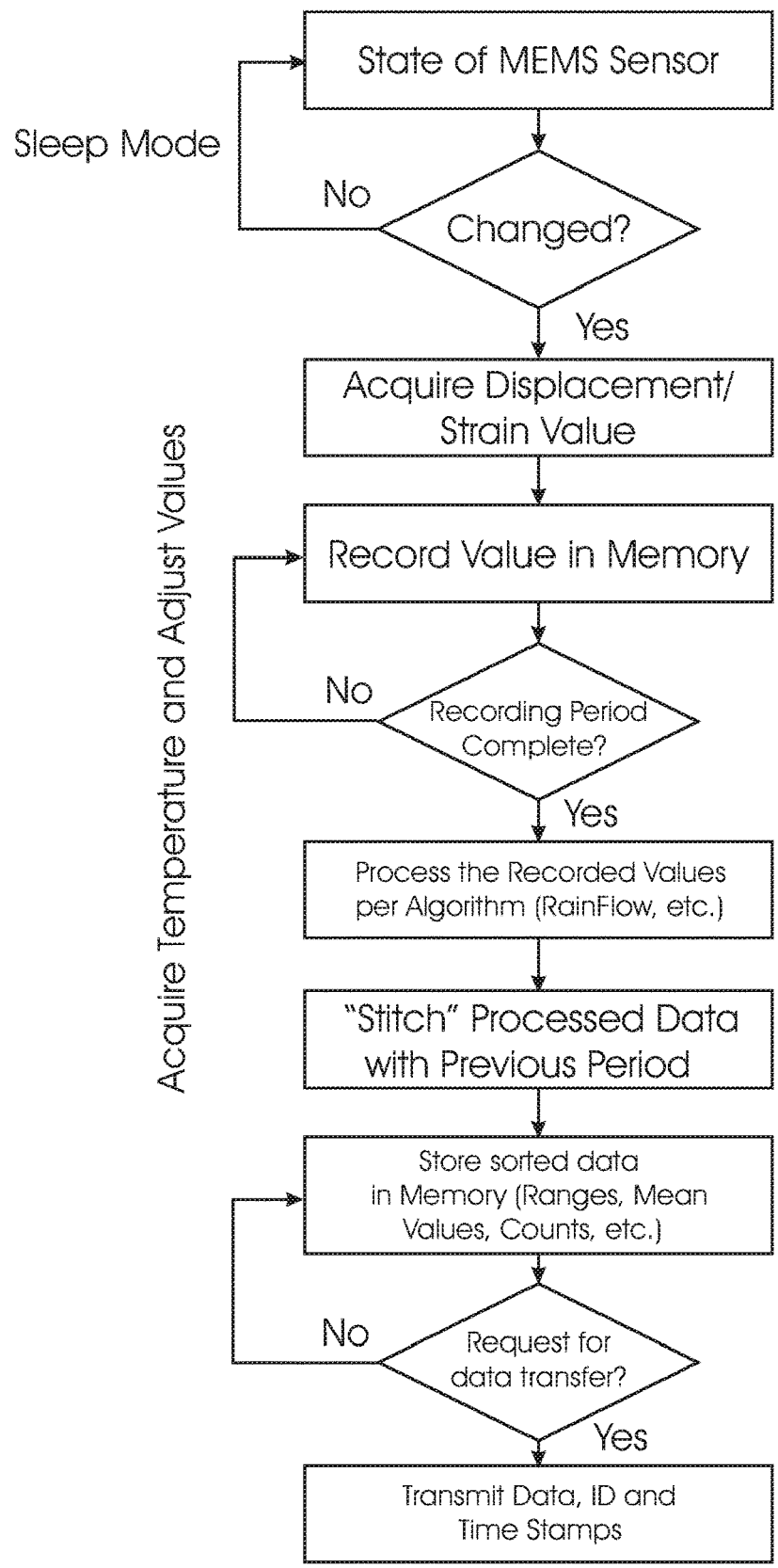

The invention is better described with reference to the drawings in which:

FIG. 1 illustrates a prior art displacement sensor having metal cantilevers;

FIG. 2 illustrates a prior art displacement sensor with metal membranes and deformable spacers positioned therebetween;

FIG. 3 illustrates the basic configuration of a displacement sensor having cantilevers in accordance with the present invention prior to deformation of the cantilevers;

FIG. 4 illustrates the displacement sensor shown in FIG. 3 after displacement creates sequential contacts between adjacent cantilevers;

FIG. 5 illustrates an "interlaced" configuration of cantilevers allowing for symmetrical deformation in two directions of displacement;

FIG. 6 illustrates the sensor shown in FIG. 5 after deformation is applied and illustrates state of sequential contacts between cantilevers;

FIG. 7 illustrates the basic electronic circuitry providing for change of overall resistance of a sensor in accordance with the present invention due to sequential closure of the contacts between cantilevers;

FIG. 8 illustrates a circuit employing the sensor shown in FIG. 7 providing voltage output Vo;

FIG. 9 illustrates the diagram of the output signal Vo related to the displacement (a variant with zero voltage output before the first cantilever contacts adjacent to the drive member makes contact);

FIG. 10 illustrates another embodiment of a sensor in accordance with the present invention having with a continual signal (no zero voltage output before the first cantilever adjacent to the drive member makes contact);

FIG. 11 illustrates a circuit employing the sensor shown in FIG. 10 providing voltage output Vo;

FIG. 12 illustrates the diagram of the output signal Vo related to the displacement;

FIG. 13 illustrates the circuit of a peak displacement recording sensor in accordance with the present invention having memory means consisting of non-resettable or resettable fuses;

FIG. 14 illustrates a circuit employing the sensor shown in FIG. 13 where the output is resistance of the sensor (resistance proportional to positive peak measured between points A and B and resistance proportional to negative displacement peak measured between points C and B);

FIG. 15 further illustrates a diagram of the resistance related to the peak displacement);

FIG. 16 illustrates a practical design of the MEMS sensor in accordance with the present invention consisting of two arrays of cantilevers and a shuttle providing displacement to the cantilevers causing sequential contact between them;

FIG. 17 further illustrates a simplified variant of a MEMS sensor in accordance with the present invention where it is positioned on a substrate and has an integrated resistor matrix;

FIG. 18 illustrates an elevation view A of the MEMS sensor shown in FIG. 17 demonstrating the position of the resistors under the cantilevers;

FIG. 19 illustrates the same principle of a MEMS sensor in accordance with the present invention and having resistors provided in the same plane or layer as the cantilevers;

FIG. 20 further illustrates elevation view of the sensor substrate shown in FIG. 19;

FIG. 21 describes a variant of a sensor for recording peak displacement in accordance with the present invention;

FIG. 22 further illustrates elevation view A as shown in FIG. 21;

FIG. 23 illustrates one embodiment of the manufacturing steps (from 1 to 14) of a method in accordance with the present invention employing bonding of two wafer layers in order to provide compact configuration of the MEMS device and its attendant circuitry;

FIG. 24 illustrates a cantilever array in accordance with the present invention and providing mechanical memory of the cantilevers displacement before deformation has occurred;

FIG. 25 illustrates the same array shown in FIG. 24 when several cantilevers maintain contact after the displacement has been applied;

FIG. 26 further illustrates the effect of the cantilever length and its affect on the residual deflection of the cantilever;

FIG. 27 illustrates a close up view of the cantilevers notches and shows a central hole in the base of a cantilever that facilitates memorization by the deflection applied wherein the shorter the cantilever free length is the more accurate "memory" the applied deflection;

FIG. 28 illustrates the deformability and residual deformation of two cantilevers in accordance with the present invention having similar cross sections but having different lengths;

FIG. 29 represents a MEMS sensor in accordance with the present invention and having cantilevers of different lengths thereby allowing for maintaining a better contact between cantilevers after removal of the displacement and thus providing for a non-power dependent peak displacement sensor;

FIG. 30 illustrates one embodiment of a circuit implementing solution for the MEMS sensor shown in FIG. 29, with the output being a resistance proportional to the peak displacement;

FIG. 31 further illustrates a diagram of change in resistance after removal of the displacement wherein the resistance between points A and B is proportional to the positive peak displacement and the resistance between points C and B is proportional to the negative peak displacement;

FIG. 32 illustrates the general configuration of a MEMS sensor in accordance with the present invention encapsulated into hermetic housing (note that the inner volume of the sensor can be vacuum, inert gas of fluid);

FIG. 33 further illustrates the elevation view A of the MEMS sensor shown in FIG. 32 where a flexible hermetic coupling for the drive member is provided in a form of circular shape slots surrounding the driving pin;

FIG. 34 is a graphic representation of one embodiment of the peak strain sensor in accordance with the present invention having a battery (under blue cover) and three gold plated contact points for measuring resistance proportional to the peak strain incurred during life of the sensor;

FIG. 35 illustrates the inner arrangements of a sensor in accordance with the present invention consisting of a base made of a material with thermal expansion coefficient close to the thermal expansion coefficient of the tested structure with flexures allowing for the relative movement of one part of the base relative to another and where the MEMS sensor positioned in the middle of the base for full temperature compensation;

FIG. 36 illustrates the elevation view A as shown in FIG. 35 where L denotes an effective length of the sensor base defining the conversion of strain into displacement;

FIG. 37 is yet another embodiment of a MEMS strain recording and data processing gauge in accordance with the present invention showing a printed circuit board with the MEMS displacement sensor's state detection circuitry, micro-processor or micro-controller, memory, interface means, battery and a flexible sealant providing for a hermetic attachment of the sensor to the structure being tested;

FIG. 38 illustrates an isometric view of a MEMS strain sensor base in accordance with the present invention and having nano-cantilever arrays;

FIG. 39 illustrates one embodiment of the attachment of the strain sensor base's stand-off to the structure by glue;

FIG. 40 illustrates another embodiment of the attachment of the stand-off by a fastener (can utilize an intermediate component glued to the surface or it can be directly fastened to the surface);

FIG. 41 illustrates another embodiment of the attachment to a magnetic structure using rare earth permanent magnet incorporated into the base and in addition shows a coating containing high friction particles (diamond grains, for instance);

FIG. 42 illustrates an overview of the strain sensor in accordance with the present invention and having mechanical amplification means;

FIG. 43 further illustrates the rear view of the same strain sensor of FIG. 42 having elements of the substrate having flexures provided by slots in the sensor substrate;

FIG. 44 illustrates a cross section of the device shown in FIG. 42 and illustrating a dome-like flexible cover necessary for mechanical protection of the MEMS sensor and providing hermetic seal to the MEMS sensor;

FIG. 45 illustrates a diagram of the deflection applied to the cantilevers due to compression and tension of the structure being tested and defines the notion of variable size gaps between the cantilevers in order to compensate for non-linear behavior of the mechanical amplifier;

FIG. 46 illustrates in more detail the variable gap solution in accordance with the present invention;

FIGS. 47a) and b) illustrate the effect of thermal expansion of the sensor substrate and also illustrates the importance of symmetry of the positioning of the drive member providing the displacement;

FIG. 48 illustrates in mode detail the effect of the thermal deformation of the substrate and the cantilevers defining an optimum ratio between the thermal deformation properties of the materials the substrate and cantilevers are made from;

FIG. 49 illustrates a variant of a shear strain sensor in accordance with the present invention;

FIG. 50 further illustrates an embodiment of an arrangement of three linear displacement sensors to form a rosette for assessment of all components of the strain in the structure being tested;

FIG. 51 illustrates a multi-layer view of the cantilever structure in accordance with the present invention where keeping relatively wide gaps between adjacent cantilevers in their plane assists achieving an overall higher resolution of the sensor;

FIG. 52 is the elevation view A of FIG. 51;

FIG. 53 illustrates yet another arrangement of a single stack of cantilevers in accordance with the present invention wherein the drive member has a different offset from each cantilever;

FIG. 54 is an elevation view A of FIG. 53;

FIG. 55 illustrates another configuration of stacked cantilevers in accordance with the present invention aligned with each other but having the drive member of variable shape thus providing for a sequential contact with each cantilever at different displacements;

FIG. 56 is an elevation view A of FIG. 55;

FIG. 57 illustrates an arrangement of the cantilevers in a circular pattern in accordance with the present invention wherein the drive member experiences angular motion thereby causing displacement;

FIG. 58 further details the deformation of the cantilevers after experiencing said displacement;

FIG. 59 illustrates another configuration of MEMS displacement sensor in accordance with the present invention is described wherein the relative motion (displacement) of two sets of cantilevers causes sequential contacts between them;

FIG. 60 further illustrates the state of the contacts after the displacement;

FIG. 61 illustrates the initial state of a stack of a plurality of parallel bridges-contacts in accordance with the present invention;

FIG. 62 illustrates the state of the contacts after the angular displacement or torque is applied to the ends of the stack shown in FIG. 61;

FIG. 63 demonstrates yet another embodiment where an array of different length cantilevers is compressed by a drive member and buckling of the cantilevers causes sequential contacts between them;

FIG. 64 shows the array illustrated in FIG. 63 after the buckling occurs;

FIG. 65 illustrates a MEMS sensor in accordance with the present invention that is part of a stretchable and compressible substrate wherein the displacement is collected from strain but instead of causing a sequential contact of adjacent flexible members the sensor creates a contact condition "in parallel" where each driving member has a predetermined gap with a flexible member;

FIG. 66 illustrates the state of the contacts illustrated in FIG. 65 and achieved after applying compressive strain;

FIG. 67 illustrates the state of the contacts illustrated in FIG. 65 and achieved after applying tensile strain;

FIG. 68 illustrates a plurality of flexible bridges in accordance with the present invention and positioned in spaced apart configuration with 90 degrees angle between each adjacent flexible bridge;

FIG. 69 illustrates the embodiment of the sensor where the same bridges are wires;

FIG. 70 illustrates the embodiment of the sensor where the flexible members are membranes;

FIG. 71 illustrates the embodiment of the sensor where the flexible members are cantilevers clocked at a 90 degrees angle;

FIG. 72 illustrates a simple configuration of the tips of cantilevers in accordance with the present invention;

FIG. 73 illustrates cantilevers having dimples positioned symmetrically about the distal end of the cantilever in accordance with the present invention and assisting more defined contact between cantilevers and also reducing stickiness of the nano cantilevers due to attraction forces;

FIG. 74 illustrates the asymmetrical position of the dimples about the distal end of the cantilever in accordance with the present invention;

FIG. 75 illustrates yet another embodiment of the asymmetrical positioning of the dimples shown in FIG. 74;

FIG. 76 illustrates one embodiment of the present invention where the cantilever has a variable shaped cross-section;

FIG. 77 illustrates a cantilever in accordance with the present invention and having electro conductive coatings on each side to provide for more flexible arrangement of electronic circuitry;

FIG. 78 illustrates a cantilever with Piezo elements formed on each side of it in accordance with the present invention which can be utilized to generate power necessary for the function of electronic circuitry or to force vibration/deflection excitation of the cantilever;

FIG. 79 illustrates one embodiment of a strain sensor base in accordance with the present invention with Piezo-electric elements attached to parts of the flexures to generate additional power by harvesting it from the deformations caused by the strain itself;

FIG. 80 illustrates one embodiment of a shuttle in accordance with the present invention where the Piezo-electric elements are part of the shuttle delivering the displacement (drive unit);

FIG. 81 illustrates a cantilever in accordance with the present invention having variable height which can assist in achieving higher aspect ratio during MEMS manufacturing process and providing smaller gaps between the cantilevers thus assuring better resolution of the sensor and reducing manufacturing costs;

FIG. 82 illustrates one embodiment of a configuration of a MEMS displacement sensor in accordance with the present invention where the capacitors in circuit between flexible members;

FIG. 83 illustrates the response of the sensor shown in FIG. 82 as change in capacitance depending on displacement;

FIG. 84 illustrates a MEMS sensor in accordance with the present invention having resistors oriented between adjacent flexible members;

FIG. 85 illustrates the response of the sensor shown in FIG. 84 as change in overall sensor resistance;

FIG. 86 illustrates an embodiment of a MEMS sensor in accordance with the present invention where resistors are included as an integral part of the cantilevers;

FIG. 87 illustrates a response of the sensor shown in FIG. 86 given that the values of resistors are identical;

FIG. 88 illustrates an embodiment of a MEMS sensor in accordance with the present invention where the deformable members can have capacitors integral with them;

FIG. 89 illustrates a response of the sensor shown in FIG. 88;

FIG. 90 illustrates MEMS sensor with direct output from each cantilever which can be connected to I/Os of a circuitry, individual signal conditioning devices, Field Programmable Gates Array (FPGA), D/A converter, etc., Priority Encoder, Encoder or Complex Programmable Logic Device (CPLD) or a combination thereof;

FIG. 91 illustrates a diagram of the logical states of the output from the device shown in FIG. 90;

FIG. 92 illustrates at least one embodiment of a solution comprising a self contained strain data acquisition and processing system for Health and Usage Monitoring in Aircrafts and other structures with a MEMS sensor in accordance with the present invention that has an analog signal output;

FIG. 93 illustrates another embodiment of a solution in accordance with the present invention comprising a self-contained strain data acquisition and processing system for Health and Usage Monitoring in Aircrafts and other structures with a MEMS sensor in accordance with the present invention that has an digital signal output;

FIG. 94 illustrates another embodiment of a solution in accordance with the present invention comprising a self-contained strain data acquisition and processing system for Health and Usage Monitoring in Aircrafts and other structures with a MEMS sensor in accordance with the present invention that has an digital signal output connected to a FGPA;

FIG. 95 illustrates a number of possible placements of strain HUMS sensors on an aircraft;

FIG. 96 illustrates one embodiment of a strain spectrum diagram from an element of an aerospace structure;

FIG. 97 illustrates the same signal being output of a MEMS sensor in accordance with the present invention and also identifies part of the signal shown in greater resolution in the following figures;

FIG. 98 shows one of the embodiments of a MEMS sensor contacts' state detection circuitry employing a low power analog differentiator in accordance with the present invention;

FIG. 99a) illustrates part of the strain measurement signal shown in FIG. 97 in greater detail;

FIG. 99*b*) illustrates the output of the circuitry shown in FIG. 98 as a result of differentiation of the signal produced by a MEMS sensor in accordance with the present invention;

FIG. 100 illustrates a diagram of the partially processed signal received from a MEMS sensor in accordance with the present invention and compressed from real time events into sorted events with time stamps;

FIG. 101*a*) illustrates the signal received from MEMS state of contacts detection system in accordance with the present invention;

FIG. 101*b*) illustrates the signal shown in FIG. 101*a*) and shaped into short duration wakeup pulses;

FIG. 101*c*) illustrates the sequence of A/D conversion process of the signal illustrated FIG. 101*b*) directly following wakeup pulses;

FIG. 101*d*) illustrates temperature reading events which can be positioned strategically (time or event wise) to assure proper correction to the signal received from the MEMS sensor due to the effect of temperature;

FIG. 101*e*) illustrates a diagram of signal conditioning based on a temperature reading;

FIG. 101*f*) illustrates the frequency of time stamps initiation of which can be linked to a timer, pre-determined strain level events, counter of events or combination thereof;

FIG. 102 illustrates a Rainflow algorithm for data processing in accordance with at least one embodiment of the present invention allowing for storing only information relevant to estimation of peak stresses and prediction of fatigue limits (i.e the remaining life) for the components of the aircraft being analyzed;

FIG. 103 represents a table containing completely processed data per Rainflow algorithm; and FIG. 104 illustrates a simplified form of at least one embodiment of data acquisition and data processing algorithms for one embodiment of a Health and Usage Monitoring MEMS strain sensor in accordance with the present invention.

BEST MODE FOR CARRYING OUT THE INVENTION

Best Mode

Best mode of the invention is generally illustrated by FIGS. 59 and 60. Two arrays of flexible micro or nano-scale cantilevers are in sequential contact between adjacent cantilevers spaced in a fashion incorporating Vernier approach. This configuration allows for larger gaps between the cantilevers which simplifies MEMS fabrication while preserving an overall high sensitivity of the sensor to a displacement. Any suitable means for conversion of the strain can be used to provide displacement to the sensor, including, but not limited to those described in FIGS. 35-41 or FIGS. 43 and 44. A variant of the algorithm of operation of the best mode of the invention is illustrated by FIG. 104.

MODE FOR THE INVENTION

Mode for Invention

In at least one embodiment the present invention relates to a system for monitoring and logging displacements related to mechanical stress conditions.

As will be a readily appreciated by the skilled person, all components discussed herein can be manufactured of any suitable material and by any suitable manufacturing method including those customary to nano and MEMS technological processes as will be readily understood by the skilled person.

These manufacturing methods and steps include but not limited to wet or dry etching, deep reactive ion etching, micromachining, SCREAM process, photolithography, masking, metal deposition, SI doping, application and removal of sacrificial layers and photo resists, oxidation and chemical processing, wire bonding, chemical vapor deposition, bonding, encapsulation, thermal treatment, polycrystalline silicone layers deposition and removal, chemical and mechanical polishing, application of anti-sticking materials, treatment and techniques, sandwiching of multiple layers and devices, etc.

In at least one embodiment of the present invention, the present invention can provide portable sensing means and a device for continuous monitoring, logging and processing of stress conditions (via displacement caused by strain) in a physical structure, while achieving low power consumption and adequate memory storage allowing for monitoring over an extended period.

Another embodiment of the present invention can provide an extremely low power consumption displacement sensor capable of easy implementation into a variety of applications.

Yet another embodiment of the present invention can provide a processing algorithm allowing for onboard analysis of the data provided by the sensing means in order to reduce the amount of memory needed while providing a complete picture with respect to the history of usage and events necessary for fatigue life prediction and factual load spectrum analysis.

This latter aspect can permit careful prediction of the remaining life of a particular monitored component and can also provide an estimation of the damage that the component has experienced due to overloading during the use of the sensor. Based on this collected data and the associated knowledge that can be inferred therefrom, it can be possible to determine the appropriateness of the overhaul/reinforcement of a component and therefore justify the necessity to replace a component only if real, observed damage has occurred.

In this way, the present invention can allow instrumenting an aircraft or other structure without interference into existing data recording instrumentation due to the autonomous manner that data is acquired. Alternatively, the present invention can be employed to enhance and assist an existing data recording system.

Moreover, constant monitoring of critical points on a structure to track and determine a history of stress and correlating it to the conditions causing it can allow aircraft manufacturers to better predict design parameters and improve the reliability of the systems while keeping the cost of overhauls and repairs or replacements down to a justified minimum.

Due to the discrete nature of the sensor output (which, as will be discussed below, is related to the gaps between fixed number of electrodes) it is possible to further simplify the circuitry and automatically implement division of the displacement range into predetermined threshold levels thus simplifying the computation of the desired output as well as watch for the state of contacts to change (i.e. from On to Off or vice versa) in order to initiate data acquisition only when there is a change in strain thus dramatically reducing power consumption of the device. It is contemplated that by varying the gaps' sizes any desirable sensitivity, linearity or non-linearity of the sensor can be achieved, as will be appreciated by the skilled person.

According to one particular embodiment of the present invention, the system comprises processing means for analyzing the data and storing it in non-volatile memory making it possible to provide an output directly used for estimation of the fatigue of the component due to the mechanical stresses.

According to another embodiment of the present invention, each sensor comprises maximum/minimum (peak) stress recording means.

Yet in another embodiment of the present invention, the system comprises RF interface (Bluetooth™ 4 or WI-FI, for instance) for transmitting the data wirelessly and on request to remote means, such as for example a PC, hand-held receiver, Android device or an aircraft data logger.

According to at least one embodiment of the present invention, the sensors are mechanical deformation sensors employing serially positioned flexible electrical contact members positioned with gaps between them and allowing for a sequential contact of each other by displacement of at least part of said electrical contact plate.

According to at least one embodiment of the present invention, the sensors are of the MEMS type comprising microelectronic and nano or micromechanical members. They are usually manufactured using same techniques as for manufacturing of integrated circuits for the electronic members and using micromachining (etching, for instance) for the mechanical members.

The miniature size of the MEMS type sensor described herein permits easy integration into an aircraft or other structure and also allows for combination of several sensors into one package (for enhanced security using parallel data acquisition or to create a rosette or array of sensors for complete assessment of the strain distribution). According to at least one embodiment, at least two sensors are arranged to detect the same stress condition at a certain point assuring that in the event of failure of one sensor, the other sensor can still record the stress spectrum.

The present invention can be constructed of any suitable materials. To match the deformation of the structure caused by temperature, the base of the sensor can be made of the same material as the structure being tested including metal components (Aluminum, steel, Inconel, Titanium, etc.), composite materials and a variety of other materials that will be readily apparent to the skilled person. In at least one embodiment the base of the sensor is made of the material with the same temperature coefficient as the material being tested. In addition, in some embodiments the internal thermal sensor can provide for correction of the sensor sensitivity at predetermined intervals.

It is also contemplated that the invention can also provide a method for estimating fatigue of an aircraft component subjected to mechanical stresses using a variety of algorithms for data interpretation, including but not limited to a Rainfall algorithm.

According to at least one embodiment of the present invention, a suitable algorithm for use in connection with the preset invention is disclosed in U.S. Publication No. 20120035864 to Frydenhal, which teaches methods for determining an equivalent mechanical load of a component under a dynamic mechanical loading. A first measurement value of the mechanical load of the component is measured and compared to a first reference value and at least one count value representing the number of load half-cycles of the component is updated based upon the result of comparing, wherein the load half-cycles correspond to a predetermined range of mechanical loads and occur within a time period prior to the measurement of the first measurement value.

According to at least one embodiment of the present invention, the data can be organized in the memory as a table with approximately 20-50 rows indicating mean values related to stress fluctuation from peak to valley (or vice versa), 20-50 columns indicating the range of stress (from peak to valley or vice versa), two values of absolute maximums of tensile and compressive stress recorded and each cell of the table containing the count of events, preferably with 32 bit (or better) resolution allowing recording of 43 billion counts or more in each cell. The total amount of memory for such tables is in the range of 1.6-11 Kbytes, which allows wireless transmission of all data within fraction of a second. In some embodiments the table can provide complete information on stress spectrum and allow further calculations of the fatigue life and overall loading spectrum.

It is contemplated that the use of methods presented herein can allow receiving the final estimate of the fatigue level during routine data acquisition by any suitable type of a portable device operated by a user standing beside (or inside) the aircraft within proximity of the RF transmitter range (typically 10-50 m). It is contemplated that conventional wired interfaces, such as but not limited to, RS-482, One-Wire™ or similar interfaces can also be used as will be understood by the skilled person. Due to data organization as disclosed by the present invention and the small size of each individual sensor, a simultaneous acquisition of data from many sensors can be done within a very short period of time. Each sensor can have a unique identification number and password protection for data retrieval and changes to the sensor data logging/processing mission, which in some embodiments can both be accomplished using wireless communication.

Turning to FIG. 1, an illustration of a prior art electro contact displacement sensor is provided wherein a series of parallel cantilevers 1 are spaced apart by a distance $\delta_2$ with the help of dielectric spacers 2. In this way, when a displacement is applied by means of drive member 4 to an adjacent cantilever 1 a sequential contact between cantilevers 1 can be achieved.

Turning to FIG. 2, an illustration of another prior art discrete displacement sensor wherein a displacement plunger 1 is received in a two part housing 2,3. An external gauge 4 is provided that measures the rotation of the first part of the threaded housing 2 to the second part of the threaded housing 3 and compressive dielectric washers 7 can provide for adjustment of the device's sensitivity by varying gap size between flexible electro-conductive membranes 5.

Turning to FIG. 3, at least one embodiment of the general operating principle of the present invention is illustrated showing an array 2 having deformable members that are cantilevers 4, each cantilever 4 having a movable distal end 6 and a fixed, proximal end 8. In this embodiment, a point load is applied to the distal end 6 of an outermost cantilever 4 that is one of an array 2 consisting of a series of cantilevers 4 spaced apart by a distance δ and by means of separating members 3.

It is contemplated that the present invention employs deformable members that can take a wide variety of forms including, but not limited to, a plate, cantilever, switch or any other suitable shape that will be readily appreciated by the skilled person.

Turning to FIG. 4, it can be seen that as the point load is applied to the outermost cantilever 4, a distal end 6 of the outermost cantilever 4 is displaced by a displacement Δ, thereby causing the distal end 6 of the outermost cantilever 4 to make contact with the distal end 6 of an adjacent cantilever 4. As will be appreciated by the skilled person, as the displacement Δ increases, the distal end 6 of the adjacent cantilever 4 will eventually contact the distal end 6 of the next adjacent cantilever 4 (and so on as the increase of displacement Δ continues), as seen in FIG. 4.

As seen in FIGS. 5 and 6, an analogous principle to that of FIGS. 3 and 4 is illustrated, however in this embodiment two arrays 2 of cantilevers 4 (each having a movable distal end 6 and a fixed, proximal end 8) are presented with a contact 10 positioned therein between. In this embodiment, each array 2 of cantilevers 4 further consists of a plurality of alternately opposing, interleaved cantilevers.

As will be appreciated by the skilled person, this arrangement permits more cantilevers to be placed within a given amount of surface area (due to the closely spaced, interleaved arrangement) thereby permitting finer resolution and better linearity with respect to the measured displacement Δ, as discussed in further detail below.

As will be understood by the skilled person, provided that the contact is movable relative to the arrays (which are in turn fixed relative to one another) or vice versa, this arrangement allows the measurement of a displacement Δ in both directions in cases where the contact moves to the left relative to the arrays 2 (as seen in FIG. 6) and in cases where the contact moves to the right relative to the arrays 2 (not shown).

As seen in FIG. 6 (and in an analogous manner to the arrangement described in FIG. 4), as displacement Δ increases the distal end of the outermost cantilever makes contact with the distal end of an adjacent cantilever (which in this arrangement is located across from the outermost cantilever). As the displacement Δ further increases, the distal end of the adjacent cantilever will eventually contact the distal end of the next adjacent cantilever (located across from the adjacent cantilever and on the same side of outermost cantilever) and so on as the increase of displacement Δ continues, as seen in FIG. 6.

Turning to FIGS. 7 and 8, at least one embodiment of the present invention is illustrated wherein a contact 10 is disposed between a first array 2 of cantilevers 4 and a second array 2 of cantilevers 4. Each cantilever 4 has a movable, distal end 6 and a fixed, proximal end 8 and is spaced apart from an adjacent cantilever 4 by a distance δ. Further, A resistor 12 having an electrical resistance Ω is placed between each pair of adjacent cantilevers 4.

Contact 10 is electrically connected to an electric circuit (at point B), and each cantilever 4 of each array 2 are electrically connected to a circuit (at points A and C).

In this way a circuit is provided, as seen in FIG. 8, wherein a supply voltage $V_c$ is measured at point A, an output voltage $V_o$ is measured at point B and point C is grounded. Therefore, the voltage measured between point B ($V_o$) and point C (V=0) is an output voltage $V_o$, as will readily be appreciated by the skilled person.

As can be seen in FIG. 9, displacement Δ of the contact 10 relative to the arrays 2 of cantilevers can be plotted against the output voltage $V_o$ measured between points B and C. In this particular embodiment, negative displacement can be plotted as the contact 10 moves to the left relative to the arrays 2 and positive displacement can be plotted as the contact 10 moves to the right relative to the arrays 2, although other arrangements are certainly contemplated as will be understood by the skilled person.

In the present embodiment, at the initial position also shown in FIG. 7, there is zero output voltage (i.e.: $V_o$=0) when the contact is in the initial position (displacement Δ=0), as the contact does not make contact with a cantilever in either array thereby opening the circuit between points B and C.

As contact 10 moves to the left relative to the arrays 2 by a distance corresponding to distance δ, contact 10 makes electrical contact with the distal end 6 of the left outermost cantilever 4 thereby completing the circuit. In this position the output voltage is measurable. As the contact 10 continues to move to the left relative to the arrays 2 by an additional distance δ, the distal end 6 of the left outermost cantilever 4 makes contact with the distal end 6 of an adjacent cantilever 4. As this occurs, a single resistor 12 is removed (shorted) from the circuit and the total measured resistance across points B and C is reduced by the resistance Ω of resistor 12. Therefore, in accordance with Ohm's law, the output voltage $V_o$ measured across points B to C is reduced by a stepwise amount $V_A$, as seen in FIG. 9.

Turning to FIGS. 10 and 11, another embodiment of the present invention is illustrated wherein contact 10 is disposed between a first array 2 of cantilevers 4 and a second array 2 of cantilevers 4. Each cantilever 4 has a movable, distal end 4 and a fixed, proximal end 8 and is spaced apart from an adjacent cantilever 4 by a distance δ. Further, A resistor 12 having an electrical resistance Ω is placed between each pair of adjacent cantilevers 4.

Contact 10 is electrically connected to an electric circuit (at point B), and each cantilever 4 of each array 2 are electrically connected to a circuit (at points A and C). In this embodiment, an additional resistor 14 is placed in electrical communication between contact 10 and each of the arrays 2 such that the circuit is complete when contact 10 is in the initial position between each of the arrays 2.

In this way a circuit is provided, as seen in FIG. 11, wherein a voltage $V_c$ is measured at point A, an output voltage $V_o$ is measured at point B and point C is grounded. Therefore, the voltage measured between point B ($V_o$) and point C (V=0) is an output voltage $V_o$ as will readily be appreciated by the skilled person.

As can be seen in FIG. 12, displacement Δ of the contact 10 relative to the arrays 2 of cantilevers can be plotted against the output voltage $V_o$ measured between points B and C. In this particular embodiment, negative displacement can be plotted as the contact 10 moves to the left relative to the arrays 2 and positive displacement can be plotted as the contact 10 moves to the right relative to the arrays 2, although other arrangements are certainly contemplated as will be understood by the skilled person.

In the present embodiment, at the initial position also shown in FIG. 10, there is an initial output voltage (i.e.: $V_o$=$V_i$) when the contact is in the initial position (displacement Δ=0), as in this embodiment contact 10 (at point B) is in electrical communication with both points A and C through additional resistor 14.

As contact 10 moves to the left relative to the arrays 2 by a distance corresponding to distance δ, contact 10 makes electrical contact with the distal end 6 of the left outermost cantilever 4 thereby completing the circuit. In this position the output voltage is measurable. As the contact 10 continues to move to the left relative to the arrays 2 by an additional distance δ, the distal end 6 of the left outermost cantilever 4 makes contact with the distal end 6 of an adjacent cantilever 4. As this occurs, a single resistor 12 is removed (shorted) from the circuit and the total measured resistance across points B and C is reduced by the resistance Ω of resistor 12. Therefore, in accordance with Ohm's law, the output voltage $V_o$ measured across points B to C is reduced by a stepwise amount $V_A$, as seen in FIG. 12.

Turning to FIGS. 13 and 14, another embodiment of the present invention is illustrated wherein contact 10 is disposed between a first array 2 of cantilevers 4 and a second array 2 of cantilevers 4. Each cantilever 4 has a movable, distal end 4 and a fixed, proximal end 8 and is spaced apart from an adjacent cantilever 4 by a distance δ. A resistor 12 having an electrical resistance Ω is placed between each pair of adjacent cantilevers 4. Further, in each array 2, a fuse 16 is placed in electrical contact between the proximal end 8 of each cantilever 4 and ground.

Contact 10 is electrically connected to an electric circuit (at point $V_C$), and each cantilever 4 of each array 2 are electrically connected to a circuit (at points A and C). Further, the entire circuit is connected to point B and ground as seen in FIG. 13.

In this way a circuit is provided, as seen in FIG. 14, wherein points $V_C$, A, B and C are connected to the circuit. Further, the entire circuit is also grounded. Therefore, the output resistance $R_o$ measured between point $V_C$ and ground, as will readily be appreciated by the skilled person.

As can be seen in FIG. 15, maximum (peak) displacement Δ of the contact 10 relative to the arrays 2 of cantilevers can be plotted against the output resistance $R_o$ measured between points Vc and ground. In this particular embodiment, negative peak displacement can be plotted as the contact 10 moves to the left relative to the arrays 2 while fuses 16 are sequentially burned and positive peak displacement can be plotted as the contact 10 moves to the right relative to the arrays 2 while fuses 16 are sequentially burned, although other arrangements are certainly contemplated as will be understood by the skilled person.

In the present embodiment, at the initial position also shown in FIGS. 13 and 15, there is no output resistance (i.e.: $R_o$=0) when the contact is in the initial position (displacement Δ=0), as in this embodiment contact 10 (at point B) is not in electrical communication with either points A and C and the electrical circuit is not completed. The circuit per FIG. 13 employs two diodes 18 which assist measuring the resistance between points A-B and points C-B without interference on the readings from the adjacent array of resistor-fuse matrix.

As contact 10 moves to the left relative to the arrays 2 by a distance corresponding to distance δ, contact 10 makes electrical contact with the distal end 6 of the left outermost cantilever 4 thereby completing the circuit. However, and as discussed above, as the electrical connection is completed between left outermost cantilever 4 and contact 10 the first fuse 16 connected to the ground is receiving voltage Vc. Thus, as proximal end 8 of cantilever 4 is in electrical connection with ground through fuse 16 the fuse is blown (burned). After reaching this contact state the output resistance proportional to the peak displacement is measurable. As the contact 10 continues to move to the left relative to the arrays 2 by an additional distance δ, the distal end 6 of the left outermost cantilever 4 makes contact with the distal end 6 of an adjacent cantilever 4. As this occurs, a single resistor 12 previously shorted by fuse 16 is added to the circuit and the total measured resistance across points B and C is increased by the resistance Ω of resistor 12. Therefore, in accordance with Ohm's law, the output resistance $R_o$ measured across points B to C is increased by a stepwise amount $R_A$, as seen in FIG. 15.

As contact 10 moves to the right relative to the arrays 2 by a distance corresponding to distance δ, contact 10 makes electrical contact with the distal end 6 of the right outermost cantilever 4 thereby completing the circuit. As discussed above, as the electrical connection is completed between right outermost cantilever 4 and contact 10 the first fuse (on the right from the contact 10) 16 connected to the ground is receiving voltage Vc. Thus, as proximal end 8 of cantilever 4 is in electrical connection with ground through fuse 16 the fuse is blown (burned). After reaching this contact state the output resistance proportional to the peak displacement is measurable. As the contact 10 continues to move to the left relative to the arrays 2 by an additional distance δ, the distal end 6 of the left outermost cantilever 4 makes contact with the distal end 6 of an adjacent cantilever 4. As this occurs, a single resistor 12 previously shorted by fuse 16 is added to the circuit and the total measured resistance across points B and C is increased by the resistance 0 of resistor 12. Therefore, in accordance with Ohm's law, the output resistance $R_o$ measured across points B to C is increased by a stepwise amount $R_A$, as seen in FIG. 15.

Turning to FIG. 16, a plan view of one embodiment of the array substrate arrangement for use in connection with a strain gauge in accordance with the present invention is illustrated. In this embodiment, the contact 10 is a central flexure (or shuttle) component having a central, displacement driver hole 14. Central flexure component is fixed to an underlying substrate by way of anchored pads 180, as will be discussed in further detail below. An array 2 of opposing, interleaved cantilevers 4 is oriented on each side of contact 10. Each cantilever 4 has a movable, distal end 6 and a fixed, proximal end 8. The fixed, proximal end 8 is fixed to the underlying array substrate by anchored pads. A stopper 22 is positioned at each end of the array substrate. Stoppers 22 are provided that abut the outer end of each array 2.

Turning to FIGS. 17 and 18, a simplified diagram of one embodiment of an array substrate arrangement for use in connection with a strain gauge in accordance with the present invention is illustrated. A contact 10 that is a central flexure component having a central, displacement driver hole 14 fixed to an underlying substrate 20. An array 2 of opposing, interleaved cantilevers 4 is oriented on each side of contact 10. Each cantilever 4 has a movable, distal end 6 and a fixed, proximal end 8. Adjacent cantilevers 4 are connected electrical communication with one another by way of a network of resistors 12 that are arranged in a series relationship with one another. Further, an additional resistor 15 is provided to connect the contact 10 to the adjacent cantilevers 4 in electric communication.

With reference to FIG. 18, a side view of the array substrate arrangement of FIG. 17 is depicted. As can be seen, a conductive layer 30 is provided between the cantilever 4 and the underlying substrate 20 in order to anchor the fixed, proximal end 8 of the cantilever 4 to the underlying substrate 20. Conductive layer 30 can be constructed of any suitable material having the electrical and thermal properties required by the particular application. In this particular instance the layer 30 is used to create an electric circuit with integrated resistors 12.

Turning to FIGS. 19 and 20, a simplified diagram of another embodiment of an array substrate arrangement for use in connection with a strain gauge in accordance with the present invention is illustrated. A contact 10 that is a central flexure (shuttle) 19 component having a central, displacement driver hole 14 fixed to an underlying substrate 20. An array 2 of opposing, interleaved cantilevers 4 is oriented on each side of contact 10. Each cantilever 4 has a movable, distal end 6 and a fixed, proximal end 8.

In this embodiment, cantilevers 4 are connected in electrical communication by way of a network of resistors 12 that are arranged in a branched relationship with one another. Contact pads 23 are provided to electrically connect cantilevers 4 and resistors 12 to an overall electrical circuit.

Further, additional resistors 15 are provided to connect the contact 10 to the adjacent cantilevers 4 in electric communication.

With reference to FIG. 20, a side view of the array substrate arrangement of FIG. 19 is depicted. As can be seen, a conductive layer 30 is provided between the cantilever 4 and the underlying substrate 20 in order to anchor the fixed, proximal end 8 of the cantilever 4 to the underlying substrate 20.

Turning to FIGS. 21 and 22, a simplified diagram of another embodiment of an array substrate arrangement for use in connection with a strain gauge in accordance with the present invention is illustrated. A contact 10 that is a central flexure (shuttle) 19 component having a central, displacement driver hole 14 is fixed to an underlying substrate 20. An array 2 of opposing, interleaved cantilevers 4 is oriented on each side of contact 10. Each cantilever 4 has a movable, distal end 6 and a fixed, proximal end 8.

In this embodiment, cantilevers 4 are connected in electrical communication by way of a network of resistors 12 that are arranged in a series relationship with one another. In this embodiment, a series of fuses 16 is provided to connect the proximal end 8 of each cantilever 4 to ground. Contact pads 23 are provided to electrically connect cantilevers 4 and resistors 12 to an overall electrical circuit. Further, diodes 18 are provided to connect the contact pad 17 to the adjacent cantilevers 4 in electrical communication. Contact pads 23 may be used to wire the sensor to the external circuitry.

With reference to FIG. 20, a side view of the array substrate arrangement of FIG. 19 is depicted. As can be seen, a conductive layer 30 is provided between the cantilever 4 and the underlying substrate 20 in order to anchor the fixed, proximal end 8 of the cantilever 4 to the underlying substrate 20.

Turning to FIG. 23, the manufacturing steps of MEMS sensor per one of the variants are depicted, namely:
Step 1 illustrates a Silicon wafer prior to undergoing any processing steps;
Step 2 illustrates masking the silicon wafer;
Step 3 illustrates forming a layer of silicon oxide as electric isolator;
Step 4 illustrates the removal of the masking as per step 2;
Step 5 illustrates forming the conductive layer and masking it with a pre-determined pattern;
Step 6 illustrates forming an electric circuit on the conductive layer;
Step 7 illustrates removal of masking per step 5;
Step 8 illustrates the bonding of the silicon wafer to a substrate (for example, a silicon wafer);
Step 9 illustrates masking of the top silicon wafer to create a pattern of cantilevers;
Step 10 illustrates removal of masking per step 9;
Step 11 illustrates forming cantilevers on the top silicon wafer;
Step 12 illustrates the removal of the masking per step 9;
Step 13 illustrates the removal of the sacrificial layer (silicon oxide, for instance) formed in steps 3 and 4; and
Step 14 shows metallization of cantilevers by conductive layer deposition or Silicon doping and forming the sensor circuitry.

Turning to FIG. 24, one embodiment of an aspect of the present invention is illustrated wherein an array 2 of cantilevers 4 is provided that consists of a series of spaced apart, opposing, interleaved cantilevers 4. Each cantilever 4 has a movable, distal end 6 and a fixed, proximal end 8. A hinge 5 is positioned between the proximal end 8 and the distal end 6. In this embodiment, hinge 5 of cantilever 4 is located closer to the proximal end 8, however other embodiments are also contemplated.

With reference to FIG. 25, it is contemplated that hinges 5 provide for plastic deformation of the material that cantilevers 4 are made from. In a preferred embodiment, the cantilevers 4 are made from metals with fairly well defined plastic deformation region in their strain-stress curve (see, for example FIG. 28 below). These metals include, but not limited to such materials as gold and aluminum. To further facilitate plastic deformation responsible for mechanical memory of the cantilever 4 deflection after the source of deformation is released, the hinge 5 can have a notch (not shown) or a recess providing for stress concentration and/or reduction of the cross section where the elastic deformations occur.

Initially, the cantilevers are spaced apart by gaps 25, however when a displacement force is applied to the distal end 6 of an outer cantilever 4 the distal end 6 makes contact 27 with the distal end 6 of an adjacent cantilever 4, as illustrated in FIG. 25.

Turning to FIGS. 26 and 27, in at least one embodiment it is contemplated that for a given deflection δ the shorter the length of the cantilever 4 the larger the final (i.e.: memorized) deflection δ' can be. In other embodiments, it is contemplated that the deformable element can be a bridge, membrane or any other suitable stricture rather than a cantilever in order achieve the same effect. It is also contemplated that the deformable material can be formed of any suitable material provided that the selected material has the desired properties of remembering its shape once deformed.

This effect is further illustrated in FIG. 28, from which it is apparent for the skilled person that there is a combination of relative lengths of cantilevers 4 wherein they will maintain mechanical contact (and electric) after the displacement is removed thus providing for a simple means for memorizing the peak deformation or strain resulting in such deformation.

At least one embodiment of a device incorporating these principles on a MEMS scale is illustrated in FIG. 29. In this embodiment, wherein two arrays of opposing interleaved cantilevers 4 are arranged in a spaced apart arrangement on either side of a contact 10 that is a central flexure (shuttle) 19 component having a central, displacement driver hole 14 that is fixed to an underlying substrate 20. In this embodiment it is contemplated that each cantilever 4 is in electrical connection with the adjacent cantilevers and further include a hinge 5 positioned between distal end 6 to fixed end 8.

More specifically, in this embodiment a resistor 12 is placed in electrical connection between adjacent cantilevers. Further, in this embodiment each cantilever 4 within a given array 2 has different lengths (measured from distal ends 6 to fixed ends 8) that increase sequentially as one moves toward the outer edges of the substrate 20 (that is, away from contact 10).

Turning to FIG. 30, one embodiment of an electrical block diagram suitable for use in connection with the device illustrated in FIG. 29 is illustrated.

Therefore, and as can be seen in FIG. 31, Output Resistance R can be plotted against Displacement Δ for the device illustrated in FIG. 29 such that for each increase in displacement δ a corresponding increase in the Output Resistance R can be measured across the circuit (which in fact corresponds to the differential Resistance measured between points A and B). As will be understood by the skilled person, this corresponds to the device being placed in a condition of tension.

On the other hand, for each decrease in displacement δ that occurs a corresponding increase in the Output Resistance R can also be measured across the circuit (which in fact corresponds to the differential Resistance measured between points C and B). As will be understood by the skilled person, this corresponds to the device being placed in a condition of compression.

FIG. 32 illustrates a self-contained displacement sensor incorporating an array of MEMS cantilevers 4 for detecting deformation of the center of the shuttle 10. The sensor substrate 20 with device layer comprising the cantilevers 4, shuttle 10 and electronic circuitry has a deformable part 64 formed by etching circular slots from opposite sides of the substrate and providing for hermetic seal of the inner volume of the sensor while allowing for deformation of the shuttle 10 via pin (not shown) in contact with pocket 200 in the drive member (see also FIG. 33). The housing is bonded to the substrate using conventional techniques, for instance epoxy 60. To achieve better compensation for thermal deformation, the substrate has recesses 201 positioned close to the vertical symmetry line (perpendicular to direction of displacement) for attachment of the sensor to the device producing the displacement to be measured. The elevation per FIG. 32 is shown in FIG. 33. Thermal compensation technique will be described in more detail further down the description.

With reference to FIG. 34, scale illustrated wherein a representative peak strain sensor in accordance with the present invention is displayed alongside a traditional ruler (with millimeter resolution) indicating the scale at which certain embodiments of the present invention can operate. The sensor has plastic housing 120 with hermetically sealed gold plated contact pads 121 (which represent test points A, B and C per FIG. 14) and a battery's (not shown) cover 122.

Turning to FIGS. 35 and 36, a plan and elevation view of one embodiment of a MEMS sensor is illustrated. In this embodiment, a substrate 20 supporting an electric circuit 1 and MEMS device layer with arrays 2 of deformable members (not shown) having a central displacement hole 14, is mounted to an underlying mounting body or base 40. Mounting body 40 has a first end 42 and a second end 44 that are fixed to an underlying support structure 46.

The mounting body 40 has positions 123 for placement of standoffs 124 which are shown in more detail further down in FIG. 37. These positions 123 belong to one part of the body 40, thus any deformation of the support structure 46 does not cause any stress on the elements on internal circuitry which are attached to it and therefore provides for free deformation of the mounting body 40.

It is contemplated that in some embodiments of the present invention first end 42 is movable relative to second end 44 such that mounting body 40 can contract or expand in concert with the expansion or contraction of the underlying support structure 46. This can be achieved in a number of ways. For example, a number of slots can be provided in mounting body 40 that permit first end 42 to move relative to second end 44, however other arrangements are also contemplated including hinges or pivoting joints that can be incorporated in mounting body such that first end 42 can move relative to second end 44, thereby transferring the expansion or contraction of the underlying support structure 46 to the deformable members of the MEMS sensor, thereby permitting measurement of strain and displacement in the underlying support structure 46.

As seen in FIGS. 35 and 36, in this embodiment mounting body 40 has a pair of opposed, inwardly projecting slots 50, a pair of opposed, internal longitudinal slots 52 that longitudinally extend across body 40. Each internal longitudinal slot 52 has a first laterally extending slot 54, longitudinally extending slot 56 and a second laterally extending slot 58. Body 40 also has an internal, laterally extending internal slot 60.

The substrate 20 is connected to the body 40 preferably at its centerline using bounding compound 125 during the assembly of the sensor. Again, mounting substrate this way provides for its free expansion or contraction due to temperature fluctuations without imposing any stress on the mounting body 40.

As will be discussed in further detail below, this arrangement allows for the body 40, to be able to deform (and subsequently measure via displacement of the MEMS sensory means) both compression and tension.

FIG. 37 illustrates the elevation of at least one embodiment of a self-contained MEMS Health & Usage Monitoring System (HUMS). In this embodiment, base 40 has two posts 42 and 44 spaced apart and attached to the surface 46 of test structure (for instance an aluminum alloy part of an aircraft) by means of glue. The strain in the test structure is converted into displacement Δ over the active length Ls of the base, i.e., $\Delta=\varepsilon*Ls$ wherein ε is the strain.

Standoffs 124 hold the printed circuit board 126 with all electronic circuitry needed for operation of the HUMS, namely, but not limited to: battery 127, CPU, MCU, FPGA or CPLD 128, F-Ram or other type of memory 129, interface and/or wireless transceiver (not shown) and connector 130. All devices are mounted inside housing 131 which is hermetically sealed. During mounting process, the housing 131 is glued to the surface 46 as well as sealing deformable compound (silicone sealant, for instance) 132 applied previously (during gauge manufacturing process) or during installation of the gauge is provided to ensure that interior volume of the sensor is not affected by moisture, dust or debris.

Further, detail A is shown to clarify on possible installation techniques described in more detail in the following FIGS. 39-41.

FIG. 38 illustrates the construction of the base 40 and positioning of the MEMS sensor 133 relative to it. Flexible hinges are formed in the base by providing slots in its structure (by laser cut or water jet cut technique, for example) as discussed above in relation to construction of base 40 and possible ways of providing its deformability described previously in FIG. 34, therefore providing for ability of one part of the base to move against another part without much stress imposed on the attachment layer (glue, in this instance) between the posts and the surface. A central pin 22 is provided that can move relative to the sensor in order to transmits the relative displacement Δ of the support structure to the MEMS sensor.

A housing 131 and elastic seal 132 are glued to the structure, preferably in one step with gluing the posts 42 and 44. Connector 130 provides for a wired interface (such as, for example, RS-485). As mentioned, the printed circuit board 126 is connected to the base 40 via standoffs 124 in a such way that the attachment does not compromise the freedom of two parts of the base to move one relative to another, i.e. all of them are connected to one part of the base (see attachment points indicated in FIG. 38). The circuitry in its generic configuration contains power supply (battery, power harvesting means, super capacitor, etc.), processing means (microcontroller, for instance), memory means, sensor signal conditioning means and interface means (wired, wireless, optical fibre, ultrasound, light emitting and/or receiving, etc.). The wireless module can be part of the housing 131 and have its antenna incorporated into the printed circuit board 125 (as an example) as well as it can be a stand alone unit with its own power supply or connected to an onboard power. The stand alone wireless transceiver can be connected to the gauge via cable using connector 130 and the two module can share communication protocol as well as power supply or power harvesting means.

The nodes structure can also be employed to collect data from a number of strain gauges and transmit data via a dedicated transceiver or wired interface (parallel, or serial, One-Wire™, for instance).

A variety of attachment options are presented in the following illustrations: In FIG. 39 the sensor is attached to the underlying support structure 46 by gluing directly to the surface of the tested structure using suitable bonding compound 136. In FIG. 40 the sensor is attached to the underlying support structure 46 by a fastener 138 connected to a pad 137 attached to the tested structure or, alternatively, directly to the support structure 46. In FIG. 41 the sensor is attached to the underlying support structure by frictional force produced, for example, by a magnet 139. In embodiments where frictional attachment is employed a special coating 140 can be applied to the interface between the sensor base and tested structure surface to increase the friction therebetween, such as an abrasive coating, for instance (diamond, aluminum oxide, etc.). In addition, the base 40 or any integral part of the gauge can be used to facilitate magnetic flux (preferably create a closed loop) and reduce the size of the magnet's 139 while achieving sufficient attraction force necessary for providing adequate friction. It is contemplated that these variants are examples only, and accordingly one skilled in the art can employ a variety of permanent and removable methods of attachment including snap means, positioning means, and affixing means, as will be readily understood by the skilled person.

It is contemplated that a wide variety of mechanical amplification means can be employed in connection with present invention including sloped beams 141 (single or arranged as parallelogram mechanisms) with hinges or flexural hinges 142, as shown in for example in FIG. 42. In some embodiments strain is transformed into relative displacement of pads 143 that can be amplified via sloped simple or parallelogram beams and the resulting displacement is acting to create contact state in two arrays 2 of cantilevers 4. As also discussed above, the substrate has pre-cut slots 52, 54, 56, 58 and 60 to allow relative movement of the two parts 143 of substrate 40 (in this particular case the substrate 20 previously mentioned is acting as body 40) while maintaining its physical integrity.

Turning to FIG. 43, the back view of the sensor is illustrated in more detail.

Turning to FIG. 44, details of the elevation A-A per FIG. 42 are illustrated wherein the tested structure surface 46 and substrate 40 are connected to one another using bond 145 (adhesive glue) and an elastic layer 146 can provide a hermetic seal of the sensor in its part affected by slots. The elastic layer 146 can also be made in a form of protective film which has openings allowing for bond 145 to be present active only at areas of pads 143 attached to the base (substrate) 40. In this case the substrate 40 acts as the deformable base of the sensor and device layer 147 has mechanical amplification means (beams 141 with pads 143 and shuttle 148), cantilevers 4 and other components necessary for operation of the sensor. The cover 150 is deformable to provide freedom of movement for the parts of substrate and also can be adapted in order to provide a hermetic seal. The inner volume 151 of the sensor can be filled with fluid (inert gas, dielectric fluid, for instance) or contain vacuum. The cover 150 has a bond 152 connecting it to the device layer 147 or substrate 40 or both.

As most mechanical amplification mechanisms are non-linear, compensation for that effect can be done assuring variable size gaps between cantilevers as described in FIGS. 45 and 46. In general, the case of sloped beam gives the following relation between the displacement of the sensor driver $\Delta$ and the strain $\varepsilon$ of the tested structure:

$$\Delta = a - a_o = (((L/2)^2 + a_o^2) - (L/2 - \varepsilon \ast L/2)^2)^{0.5} - a_o,$$

where "a" is the height of the sloped beam after deformation of the tested structure and "$a_o$" is the height of the sloped beam at initial state.

The principle of thermal compensation of the MEMS sensor is illustrated in FIG. 47a) (sensor geometry before thermal expansion) and FIG. 47b) (sensor geometry after thermal expansion). The deformation in vertical direction (axis Y) does not affect sensor's sensitivity, however the deformation in horizontal direction (axis X) changes the distance between cantilevers 4 and the thickness of the cantilevers tips, thus introducing an error.

Taking a close look at the state of two adjacent cantilevers 4 as shown in FIG. 48 we can define that the distance of first cantilever X1 and the second cantilever X2 after thermal expansion (here, thermal expansion is used only for illustration, it is understood that thermal contraction will also take place under sensor usage conditions) will become:

$$X_1' = X_1 + Ks \ast \Delta T \ast X_1 = X_1 \ast (1 + Ks \ast \Delta T);$$

$$X_2' = X_2 + Ks \ast \Delta T \ast X_2 = X_2 \ast (1 + Ks \ast \Delta T),$$

Where:
Ks is coefficient of thermal expansion of the substrate the cantilevers 4 are anchored to;
$\Delta T = T_2 - T_1$ is temperature difference between the final and initial state of the sensor, °C.

Accordingly, the thermal deformation of the cantilevers in direction of axis X itself will be:

$$t_1' = t_1 + K \ast \Delta T \ast t_1 = t_1 \ast (1 + K \ast \Delta T);$$

$$t_2' = t_2 + K \ast \Delta T \ast t_2 = t_2 \ast (1 + K \ast \Delta T),$$

where "t" is the initial thickness of the cantilever in direction X;
K is coefficient of thermal expansion of the material of cantilevers.

Therefore, the final size of the gap $\delta_o'$ will be:

$$\delta_o' = X_2' - t_2'/2 - X_1' - t_1'/2$$

$$\delta_o' = X_2 \ast (1 + Ks \ast \Delta T) - t_2 \ast (1 + K \ast \Delta T)/2 - X_1 \ast (1 + Ks \ast \Delta T) - t_1 \ast (1 + K \ast \Delta T)$$

or, if $t_1 = t_2 = t$ $$\delta_o' = X_2 \ast (1 + Ks \ast \Delta T) - X_1 \ast (1 + Ks \ast \Delta T) - t \ast (1 + K \ast \Delta T)$$

Thus, the condition of unchanged gap (full thermal stability) will require the following equation to be observed:

$$\delta_o' = \delta_o$$

Where $\delta_o = X_2 - X_1 - t$ $$X_2 \ast (1 + Ks \ast \Delta T) - X_1 \ast (1 + Ks \ast \Delta T) - t \ast (1 + K \ast \Delta T) = X_2 - X_1 - t;$$

$$X_2*Ks*\Delta T - X_1*Ks*\Delta T = t*K*\Delta T;$$

$$X_2*Ks - X_1*Ks = t*K;$$

$$K/Ks = (X_2 - X_1)/t.$$

If $b=(X_2-X_1)$ represents the spacing between cantilevers and t is the thickness of the cantilever, i.e. $b=t+\delta_o$, the ratio K/Ks is close to 1. For example, if $t=20$ μm and gap $\delta_o=2$ μm, the ratio $$K/Ks = (20+2)/20 = 1.1.$$

In many embodiments the substrate and cantilevers are made of silicon crystal (SIC) or polycrystalline silicon (polysilicon). If the substrate is made of SIC where coefficient of thermal expansion Ks=2.6 ppm/° C. and the device layer is composed of polycrystalline silicon where coefficient of thermal expansion K=2.8 ppm/° C., the desired ratio K/Ks=2.8/2.6=1.08~1.1 is approximately achieved and gives the nearly perfect thermally compensated MEMS sensor for the example of sensor geometry used here above.

Another combination of materials can be Alumina for the substrate (Ks=5.4 ppm/° C.) and Ruthenium for cantilevers (K=6.4 ppm/° C.), therefore K/Ks=6.4/5.4=1.18 and so on.

In addition to the embodiments disclosed herein, alternative approaches that will be readily appreciated by the skilled person are also contemplated for use in connection with the present invention including thermal compensation techniques by design, thermal compensation by acquiring temperature readings at continuously or at pre-determined time intervals and electronic compensation for the signal read from the sensor output are provided for in the present invention as will be described in more detail later.

It is contemplated that there are numerous variants of use of the present MEMS sensor. For instance, a sensor configured to measure shear deformation is shown in FIG. 49 where the shear strain is transformed into displacement activating contact state between cantilevers 4 and drive member 10.

Another embodiment of the MEMS strain sensor is a rosette as shown in FIG. 50. The rosette allows for simultaneous measurement of all planar vector components of the strain (stress) at given point of measurement not unlike in a conventional strain gauge rosette. In this particular arrangement the sensor has a base 40 with flexural pivoting points allowing for its deformation and attachments 160 and 161 wherein the attachment 161 in the center of the base 40 is not always necessary as the strain vectors can be assessed through measurement of the relative displacement of only three points (160).

A variety of arrangements of flexible contact members vs. drive member is presented in FIGS. 51 to 56. Several layers of cantilevers' arrays can be positioned with an offset ξ relative to each other thus increasing overall sensitivity of the device while providing a manufacturability wise possible gap $\delta_o$ between adjacent cantilevers 4. Alternatively, an array of single cantilevers positioned in several layers with the offset ξ can be used as shown in FIGS. 53 to 54. Yet another arrangement can include multi-layer cantilevers positioned without offset between them but having drive member 10 with step-like profile to achieve sequential contact at different displacements of the drive member 10 as shown in FIGS. 55 to 56.

It will be appreciated that a combination of the above techniques and arrangements can be used by one skilled in art and also employing a variety of techniques available for manufacturing of MEMS devices.

The MEMS sensor can be arranged to receive an angular movement of the drive member as shown in FIGS. 57 to 58.

Yet another approach is to provide MEMS sensor where spacing between cantilevers can vary on one side of the array compared to another side thus providing for sequential contacts during movement of one array against another (FIGS. 59 to 60) utilizing so-called Vernier effect and thus providing for higher resolution of the sensor while keeping the majority of the gaps between cantilevers large enough to use lower aspect ratio MEMS etching techniques. The same approach can also be used in providing a sensor capable of encoding the displacement into a sequence of binary output signal not unlike rotary encoders work.

Sequential contact between deformable members made, for instance in a form of stacked bridges being bent as shown in FIGS. 61 to 62 can also be achieved.

Still, the sequential contact can be achieved by collapsing or buckling of cantilevers having different length as shown in FIGS. 63 to 64.

Sequential contact state between drive members and deformable contacts (or vice versa) can be achieved given an example shown in FIGS. 65 to 67. In this particular case the MEMS sensor contains an array of individual drive members and deformable members arranged in a such way that the size of the gaps between them in each member of an array is different. Thus the contact state is achieved at each individual member of an array at different strain level of the substrate. Given the length $L_o$ between the anchoring point of a drive member and the center of the deformable member is the same (it may vary) during compression of the substrate attached to a test structure (FIG. 66) and during extension of the substrate (FIG. 67) the contact state corresponding to a particular level of strain can be detected via acquisition of the contact state of each individual member (drive member and deformable member. In this particular instance, either the drive member or deformable member or both can have electro-conductive surface on each side facing each other and independent from another member of the array.

It will be appreciated by one skilled in the art that significant scaling down of the MEMS sensors described is achievable. Going to nano-scale systems the complete sensor (including its variants for detecting/recording volume strain caused displacement (3D) or multi-axial acceleration forces, pressure, loads, etc.) the volume as small as 1 mm³ can contain up to 4 arrays on deformable members providing resolution of 1000 displacement states and higher. Even with today's technology this task is achievable without much modification to the manufacturing process. Going further, such systems as microphones and sound amplifiers driven by signal digitized directly by sensor into discrete but undetectable for ear levels can lead to systems eliminating amplifier at all, thus providing for conversion of a displacement into much amplified signal directly, using digital technology.

The term "state of the contacts" in present invention should be represented in a broad fashion, i.e. it can be manifested as an electrical contact providing lower resistance (Ohmic) circuit between electro-conductive layers, using electron-tunneling effect, change in vibration state of a particular deformable member of an array, its thermal conductivity or temperature state, etc. Thus any combination of the technologies applicable for detection of the state of the contact can be applied per present invention.

"Driving member" shall also be broadly interpreted as a rigid or flexible member that may comprise a plurality of cantilevers or other means as illustrated in FIGS. 59-60, for instance.

As sensor sensitivity is of major importance, a variety of calibration techniques can be envisioned. For instance a removable attachment of the MEMS strain sensor to a calibration beam (not unlike calibration of the batches of strain gauges is done) by removable adhesive, frozen water or another substance, fasteners, friction, etc. Thermal sensitivity calibration can be also done and a specific correction parameter entered into MEMS sensor data acquisition system to ensure temperature correction.

Turning to acceleration sensitivity of the MEMS sensor the following example illustrates that an array of cantilevers 600 µm long with cross-section of 20 by 20 µm and gap between cantilevers of 2 µm can withstand acceleration in the plane of the array of up to 5000 G without causing closure of any gap between cantilevers.

In this particular instance, given the cantilever is formed from polycrystalline silicon with density of 2.33 g/cm2 or 2.33×10−6 µg/µm3 the mass of its free length is $$m=20*20*600*2.33\times10^{-6}=0.56\ \mu g=0.56*10^{-9}\ kg.$$

The distributed load on cantilever beam from acceleration will be:
W=m*a*(G=9.82 kg/m²)/L, where a is acceleration, L is the free length of the cantilever beam.
Therefore the load will be:

$$W=a(G)*0.56*10^{-9}\ [kg]*9.82\ [kg/m2]/600*10^{-6}=a(G)*9.15*10^{-6}\ [N/m]$$

Maximum deflection of the free end of the cantilever beam is:

$$\Delta c=W*L^4/8/E/I,$$

where E is modulus of elasticity (Young's modulus) of polycrystalline silicon and I is moment of inertia of the cantilever beam cross-section (note, that the practical thickness of the polycrystalline silicon layer is typically much less than 20 µm, we use this example as explanatory only).
E=155 GPa or 0.155 N/µm²
I=20*203/12=13333 µm⁴=1.33*10–20 m² (for the rectangular cross-section)

$$\Delta c=a(G)*(9.15*10^{-6}\ [N])*0.00064\ [m^4]/8/155*109\ [Pa]/1.33*10^{-20}\ [m^4]=a(G)*7.19*10^{-11}\ [m]=a(G)*7.19*10-5\ [\mu m].$$

Thus, at acceleration a(G)=5000 the total deflection of a single cantilever will be
Δc=5000*7.19*10⁻⁵=0.35 µm, which is less than a gap of 2 µm.

Turning now to stress condition of the cantilever beam at acceleration of 5000 G (which is higher than current specification from EUROCAE—European Organisation for Civil Aviation Equipment—requires for an airplane flight recorder to withstand the acceleration of 3400 G), the maximum bending stress at anchored part of the cantilever beam is:

$$\sigma=W*L^2/2I*h/2,$$

where h=20 µm=20*10⁻⁶ m is the height of the cantilever cross-section.
Thus:

$$\sigma=5000*9.15*10-6*0.0006\ [m]^2/2/1.33*10^{-20}\ [m2]*20*10^{-6}\ [m]/2=6.19*10^6\ [Pa]==6.19\ MPa,$$

which is much less than the fracture strength of the polysilicon conservatively estimated at 1.5 GPa.

For reduction of shock effect of the strain on sensor base 40 the best methodology is to reduce its size so that stress on attachments of the sensor to a test structure can be reduced. To that extend it is desirable to further scale down the MEMS sensor and provide better sensitivity to a displacement.

As an example the length of cantilever beams can be reduced to 100 µm, its height h to 4.75 µm and its width to 2 µm. Thus, with current technology the size of the gap between cantilevers with aspect ratio of deep etching 10 (conventional technique) can comprise 0.475 µm and with aspect ratio of 100 it can go down to 0.0475 µm. Given the sensor resolution of 1% it will require two arrays of cantilevers with 100 cantilevers on each side of the shuttle (drive member). With shuttle width 500 µm, the overall size of the MEMS sensor will be: Width 200*(2+0.00475)+500=901 µm and the height (including anchoring pads of 20 µm long) will be 2*(100+20)=240 µm. With reasonable size of the substrate allowing for electric circuits, resistor's matrix, fuses, temperature sensor and other devices, like integrated CPLG or FPGA the overall size of the MEMS sensor can be as little as 1×0.5 mm.

The total displacement cumulated when all gaps are closed will be 100*0.475=47.5 µm (aspect ratio 10). Given modulus of elasticity of aluminum alloy of the test structure be in a range of 71.7 GPa (Al Alloy 7075-T6) and maximum expected level of strain of 500 MPa, the sensor base length required will be only Ls=47.5/500*(70*10+3)=6650 µm=6.65 mm.

Thus, with further scaling down by integration of electronic components in forms of dies or components integrated directly on the MEMS sensor substrate (or on a substrate sandwiched and wired with it, for instance) the complete strain sensor with data acquisition, processing and data storing means can comprise a package approximately 5 mm wide, 9 mm long and 2 mm high, which is comparable with the size of an ordinary stand alone resistive strain gauge.

As it was mentioned before, by varying size of the deformable members of the arrays different response to the force required to achieve the displacement can be achieved: linear, non-linear, etc. Due to possibility of varying the sizes of gaps between adjacent deformable members this response can be further augmented.

Due to a variety of possibilities to producing a wake up signal when the state of the contacts changes (by acquiring state of the contact, comparing current value of displacement with previous one—either digitally or in analog format, etc.), it is contemplated that the present invention provides for an extremely low power consumption device that is mechanically stable and can be temperature compensated for a broad range of temperatures. The inner volume occupied by the MEMS sensor can contain vacuum, dielectric fluid, gas or a combination of any substances facilitating precision of recognition of contact state between parts of the sensor affected by displacement (preservation of electric contacts from oxidation, for instance), providing vibration damping effect, eliminating or reducing stickiness problem between adjacent micro and nano-scale parts, improving the overall durability and performance of the sensor, etc.

The variants of the possible arrangement of the deformable members into arrays are numerous and one skilled in art can come up with a number of practical solutions.

Without limitations, embodiments included herein can include bridge beams as shown in FIG. 68, nano-wires or strings as shown in FIG. 69, membranes as shown in FIG. 70, interlaced cantilever beams as shown in FIG. 71, among other arrangements that will be readily appreciated by the skilled person.

In order to avoid the stickiness problem that results from attraction forces customary for nano-devices it is contemplated that the contacting ends of the deformable members (cantilevers, for example) can have dimples. Plain rounded ends of cantilevers 4 are shown in FIG. 72, symmetrical dimples which can also facilitate linearity of the sensor output (by providing a special shape to the dimple to compensate for cantilever tip displacement along its length during bending) are shown in FIG. 73, dimples interlaced with plain tips are shown in FIG. 74, as well as asymmetrical dimples are shown in FIG. 75. It is important to mention that such elements, when employed as beams or membranes, can also have dimples or special provisions for reduction of stickiness and improvement of the resolution and recognition of the contact state between deformable members of the MEMS sensor.

Turning now to different embodiments of the deformable member itself, FIG. 76 illustrates a cantilever 4 with an opening providing for parallelogram-type movement of the tip of the cantilever, thereby reducing its resistance to deflection while maintaining the original orientation of the tip of the cantilever. In this way, the tip is moved in a parallel fashion contrary to inclination due to bending.

A variety of means to provide electro-conductive surfaces on different sides of the deformable member can be illustrated by an example given in FIG. 77. Here, each side of the cantilever 4 can have isolated electro-conductive coatings 170 and 171, each terminated separately at the clamped end of the cantilever 4 by a circuit 172.

Alternatively a Piezo-active material 175 can be applied to any part of deformable members for a number of reasons, such as, but not limited to: in order to harvest the energy from deformations received; by inducing vibrations of the deformable member for detection of the state of the contact (as seen in FIG. 78), among any other arrangements that will be readily understood by the skilled person.

It is further contemplated that is some embodiments power harvesting devices can be incorporated into the base of the strain sensor as shown in FIG. 79 by applying Piezo-Electric elements 175 on parts of the flexures of the base affected by deformations resulted from strain. It is also apparent, that such devices can be also applied to flexures of the contact as shown in FIG. 80.

Turning now to a discussion of suitable manufacturing techniques and in order to achieve smaller size gaps (which, as will be readily appreciated by the skilled person, defines the resultant MEMS sensor resolution) the height of the cantilever beam can be made differently, i.e. reduced at the portions of the cantilevers defining the gaps wherein, with given aspect ratio of etching the smaller gaps can be achieved as shown in FIG. 81. In order to avoid twisting the cantilever due to asymmetrical application of the load, the step-wise height reduction can be symmetrical, i.e. the contact point can be positioned close to the middle of the beam height. Alternatively, the cross section of the beam itself can depart from rectangular shape in order to align its center of rotation with the line connecting contact points and therefore reduce twisting effect.

As mentioned previously, the contact states can be recognized via electric (Ohmic resistance) or, alternatively, by other means. In embodiments employing electric contact recognition, the sensor can have a variety of circuits associated with deformable members such as capacitors connected in parallel between the deformable members (as seen in FIG. 82), resistors connected in parallel between deformable members (as seen in FIG. 84), resistors 180 connected in series or being part of the deformable member (doped silicon, for instance or metal film or another type resistor formed on the surface of cantilever 4, etc.) as shown in FIG. 86, as well as capacitors 181 connected in series with deformable members or being part of it as shown in FIG. 88. Accordingly, FIGS. 83, 85, 87 and 89 represent various outputs of these different configurations either in a format of change of capacitance (FIGS. 83 and 89) or resistance (FIGS. 85 and 87).

Another embodiment of a MEMS sensor output is direct digital output as schematically shown in FIG. 90. This generic representation deals with possibility of providing a direct digital output from the MEMS sensor. In a simplest configuration the cantilevers 4 can be connected directly to I/Os of a microcontroller or a CPU. To provide more compact and robust device, the MEMS outputs (cantilever contacts) can be connected to an encoder of Complex Programmable Logic Device (CPLD) which is shown in more detail in the above FIG. 90. Further, FIG. 91 describes signal diagram of such arrangement where Channels 1 to 3 represent 3-bit binary output of the MEMS sensor vs. displacement. Particularly, when the driving electrode 10 connected to $V_c$ via a pull up resistor 100 (the practical value of which can be in a range of 10 KOhms to 10 MOhms) closes the first gap at distance δ the output of the CPLD will be programmed to show range of displacement "1" (001 in binary code). At displacement equal to 2δ the binary output becomes 010 which indicates displacement range "2" and so on. The output of the MEMS sensor can be in a form of parallel or serial data or a combination thereof, including a combination with any analog signal which might be of essence (temperature, humidity, pressure, state of contacts, etc.). It is important to understand than not only drive member can supply $V_c$ voltage to drive such circuit but also any deformable member can be either grounded or under controllable voltage or multiplexed in order to provide a digital output. In addition, the drive member can be in form of any cantilever itself in which case the electro-mechanical encoding of the output signal becomes possible, i.e. the range of displacement can be divided into several groups wherein each group of cantilevers will act to produce its output suitable for representing either binary or other format by design. These arrangements are not described in detail in the present application, but are claimed as useful.

The program and algorithm of operation embedded into CPLD, FPGA or CPU/MCU can detect and discard false states of the MEMS sensor, such as presence of two contacts states on opposite arrays 2 simultaneously (can be caused by sticky contacts, for instance), presence of open contacts within the range of displacement when all contacts are supposed to be closed, etc. This further enhances the MEMS sensor capabilities, increases its durability and reliability of data.

An instance of a standard stand alone MEMS displacement sensor therefore can include MEMS device with 50 contacts on each array of deformable members (50 ranges for compression and 50 ranges for tension or negative/positive displacement), and integrated CPLD with 8 bits parallel output providing for accurate detection of each range of the displacement and consuming as little as 100 nA of current. A digital comparator can be used to provide state of contacts' information for providing data processing and interrupts only when the state of the contacts changes, which further reduces power consumption related to operation of CPU/MCU and memory.

In some embodiments, it is contemplated that the deformation of the cantilevers or any other type of deformable members itself can be used to produce electric signal given the deformable member has a Piezo-Electric element associated with it, i.e. has Piezo-electric and/or Piezo-resistive effect used in generation of a digital or analogue output signal and self powering the circuitry or any suitable combination thereof. Electron charge carried by a cantilever can also be utilized to provide indication of the state of contact which should be apparent for one skilled in art. Also, common techniques used in tunnel microscopy to detect contact or proximity state between deformable members of MEMS array can be utilized to the advantage of present invention. Lastly, as elaborated on before vacuum or gas or fluid filling of the MEMS sensor can be of use to provide effects necessary for MEMS sensor stability (electrical, for instance by protecting contacts from oxidation, corrosion, erosion), damping effect to reduce possible vibration of the cantilevers at certain frequencies (fluid can be used), provide anti sticking effect which may assist in scaling down the MEMS sensor size and bring it to nano-scale, electrical conductivity which can be achieve in vacuum or by ionized fluid (gas or liquid), etc.

At least one embodiment arrangement for a Health & Usage Monitoring System (HUMS) is presented in FIG. 92. A wireless transmitter of any suitable type can be either part of the sensor housing or, alternatively, be an independent module communication to the HUMS system by means of interface. The latter combination is desirable for instances where wireless communication is not desirable, i.e. stealth aircrafts or aircrafts with sensitive electronic equipment for instance and where presence of a sensor with wireless means can be positively identified.

FIG. 93 presents yet another embodiment of the present invention wherein the MEMS sensor output is in digital format and the sensor communicates directly with I/Os of the micro-controller unit, CPLD or a combination thereof.

The wake up signal can be generated by additional circuitry called the "Contacts' State Detector" which will be further described in FIG. 98 or alternatively it can utilize a microcontroller signal comparator to compare the last and current signals received from the MEMS sensor and thereby create a wakeup state. As will be readily understood by the skilled person, a wake-up state is desirable for controlling sleep modes of the device which in turn can prolong the battery life by reducing power consumption during periods of non-use. In this particular embodiment, the battery can be a Li battery with an initial voltage exceeding 3V so that at low temperatures (−55° C., for instance) the voltage drop experienced due to low temperature performance inefficiencies will be in the range of 2.9-3V. One example of a suitable lithium battery can be Primary Lithium-Thionyl-Chloride battery or a 3.6V high capacity, single cell lithium battery available from a plurality of sources as well as other power arrangements that will be readily appreciated by the skilled person.

In other embodiments, a low power Field Programmable Gates Array device (FPGA) can be used to compose the HUMS architecture, as illustrated in FIG. 94. In this embodiment, it will be appreciated this arrangements allows for a simple, and therefore reliable device architecture.

A number of possible positions for peak strain sensors and HUMS sensors when oriented on a commercial aircraft are shown in FIG. 95. Preferably, in at least one embodiment the peak strain sensors can be mounted on parts and components where overloading can occur, such as, for example, on the landing gear, engine pylons or during a hard landing, among other arrangements that will be readily appreciated by the skilled person.

On the contrary, it is contemplated that the strategic positioning of the HUMS sensors can be where fatigue damage accumulation can occur and where the prediction of a particular component's life can be essential for both aircraft safety and the potential reduction of maintenance costs.

It is contemplated that the positioning of the sensors can preferably be symmetrical and positioned on both sides of an aircraft. In addition, the parallel use of sensors at one given point can increase sensor's reliability and provide better assurance for consistent and reliable data.

It is contemplated that the devices described in the present invention can be used in a variety of modes, such as but not limited to:

a) stand alone data logging systems;
b) stand alone data logging and processing systems;
c) sensors connected to aircraft data acquisition systems;
d) stand alone peak stress sensors;
e) MEMS displacement sensors responding to changes in, for example, direct displacement or strain, displacement caused by acceleration or shock, displacement caused by temperature, displacement caused by inertial forces (rotation for instance) and displacement caused by vibration or acoustic waves.

Turning now to data processing apparatus and algorithms of operation, FIG. 96 shows a typical diagram of strain history in aircraft element. Turning to FIG. 97, the same signal is illustrated as "seen" from the MEMS sensor analog format output per the present invention wherein step-like signal follows the actual shape of the strain change diagram.

One potential embodiment for producing a wakeup signal by differentiating the steps in voltage output of the MEMS sensor is shown in FIG. 98. Part of the raw signal received from the MEMS sensor is shown in FIG. 99*a*) and the corresponding spikes formed by the circuitry shown in FIG. 98 is shown in FIG. 99*b*). These spikes can be further conditioned into wakeup pulses, as shown in further detail at FIG. 101*b*).

As will be understood by the skilled person, when considering a wakeup signal the exact time dependent analysis of the overall strain history is irrelevant for the estimation of the fatigue life time, and accordingly the raw signal can be compressed into "sorted events" as presented in FIG. 100.

It is further contemplated that time stamps can be associated with specific events, such as but not limited to temperature changes, reaching peak or pre-determined values, accumulation of specific number of strain cycles, among other specific events that will be readily understood by the skilled person and as illustrated in FIG. 100 and shown in comparison with the raw signal which is time dependent. This compression or "sorting" can assist in the simplification of the data processing algorithm without departure from the precision of the data and results of the analysis.

Figure 101:
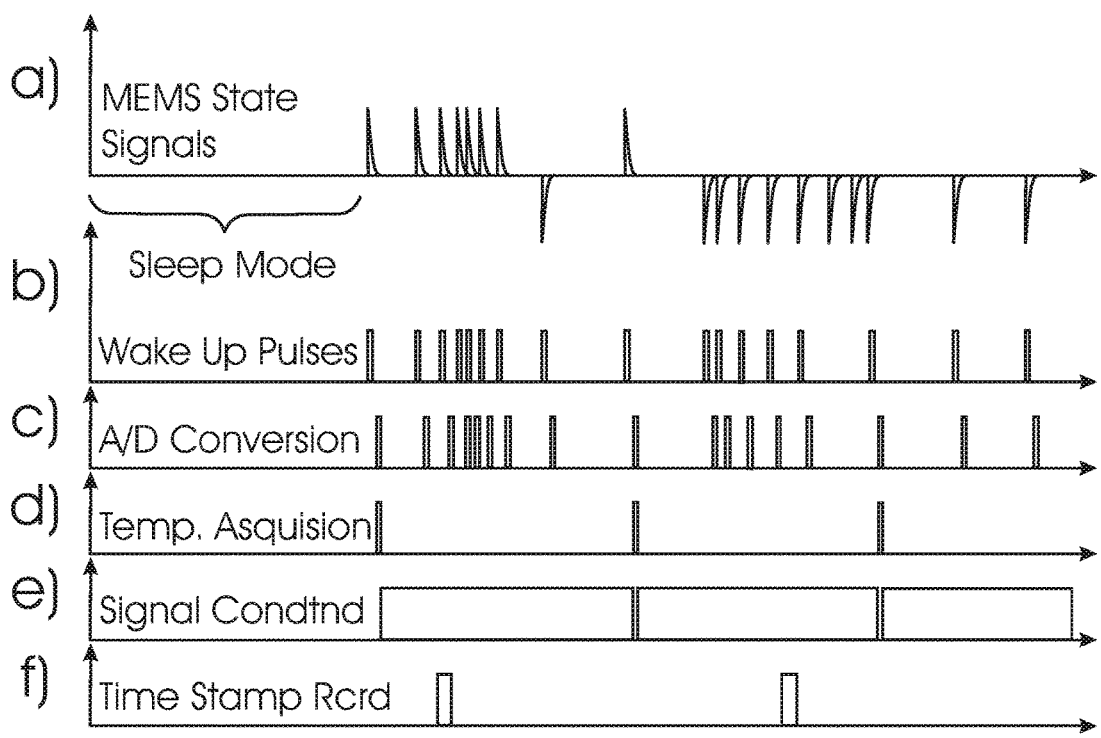

An example of one embodiment of a data processing scheme is illustrated in FIG. 101 where it is shown that analog-to-digital conversion can take place immediately after receiving the wakeup pulse which can result in a reduction of power consumption and further can eliminate the need for constant sampling of the signal, as seen in FIG. 101*c*).

It is also contemplated that the temperature sensor data acquisition can be linked to events or predetermined periods of time, which can preferably allow for optimum adjustment of the MEMS sensor output signal for its accuracy. Although as it has been previously discussed that the present MEMS sensor can provide excellent temperature stability by design, in some embodiments it is desirable to periodically condition the raw signal and provide for even better temperature compensation for increased accuracy. It is contemplated that this could greatly improve sensor's accuracy in such severe conditions as space missions where temperature can vary in a much greater range.

One embodiment of a preferred algorithm for data processing for use in connection with the present invention is the so-called "Rainflow" algorithm shown in FIG. 102. Without going into details of its principle which are well known and will be readily appreciated by the skilled person, the final data stored on board of the HUMS can be represented in a format of a table shown in FIG. 103.

This resultant stored data can include mean values of ranges of the strain (between peaks and valleys) defined by horizontal rows and ranges of the strain (between peaks and valleys) defined in vertical columns. Each bin of the table can contain a count of particular events. In addition, the table contains absolute peaks of tensile and compressive strain (or stress) and other parameters which can be of use.

Due to the processing of information on board of the HUMS in accordance with the present invention and signal discrimination automatically performed by the MEMS sensor, the overall system can be greatly simplified and, based on the power consumption of presently existing electronic components, the working life of autonomous operation of the sensor can be extended for an extended period (and in some instances for up to 10 years) without battery replacement. Alternatively, available power harvesting devices and connection of the HUMS to the on-board power system can provide for a variety of flexible solutions which are well suited to applications in the aerospace and other related industries.

A simplified algorithm of processing of data on board of the HUMS equipped with MEMS sensor per present invention is described in FIG. 104, which well be readily understood by the skilled person and represents only one out of many possible arrangements that are contemplated for use in connection with the present invention and is provided herein for illustration purposes only and it is considered that various modifications and variations can be made to the present invention without departing from the scope of the presently claimed subject matter.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

The invention claimed is:

1. A MEMS displacement sensor comprising:
   a. at least one array of deformable members spaced apart in a pre-determined fashion;
   b. at least one driving member positioned in spaced relationship related to said deformable members, wherein said at least one driving member moves in a direction of displacement; and
   c. an electronic circuit, being in communication with said at least one array of deformable members and said at least one driving member,
   wherein said electronic circuit changes at least one of electric properties of said electronic circuit relational to said displacement as said displacement of said at least one driving member causes a sequential electric contact between adjacent deformable members of said at least one array of deformable members.

2. The MEMS sensor of claim 1 wherein said deformable members are chosen from a group consisting of cantilevers, beams, bridges, membranes, wires and nano-tubes.

3. The MEMS sensor of claim 1 wherein said at least one driving member is hermetically sealed within said MEMS sensor.

4. The MEMS sensor of claim 1 wherein said at least one driving member is connected to a mechanical displacement amplifier.

5. The MEMS sensor of claim 1 wherein at least one of said deformable members has a provision for mechanical memory of its shape after deformation.

6. The MEMS sensor of claim 1 wherein at least one of said deformable members is electro-conductive.

7. The MEMS sensor of claim 6 wherein said conductive property is achieved through doping of Silicon.

8. The MEMS sensor of claim 6 wherein said conductive property is achieved through use of electro-conductive coating or metal film, for instance.

9. The MEMS sensor of claim 1 wherein said electronic circuit is integral with said MEMs sensor.

10. The MEMS sensor of claim 1 wherein said sensor's output is chosen from a group consisting of: resistance, capacitance, voltage or electric charge.

11. The MEMS sensor of claim 1 wherein said at least one array of deformable members and said at least one driving member are connected to a deformable base providing the displacement of said at least one driving member relative to said at least one array of deformable members.

12. The MEMS sensor of claim 11 wherein said deformable base is part of an enclosure for said MEMS sensor.

13. The MEMS sensor of claim 1, wherein said electronic circuit comprises resistors, capacitors, fuses, or a combination thereof.

14. The MEMS sensor of claim 1, wherein said displacement is caused by one or more of, or combination of mechanical strain, acceleration, pressure and temperature.

15. The MEMS sensor of claim 1, wherein said electronic circuit is integral with said MEM sensor, said electronic circuit comprising one or more of, or a combination of a micro-processor, a memory, a clock, and a temperature sensor.

16. The MEMS sensor of claim 15 wherein, the MEMS sensor comprises a structural health monitoring system.

17. The MEMS sensor of claim 1 further comprising a second array of deformable members.

18. The MEMS sensor of claim 17, wherein said secondary array of deformable members have spacing between said secondary array of deformable members different from the spacing of said at least one array of deformable members, and disposed opposite to said at least one array of deformable members, allowing for sequential contact between said at least one array and said second array.

19. The MEMS sensor of claim 1, wherein said deformation of at least one of said array of deformable members causes deformation of an adjacent one of said array of deformable members.

20. The MEMs sensor of claim 1, wherein said adjacent deformable members of said at least one array of deformable members directly contact one another by said displacement of said at least one driving member.

* * * * *